(12) United States Patent
Niki

(10) Patent No.: US 7,898,363 B2
(45) Date of Patent: Mar. 1, 2011

(54) ELECTRIC ELEMENT AND ELECTRIC CIRCUIT

(75) Inventor: Kazuya Niki, Hirakata (JP)

(73) Assignee: Sanyo Electric Co., Ltd., Moriguchi-shi, Osaka (JP)

( * ) Notice: Subject to any disclaimer, the term of this patent is extended or adjusted under 35 U.S.C. 154(b) by 0 days.

(21) Appl. No.: 12/748,952

(22) Filed: Mar. 29, 2010

(65) Prior Publication Data

US 2010/0232084 A1  Sep. 16, 2010

Related U.S. Application Data

(63) Continuation of application No. 11/513,027, filed on Aug. 31, 2006, now Pat. No. 7,724,108.

(30) Foreign Application Priority Data

| Sep. 2, 2005 | (JP) | ............... | 2005-254620 |
| Sep. 2, 2005 | (JP) | ............... | 2005-254690 |
| Sep. 2, 2005 | (JP) | ............... | 2005-254750 |
| Jul. 18, 2006 | (JP) | ............... | 2006-195565 |

(51) Int. Cl.
*H03H 7/00* (2006.01)
*H01G 4/228* (2006.01)

(52) U.S. Cl. ..................... 333/185; 333/246

(58) Field of Classification Search ............... 333/185, 333/246; 361/301.1, 301.4, 306.1, 306.3, 361/307, 303
See application file for complete search history.

(56) References Cited

U.S. PATENT DOCUMENTS

| 6,185,091 B1 | 2/2001 | Tanahashi et al. |
| 6,331,930 B1 | 12/2001 | Kuroda et al. |
| 6,331,932 B1 | 12/2001 | Kobayashi et al. |
| 6,699,809 B2 | 3/2004 | Fujikawa et al. |
| 6,768,630 B2 | 7/2004 | Togashi |
| 7,019,957 B2 | 3/2006 | Togashi et al. |
| 7,050,289 B2 | 5/2006 | Togashi |
| 2003/0089514 A1 | 5/2003 | Hayama et al. |

(Continued)

FOREIGN PATENT DOCUMENTS

CN      1469402 A      1/2004

(Continued)

OTHER PUBLICATIONS

Chinese Office Action issued Jan. 9, 2009 in related application 2006101717093.

(Continued)

*Primary Examiner*—Dean O Takaoka
(74) *Attorney, Agent, or Firm*—Westerman, Hattori, Daniels & Adrian, LLP

(57) ABSTRACT

Each of the plurality of conductive plates is formed on a principal surface of each of stacked dielectric layers. Side anode electrodes are connected to positive electrodes of conductive plates, while side cathode electrodes are connected to cathodes of conductive plates. Anode electrodes are connected to the side anode electrodes. Cathode electrodes are connected to the side cathode electrodes. By passing DC currents through the positive conductive plates and cathode conductive plates so as to flow in the opposite directions, effective inductance of the positive conductive plates becomes smaller than its self-inductance. Consequently, the inductance is reduced, thereby lowering impedance.

5 Claims, 35 Drawing Sheets

U.S. PATENT DOCUMENTS

| | | |
|---|---|---|
| 2004/0047540 A1 | 3/2004 | Moto et al. |
| 2007/0146099 A1 | 6/2007 | Ezaki et al. |
| 2007/0159272 A1 | 7/2007 | Niki |

FOREIGN PATENT DOCUMENTS

| | | | |
|---|---|---|---|
| CN | 1661741 | A | 8/2005 |
| EP | 0 936 642 | A2 | 8/1999 |
| EP | 1 372 167 | A1 | 12/2003 |
| JP | 54-180943 | U | 12/1979 |
| JP | 59-056831 | A | 4/1984 |
| JP | 59-127311 | A | 7/1984 |
| JP | 61-065609 | A | 5/1986 |
| JP | 63-045917 | A | 3/1988 |
| JP | 4-56207 | A | 2/1992 |
| JP | 4-103013 | A | 9/1992 |
| JP | 06-260364 | A | 9/1994 |
| JP | 09-153752 | A | 6/1997 |
| JP | 10-004027 | A | 1/1998 |
| JP | 11-102839 | A | 4/1999 |
| JP | 11-144996 | A | 5/1999 |
| JP | 11-163656 | A | 6/1999 |
| JP | 11-251178 | A | 9/1999 |
| JP | 11-288846 | A | 10/1999 |
| JP | 2004-014961 | A | 1/2004 |
| JP | 2004-080773 | A | 3/2004 |
| JP | 2004-228552 | A | 8/2004 |
| JP | 2004-336041 | A | 11/2004 |
| JP | 2005-032900 | A | 2/2005 |
| JP | 2005-191504 | A | 7/2005 |
| JP | 2007-096272 | A | 4/2007 |
| WO | 01/99237 | A1 | 12/2001 |
| WO | 2007/074598 | A1 | 7/2007 |

OTHER PUBLICATIONS

Chinese Office Action issued Feb. 6, 2009 in related application 2006101725193.

Co-pending Application U.S. Appl. No. 12/159,104, filed Jun. 25, 2008.

International Search Report of PCT/JP2006/323451; date of mailing Feb. 27, 2007 (issued in the corresponding PCT application for co-pending U.S. Appl. No. 12/159,104, filed with USPTO on Jun. 25, 2008.

Japanese Office Action dated Sep. 28, 2010, issued in corresponding Japanese Patent Application No. 2006-195565.

Japanese Office Action dated Nov. 30, 2010, issued in corresponding Japanese Patent Application No. 2006-220850.

ELECTRIC ELEMENT AND ELECTRIC CIRCUIT

CROSS-REFERENCE TO RELATED APPLICATION

This application is a continuation of U.S. application Ser. No. 11/513,027 filed on Aug. 31, 2006. The priority applications Numbers JP2005-254620, JP2005-254690, JP2005-254750, JP2006-195565, upon which U.S. application Ser. No. 11/513,027 is based, are hereby incorporated by reference.

BACKGROUND OF THE INVENTION

1. Field of the Invention

This invention relates to electric elements and electric circuits, and more particularly to an electric element and an electric circuit functioning as a noise filter with a wide frequency coverage and excellent high-frequency characteristics.

2. Description of Related Art

Recently, digital circuit technology such as LSI (Large Scale Integrated) circuit technology is adopted in not only computers and communication-related equipment but also consumer electronics and in-vehicle equipment.

The high-frequency current produced in the LSI circuit or the like does not stay in the vicinity of the LSI circuit but flows to the wide area of a component-mounted circuit board such as a printed-circuit board. The high-frequency current then inductively couples to signal wires and grounding wires and leaks as an electromagnetic wave from signal cables or the like.

In mixed-signal circuits in which analog circuitry and digital circuitry are combined, for example, a circuit in which a part of a conventional analog circuit is replaced with a digital circuit, and a digital circuit having analog input/output, one of the serious problems is electromagnetic interference from the digital circuit to the analog circuit.

The effective solution of this problem is to separate the LSI circuit, which is a source of the high-frequency current, from a power supplying system with respect to the high frequency, that is to say a "power decoupling" technique. Known as a noise filter employing the power decoupling technique is a transmission-line type noise filter (e.g. Japanese unexamined patent application No. 2004-80773).

This transmission-line type noise filter comprises a first electrical conductor, a second electrical conductor, a dielectric layer, a first anode and a second anode. Each first and second electrical conductor is in the form of a plate. The dielectric layer is disposed between the first and second electrical conductors.

The first anode is connected to one end of the first electrical conductor in a longitudinal direction, while the second anode is connected to the other end of the first electrical conductor in the longitudinal direction. The second electrical conductor functions as a cathode to connect to reference potential. The first electrical conductor, dielectric layer, and second electrical conductor constitute a capacitor. The thickness of the first electrical conductor is so set as to substantially prevent the temperature rise caused by a DC (direct current) component of the current flowing through the first electrical conductor.

The transmission-line type noise filter is connected between a DC power source and an LSI circuit so as to feed a DC current from the DC power source through a path made up of the first anode, the first electrical conductor and the second anode to the LSI circuit, while attenuating an AC (alternating current) current produced in the LSI circuit.

As discussed above, the transmission-line type noise filter has a structure of a capacitor, and uses the first and second electrical conductors, which are two electrodes of the capacitor, as transmission lines.

BRIEF SUMMARY OF THE INVENTION

However, the transmission-line type noise filter has an impedance expressed by (inductance/capacitance)$^{1/2}$, and is not provided with a means for reducing inductance. The impedance shifts from a region where the capacitance is dominant to a region where the inductance is dominant with an increase in frequency. Accordingly, the conventional transmission-line type noise filters cannot have lower impedance than impedance determined by inherent inductance of the transmission-line type noise filters.

When the conventional transmission-line type noise filter, which is connected between a power source and an electrical load circuit such as a CPU (Central Processing Unit) operating at a predetermined frequency, is used as a decoupling circuit, it is difficult to fully confine an unwanted high-frequency current produced by the electrical load circuit within the vicinity of the electrical load circuit. In other words, there is a problem of leakage of the unwanted high-frequency current toward the other circuits.

Another problem is the difficulty in rapidly supplying an electric current from the power source to the electrical load circuit in response to rapid start-up of the electrical load circuit.

The present invention is made to solve the problems and has an object to provide an electric element capable of reducing impedance by decreasing the inductance.

The present invention has another object to provide an electric circuit capable of preventing leakage of an unwanted high-frequency current toward the power source.

The present invention has yet another object to provide an electric circuit enabling rapid start-up of the electrical load circuit as preventing the leakage of the unwanted high-frequency current toward the power source.

According to the present invention, the electric element is disposed between a power source and an electrical load circuit operating with an electric current from the power source, and comprises first conductive layers and second conductive layers. The first conductive layers are a conductor through which a first current flows from the power source side to the electrical load circuit side. The second conductive layers are a conductor through which a second current, which is a return current of the first current, flows from the electrical load circuit side to the power source side. The first conductor has a smaller inductance than its self-inductance when the first and second currents flow through the first and second conductors, respectively.

Preferably, the first conductor comprises n-number (n is a positive integer) of the first conductive layers each in the form of a flat plate, while the second conductor comprises m-number (m is a positive integer) of the second conductive layers each in the form of a flat plate and opposed to the first conductive layers. The n-number of first conductive layers and m-number of second conductive layers are alternately stacked.

Preferably, the electric element further comprises dielectrics. Each dielectric layer is disposed between a first conductive layer and a second conductive layer. Each of the n-number of first conductive layers passes the first current, which is an electric current from the power source, and is sandwiched between two second conductive layers connected to ground potential.

Preferably, the first current flows in the opposite direction to the second current.

Preferably, where the length of the first and second conductive layer in the direction perpendicular to the direction in which the first and second currents flow is W, and the length of the first and second conductive layers along the direction in which the first and second currents flow is L, an overlap part between the first conductive layer and second conductive layer holds $W \geqq L$.

Preferably, the electric element further comprises first to fourth electrodes. The first electrode is electrically connected to one end of the n-number of first conductive layers in a first direction in which the first current flows in the first conductive layers. The second electrode is electrically connected to the other end of the n-number of first conductive layers in the first direction. The third electrode is electrically connected to one end of the m-number of second conductive layers in a second direction in which the second current flows in the second conductive layers. The fourth electrode is electrically connected to the other end of the m-number of second conductive layers in the second direction.

According to the present invention, the electric element is in the form of an approximately rectangular parallelepiped and comprises a plurality of first conductive layers, a plurality of second conductive layers, a plurality of dielectrics, and first to fourth electrodes. The plurality of first conductive layers are disposed approximately parallel to the bottom face of the rectangular parallelepiped. The plurality of second conductive layers are disposed approximately parallel to the bottom face of the rectangular parallelepiped. Each of the plurality of dielectrics is disposed between a first conductive layer and a second conductive layer. The first electrode is connected to one end of the plurality of first conductive layers. The second electrode is connected to the other end of the plurality of first conductive layers. The third electrode is connected to the plurality of second conductive layers in the proximity of one end of the second conductive layers. The fourth electrode is connected to the plurality of second conductive layers in the proximity of the other end of second conductive layers.

Preferably, the first conductive layers are longer than the second conductive layers in a first direction from a first side face disposed approximately vertically on the bottom face of the rectangular parallelepiped to a second side face opposed to the first side face, while the second conductive layers are longer than the first conductive layers in a second direction from a third side face disposed approximately vertically on the bottom face of the rectangular parallelepiped and approximately perpendicular to the first and second side faces to a fourth side face opposed to the third side face.

Preferably, the first conductive layers are longer than the second conductive layers in a first direction from a first side face disposed approximately vertically on the bottom face of the rectangular parallelepiped to a second side face opposed to the first side face, while having approximately the same dimension as the second conductive layers in a second direction from a third side face disposed approximately vertically on the bottom face of the rectangular parallelepiped and approximately perpendicular to the first and second side faces to a fourth side face opposed to the third side face. The second conductive layers have extending portions each connected to the third and fourth electrodes.

Preferably, the first electrode is connected to the plurality of first conductive layers on the first side face, while the second electrode is connected to the plurality of first conductive layers on the second side face. The third electrode is connected to the plurality of second conductive layers at positions closer to the first side face than the midpoint between the first side face and the second side face, on the third and fourth side faces, while the fourth electrode is connected to the plurality of second conductive layers at a position closer to the second side face than the midpoint, on the third and fourth side faces.

Preferably, the first conductive layers has approximately the same dimension as the second conductive layers in a first direction from a first side face disposed approximately vertically on the bottom face of the rectangular parallelepiped to the second side face opposed to the first side face, and in a second direction from a third side face disposed approximately vertically on the bottom face of the rectangular parallelepiped and approximately perpendicular to the first and second side faces to a fourth side face opposed to the third side face. The first conductive layers have first and second extending portions extending toward the first and the second side faces, respectively, while the second conductive layers have third and fourth extending portions extending toward the first and the second side faces, respectively.

Preferably, the first electrode is connected to the first extending portions of the plurality of first conductive layers on the first side face, while the second electrode is connected to the second extending portions of the plurality of first conductive layers on the second side face. The third electrode is connected to the third extending portions of the plurality of second conductive layers on the first side face, while the fourth electrode is connected to the fourth extending portions of the plurality of second conductive layers on the second side face.

Preferably, the first extending portions are formed closer to the third side face than the midpoint between the third side face and the fourth side face in the second direction, while the second extending portions are formed closer to the fourth side face than the midpoint in the second direction. The third extending portions are formed closer to the fourth side face than the midpoint in the second direction, while the fourth extending portions are formed closer to the third side face than the midpoint in the second direction.

Preferably, the first conductive layer has approximately the same dimension as the second conductive layer in a first direction from a first side face disposed approximately vertically on the bottom face of the rectangular parallelepiped to the second side face opposed to the first side face, and in a second direction from a third side face disposed approximately vertically on the bottom face of the rectangular parallelepiped and approximately perpendicular to the first side face and the second side face to a fourth side face opposed to the third side face. The first conductive layers have first and second extending portions extending toward the third side face, while the second conductive layers have third and fourth extending portions extending toward the fourth side face.

Preferably, the first electrode is connected to the first extending portions of the plurality of first conductive layers on the third side face, while the second electrode is connected to the second extending portions of the plurality of first conductive layers on the third side face. The third electrode is connected to the third extending portions of the plurality of second conductive layers on the fourth side face, while the fourth electrode is connected to the fourth extending portions of the plurality of second conductive layers on the fourth side face.

Preferably, where the length of the first and second conductive layers in the first direction is W and the length of first and second conductive layers in the second direction is L, an overlap part between the first conductive layer and second conductive layer holds W≧L.

Preferably, where the length of first and second conductive layers in the first direction is W and the length of first and second conductive layers in the second direction is L, an overlap part between the first conductive layer and second conductive layer holds L>W.

Preferably, the first and second conductive layers are composed of metallic materials containing nickel as a main material. The dielectrics are composed of ceramic materials containing $BaTiO_3$ as a main material.

An electric circuit according to the present invention includes any one of electric elements disclosed in the present invention disposed between a power source and an electrical load. The plurality of first conductive layers constitute a path through which the first current flows from the power source side to the load side, while the plurality of second conductive layers constitute a path through which the second current as a return current of the first current flows.

The electric circuit according to the present invention further includes an electric element connected to the power source and a capacitor connected between the electric element and the electrical load. The electric element is any one of electric elements disclosed in the present invention.

Preferably, the first electrode of the electric element is connected to a positive electrode of the power source. The second electrode of the electric element is connected to an anode of the capacitor. The third electrode of the electric element is connected to a cathode of the capacitor. The fourth electrode of the electric element is connected to a negative electrode of the power source. The anode of the capacitor is connected to a positive electrode of the electrical load. The cathode of the capacitor is connected to a negative electrode of the electric element.

The electric circuit according to the present invention includes a first electric element having an approximately rectangular plane and connected to the power source, and a second electric element having the approximately rectangular plane and connected to the electrical load. A first dimension of the first electric element in a lateral direction of the rectangle is longer than a second dimension of the first electric element in a vertical direction of the rectangle, while the third dimension of the second electric element in the lateral direction of the rectangle is shorter than a fourth dimension of the second electric element in the vertical direction of the rectangle.

In the present invention, when the first and second currents flow in the first and second conductors, respectively, the inductance of the first conductor becomes smaller than its self-inductance by mutual inductance between the first conductor and the second conductor. Thus, impedance of the electric element is reduced with the decrease in inductance of the first conductor.

The present invention can thus reduce impedance through the reduction of the inductance.

According to the present invention, the electric element comprises a plurality of first conductive layers, a plurality of second conductive layers, a plurality of dielectrics, first to fourth electrodes. Each of the plurality of dielectrics is disposed between a first conductive layer and a second conductive layer. The first and second electrodes are connected to the plurality of first conductive layers at opposite ends thereof, while the third and fourth electrodes are connected to the plurality of second conductive layers at the opposite ends thereof. This configuration allows an electric current to flow through the first electrode, plurality of first conductive layers and second electrode in this order and allows a return current of the electric current to flow through the fourth electrode, plurality of second conductive layers and third electrode in this order. Because the first conductive layers and second conductive layers have the electric current flowed in the opposite direction to each other, the inductance of the first conductive layer becomes smaller than its self-inductance by mutual inductance between the first and second conductive layers.

The present invention can thus reduce impedance through the reduction of inductance.

According to the present invention, the electric circuit comprises an electric element disposed between a power source and an electrical load. The electric element confines an unwanted high-frequency current produced by the electrical load within circuitry built up with the electrical load and electric element.

The present invention can thus prevent the unwanted high-frequency current from leaking toward the power source.

According to the present invention, an electric circuit comprises an electric element connected to a power source and a capacitor connected between the electric element and an electrical load. The electric circuit stores power source currents supplied from the power source to supply the stored power source current to the electrical load, while confining the unwanted high-frequency current produced by the electrical load within circuitry built up with the electrical load and electric element.

Thus, the present invention can prevent the unwanted high-frequency current from leaking toward the power source and enable to rapidly supply the power source current to the electrical load circuit.

Figure 1:
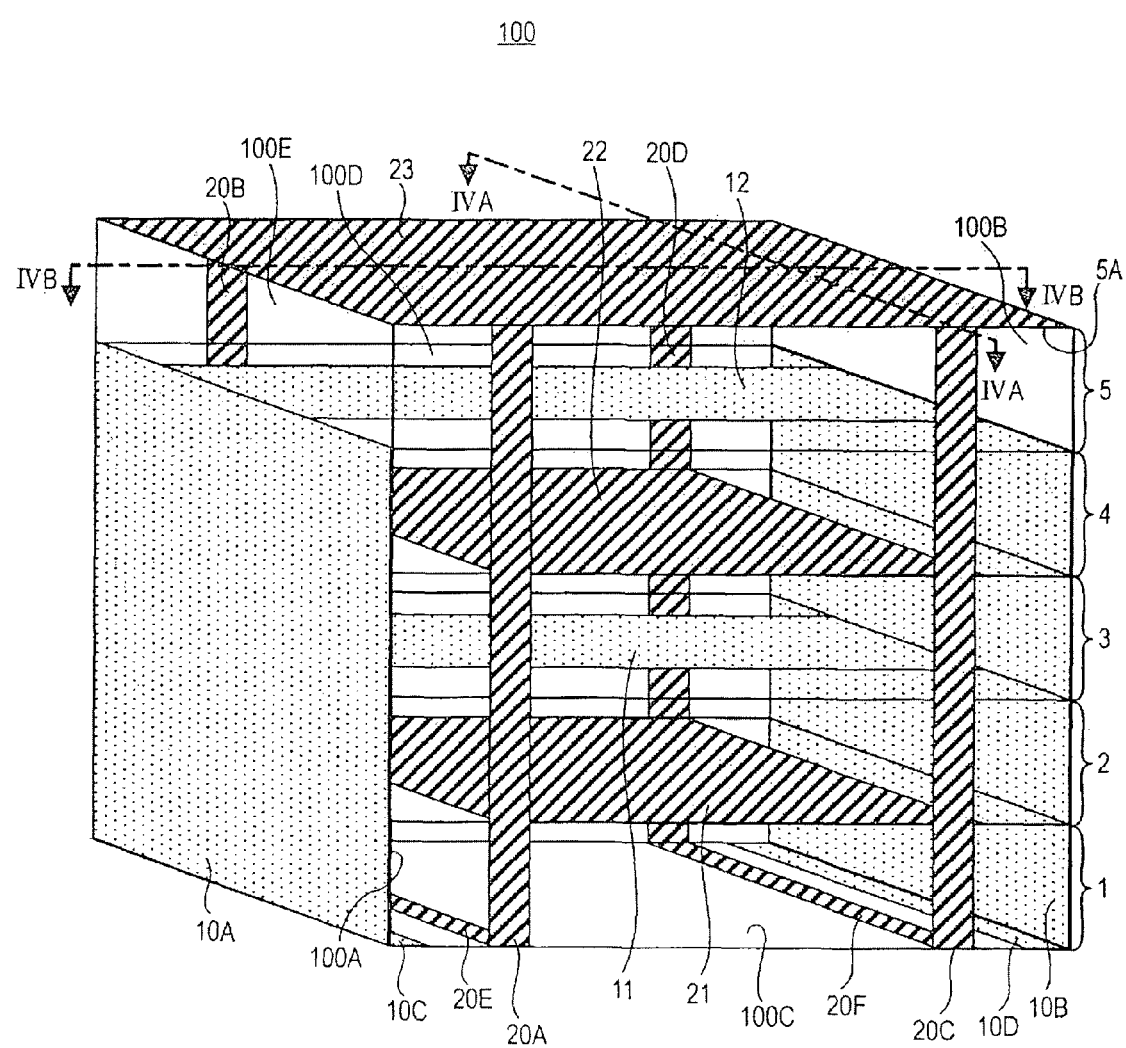
FIG. 1 is a schematic view illustrating the structure of an electric element according to the first embodiment of the present invention.

The foregoing and other objects, features, aspects and advantages of the present invention will become more apparent from the following detailed description of the present invention when reviewed in conjunction with the accompanying drawings.

DETAILED DESCRIPTION OF THE PREFERRED EMBODIMENTS

Referring to the drawings, a detailed description will be made on embodiments of the present invention. Components identical or equivalent to each other in the drawings are denoted by the same reference number, and will not be further explained to avoid repetition.

The First Embodiment

FIG. 1 is a schematic view illustrating the structure of an electric element according to the first embodiment of the present invention. Referring to FIG. 1, the electric element 100 of the first embodiment of the present invention is in the form of an approximately rectangular parallelepiped and comprises dielectric layers 1 to 5, conductive plates 11, 12, 21 to 23, side anode electrodes 10A, 10B, anode electrodes 10C, 10D, side cathode electrodes 20A, 20B, 20C, 20D, and cathode electrodes 20E, 20F.

The dielectric layers 1 to 5 are stacked in sequence. The conductive plates 11, 12, 21 to 23 are in the form of a flat plate each. The conductive plate 21 is placed between the dielectric layers 1 and 2, while the conductive plate 11 is placed between the dielectric layers 2 and 3. The conductive plate 22 is placed between the dielectric layers 3 and 4, while the conductive plate 12 is placed between the dielectric layers 4 and 5. The conductive plate 23 is placed on a principal surface 5A of the dielectric layer 5. The dielectric layers 1 to 5 support the conductive plates 21, 11, 22, 12, and 23, respectively. The conductive plates 11, 12, 21 to 23 are arranged approximately parallel to the bottom face (100C) of the rectangular parallelepiped.

The side anode electrode 10A is connected to one end of the conductive plates 11, 12, and formed on a side face 100A (which is made up of the side faces of the dielectric layers 1 to 4) of the electric element 100. The side anode electrode 10B is connected to the other end of the conductive plates 11, 12, and formed on a side face 100B (which is made up of the side faces of the dielectric layers 1 to 4) opposed to the side face 100A of the electric element 100. The side anode electrode 10B is opposed to the side anode electrode 10A.

The anode electrode 10C is disposed on the bottom face 100C of the electric element 100 and connected to the side anode electrode 10A. The anode electrode 10D is disposed on the bottom face 100C of the electric element 100 and connected to the side anode electrode 10B.

The side cathode electrode 20A is connected to the conductive plates 21 to 23 in the proximity of one end of the conductive plates 21 to 23 and disposed on the front face 100D of the electric element 100. The side cathode electrode 20B is connected to the conductive plates 21 to 23 in the proximity of one end of the conductive plates 21 to 23 and disposed on the rear face 100E opposite to the front face 100D of the electric element 100. The side cathode electrode 20B is opposed to the side cathode electrode 20A.

The side cathode electrode 20C is connected to the conductive plates 21 to 23 in the proximity of the other end of the conductive plates 21 to 23 and disposed on the front face 100D of the electric element 100. The side cathode electrode 20D is connected to the conductive plates 21 to 23 in the proximity of the other end of the conductive plates 21 to 23 and disposed on the rear face 100E opposite to the front face 100D of the electric element 100. The side cathode electrode 20D is opposed to the side cathode electrode 20C.

The cathode electrode 20E is connected to the side cathode electrodes 20A and 20B and arranged on the bottom face 100C of the electric element 100. The cathode electrode 20F is connected to the side cathode electrodes 20C and 20D and arranged on the bottom face 100C of the electric element 100.

As described above, the electric element 100 has the conductive plates 11, 12, 21 to 23 alternately disposed with the dielectric layers 1 to 5 interposed therebetween, and includes the two anode electrodes 10C, 10D and two cathode electrodes 20E, 20F.

The dielectric layers 1 to 5 are composed of, for example, barium titanate ($BaTiO_3$). The side anode electrodes 10A, 10B, anode electrodes 10C, 10D, conductive plates 11, 12, 21 to 23, side cathode electrodes 20A, 20B, 20C, 20D and cathode electrodes 20E, 20F are composed of, for example, nickel (Ni).

Figure 2:
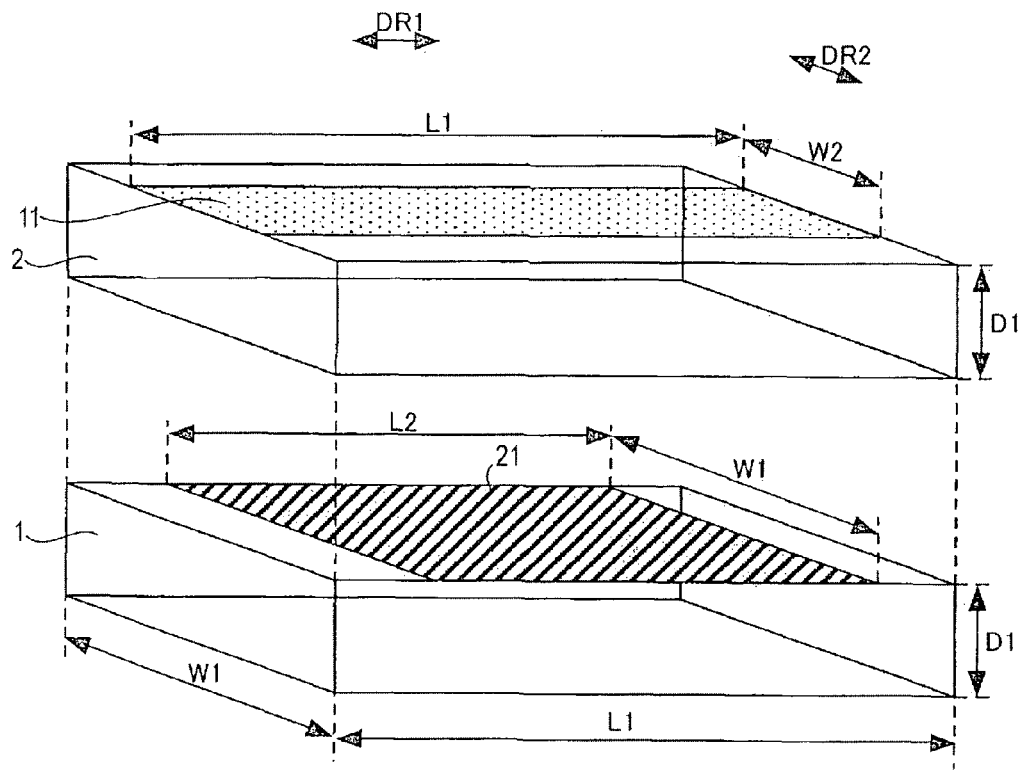
FIG. 2 a diagram for describing dimensions of dielectric layers and conductive plates shown in FIG. 1.

FIG. 2 is a diagram for describing the dimensions of the dielectric layers 1, 2 and conductive plates 11, 21 shown in FIG. 1. Referring to FIG. 2, each of the dielectric layers 1, 2 has a length of L1 along the direction DR1, which is the direction of a current flowing in the conductive plates 11, 21, a width of W1 along the direction DR2 perpendicular to the direction DR1, and a thickness of D1. The length L1, width W1, and thickness D1 are set, for example, at 15 mm, 13 mm, and 25 μm, respectively.

The conductive plate 11 has length L1 and width W2. Width W2 is set, for example, at 11 mm. The conductive plate 21 has length L2 and width W1. Length L2 is set, for example, at 13 mm. Each of the conductive plates 11, 21 has a thickness, for example, in a range between 10 μm to 20 μm.

Each of the dielectric layers 3 to 5 has the same length L1, width W1, and thickness D1 as those of the dielectric layers 1, 2 shown in FIG. 2. The conductive plate 12 has the same length L1, width W2 and thickness as those of the conductive plate 11 shown in FIG. 2. Each of the conductive plates 22, 23 has the same length L2, width W1, and thickness as those of the conductive plate 21 shown in FIG. 2.

As discussed above, the dielectric layers 1 to 5 and conductive plates 11, 12, 21 to 23 have approximately rectangular planes. The conductive plates 11, 12 are different in length and width from the conductive plates 21 to 23. These differences are made to prevent shorting between the side anode electrodes 10A, 10B connected to the conductive plates 11, 12 and the side cathode electrodes 20A, 20B, 20C, 20D connected to the conductive plates 21 to 23.

Figure 3:
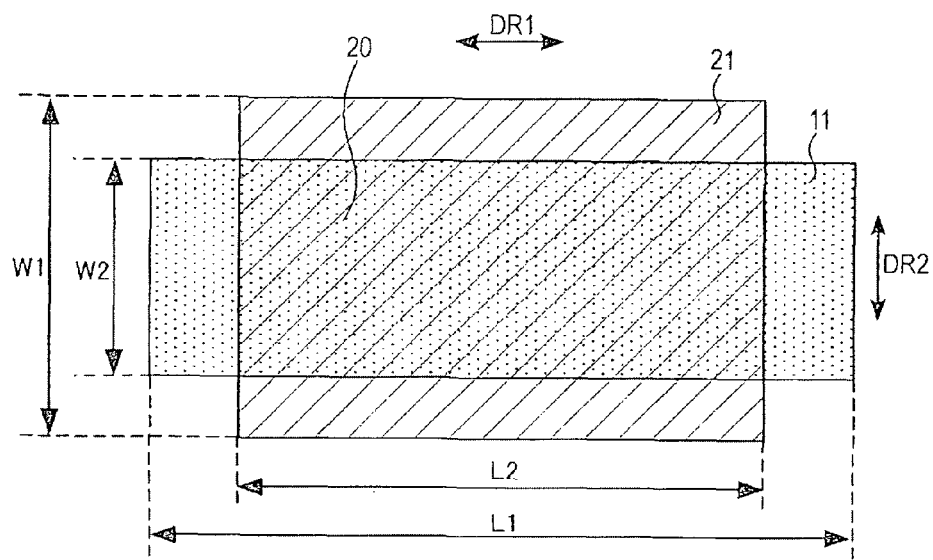
FIG. 3 is a plan view illustrating two adjacent conductive plates.

FIG. 3 is a plan view illustrating two adjacent conductive plates. Suppose the conductive plate 11 and conductive plate 21 are in one plane, with reference to FIG. 3, the conductive plates 11 and 21 have an overlap part 20. The overlap part 20 between the conductive plate 11 and conductive plate 21 has length L2 and width W2. Overlap parts between the conductive plate 11 and conductive plate 22, between the conductive plate 12 and conductive plate 22, and between the conductive plate 12 and conductive plate 23 have the same length L2 and width W2 as those of the overlap part 20. In the present invention, when the electric element 100 functions mainly as a noise filter, length L2 and width W2 are set so as to hold L2>W2. When the electric element 100 functions mainly as a capacitor, length L2 and width W2 are set so as to establish W2≧L2.

Figure 4A:
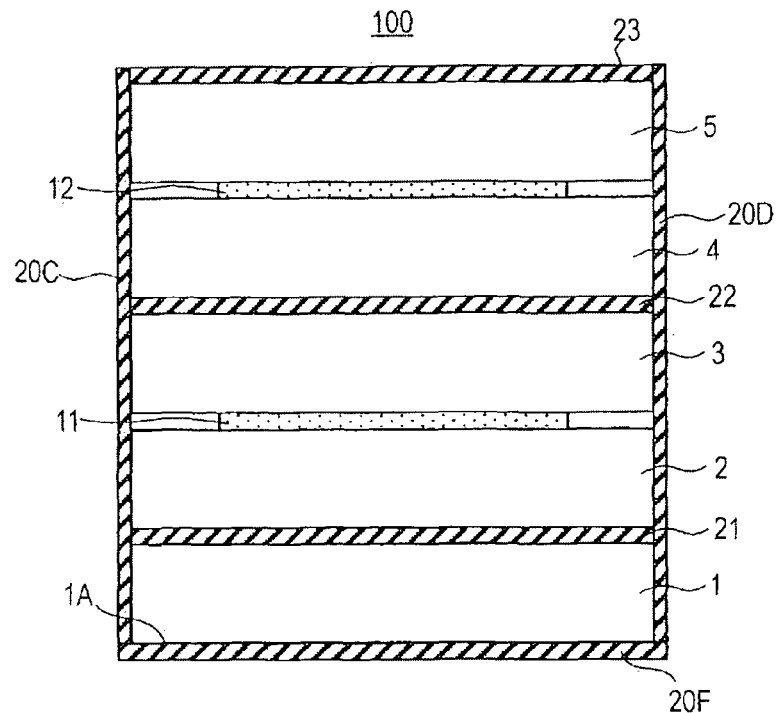
FIGS. 4A and 4B are cross-sectional views of the electric element shown in FIG. 1.
Figure 4B:
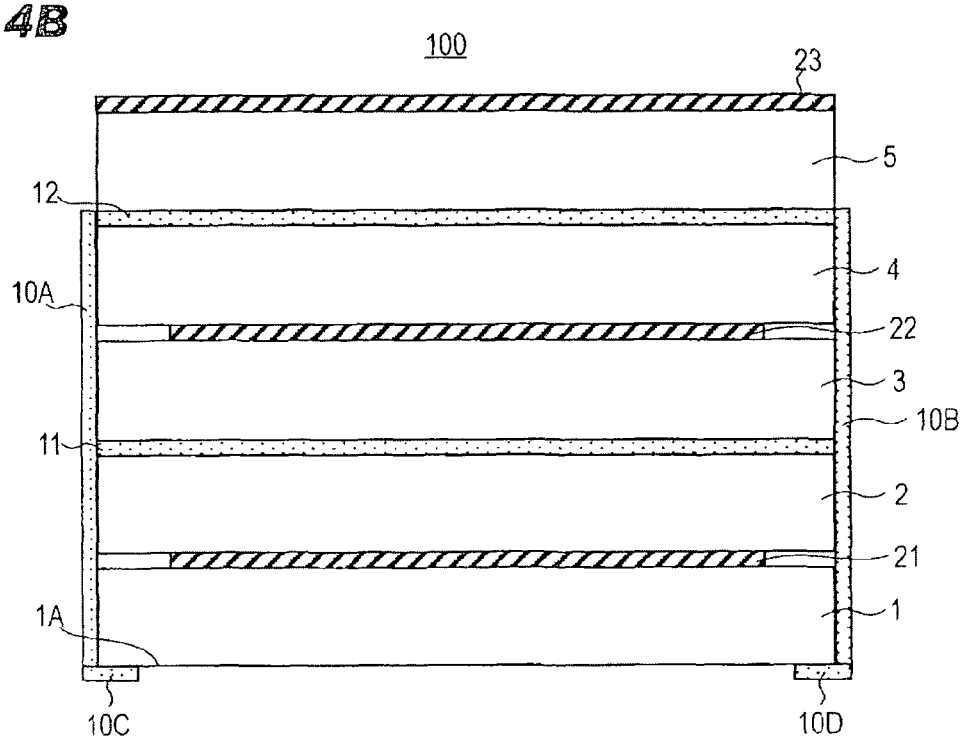

FIGS. 4A and 4B are cross-sectional views of the electric element 100 shown in FIG. 1. FIG. 4A is a cross-sectional view of the electric element 100 as taken along line IVA-IVA of FIG. 1, while FIG. 4B is a cross-sectional view of the electric element 100 as taken along line IVB-IVB of FIG. 1.

Referring to FIG. 4A, the conductive plate 21 is in contact with both dielectric layers 1 and 2, while the conductive plate 11 is in contact with both dielectric layers 2 and 3. The conductive plate 22 is in contact with both dielectric layers 3 and 4, while the conductive plate 12 is in contact with both dielectric layers 4 and 5. In addition, the conductive plate 23 is in contact with the dielectric layer 5.

The side cathode electrodes 20C, 20D are not connected to the conductive plates 11, 12, but to the conductive plates 21 to 23. The cathode electrode 20F is disposed under the underside 1A of the dielectric layer 1 and connected to the side cathode electrodes 20C, 20D.

Referring to FIG. 4B, the side anode electrodes 10A, 10B are not connected to the conductive plates 21 to 23, but to the conductive plates 11, 12. The anode electrodes 10C, 10D are disposed under the underside 1A of the dielectric layer 1 and connected to the side anode electrodes 10A, 10B, respectively.

As a result, a group of conductive plate 21, dielectric layer 2 and conductive plate 11, a group of the conductive plate 11, dielectric layer 3 and conductive plate 22, a group of the conductive plate 22, dielectric layer 4 and conductive plate 12, and a group of the conductive plate 12, dielectric layer 5 and conductive plate 23 constitute four capacitors connected in parallel between the anode electrodes 10C and 10D and between the cathode electrodes 20E and 20F.

Each capacitor has an electrode area equal to the overlap part 20 (see FIG. 3) of the two adjacent conductive plates.

As discussed above, the electric element 100 comprises the conductive plates 11, 12 disposed parallel to the bottom face 100C of the approximately rectangular parallelepiped, the conductive plates 21 to 23 disposed parallel to the bottom face 100C of the approximately rectangular parallelepiped, the dielectric layers 1 to 5 each disposed between either of the conductive plate 11 or 12 and any of the conductive plates 21 to 23, the side anode electrode 10A and anode electrode 10C connected to one end of the conductive plates 11, 12, the side anode electrode 10B and anode electrode 10D connected to the other end of the conductive plates 11, 12, the side cathode electrodes 20A, 20B and cathode electrode 20E connected to the conductive plates 21 to 23 in the proximity of one end of the conductive plates 21 to 23, and the side cathode electrodes 20C, 20D and cathode electrode 20F connected to the conductive plates 21 to 23 in the proximity of the other end of the conductive plates 21 to 23. The side anode electrode 10A is connected to the conductive plates 11, 12 on the side face 100A, while the side anode electrode 10B is connected to the conductive plates 11, 12 on the side face 100B opposed to the side face 100A. The side cathode electrode 20A is connected to the conductive plates 21 to 23 on the front face 100D arranged approximately perpendicular to the side faces 100A, 100B and approximately vertically to the bottom face 100C, while the side cathode electrode 20B is connected to the conductive plates 21 to 23 on the rear face 100E opposed to the front face 100D which is arranged approximately perpendicular to the side faces 100A, 100B and approximately vertically on the bottom face 100C. The side cathode electrode 20C is connected to the conductive plates 21 to 23 on the front face 100D approximately perpendicular to the side faces 100A, 100B and approximately vertically on the bottom face 100C, while the side cathode electrode 20D is connected to the conductive plates 21 to 23 on the rear face 100E opposed to the front face 100D which is arranged approximately perpendicular to the side faces 100A, 100B and approximately vertically on the bottom face 100C.

In the electric element 100, the side anode electrode 10A and anode electrode 10C constitute "a first electrode". The side anode electrode 10B and anode electrode 10D constitute "a second electrode". The side cathode electrodes 20A, 20B and cathode electrode 20E constitute "a third electrode". The side cathode electrodes 20C, 20D and cathode electrode 20F constitute "a fourth electrode".

Figure 5A:
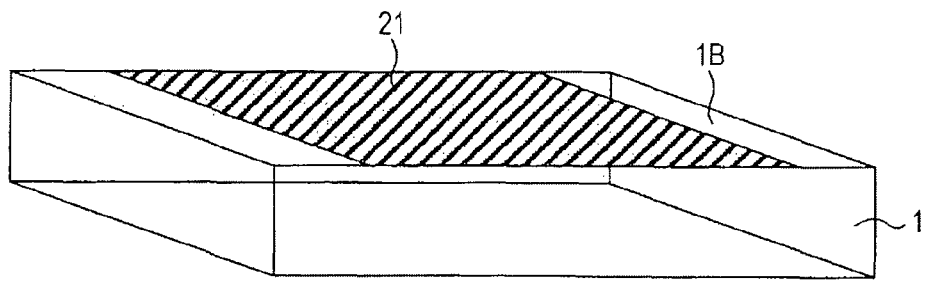
FIGS. 5A to 5C are the first process drawings for describing a fabricating method of the electric element shown in FIG. 1
Figure 5B:
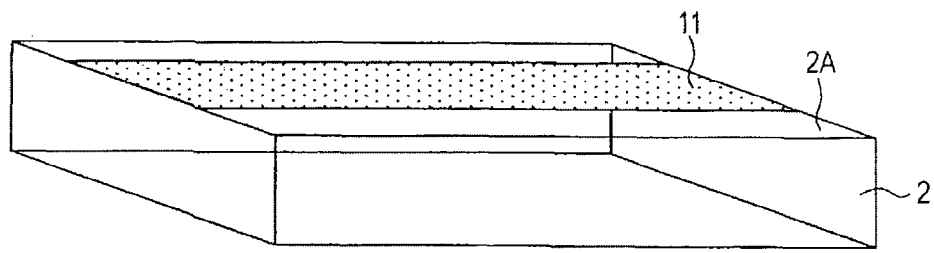
Figure 5C:
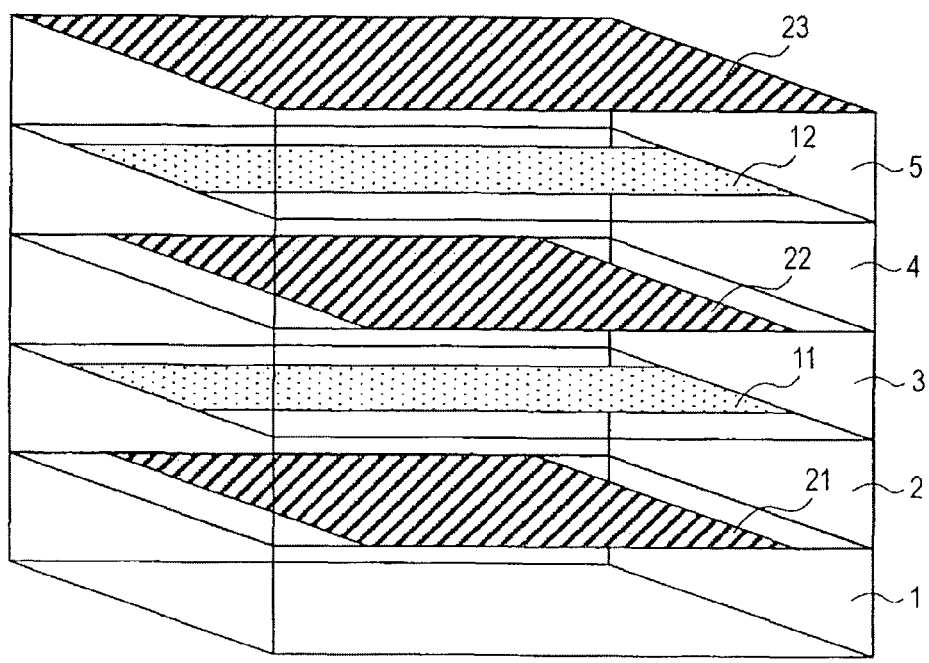

FIGS. 5A to 5C and FIGS. 6A and 6B are the first and second process drawings, respectively, for describing a fabricating method of the electric element 100 shown in FIG. 1. Referring to FIGS. 5A to 5C, a green sheet, which will be the dielectric layer 1 (BaTiO$_3$), having a length of L1, width of W1 and thickness of D1 is prepared. In an area having length L2 and width W1 on the front face 1B of the green sheet, Ni paste is applied by screen printing to form a Ni conductive plate 21.

Similarly, after the dielectric layers 3, 5 composed of BaTiO$_3$ are prepared, the conductive plates 22, 23 composed of Ni are formed on the prepared dielectric layers 3, 5, respectively (see FIG. 5A).

Subsequently, a green sheet, which will be the dielectric layer 2 (BaTiO$_3$), having length L1, width W1 and thickness D1 are prepared. In an area having length L1 and width W2 on the front face 2A of the green sheet, Ni paste is applied by screen printing to form a Ni conductive plate 11.

Similarly, after the dielectric layer 4 composed of BaTiO$_3$ is prepared, the conductive plate 12 composed of Ni is formed on the prepared dielectric layer 4 (see FIG. 5B).

The green sheets of the dielectric layers 1 to 5 on which conductive plates 21, 11, 22, 12, and 23 are formed respectively, are successively laminated (see FIG. 5C). This successive lamination results in alternate lamination of the conductive plates 11, 12 to be connected to the anode electrodes 10C, 10D and the conductive plates 21 to 23 to be connected to the cathode electrodes 20E, 20F.

Figure 6A:
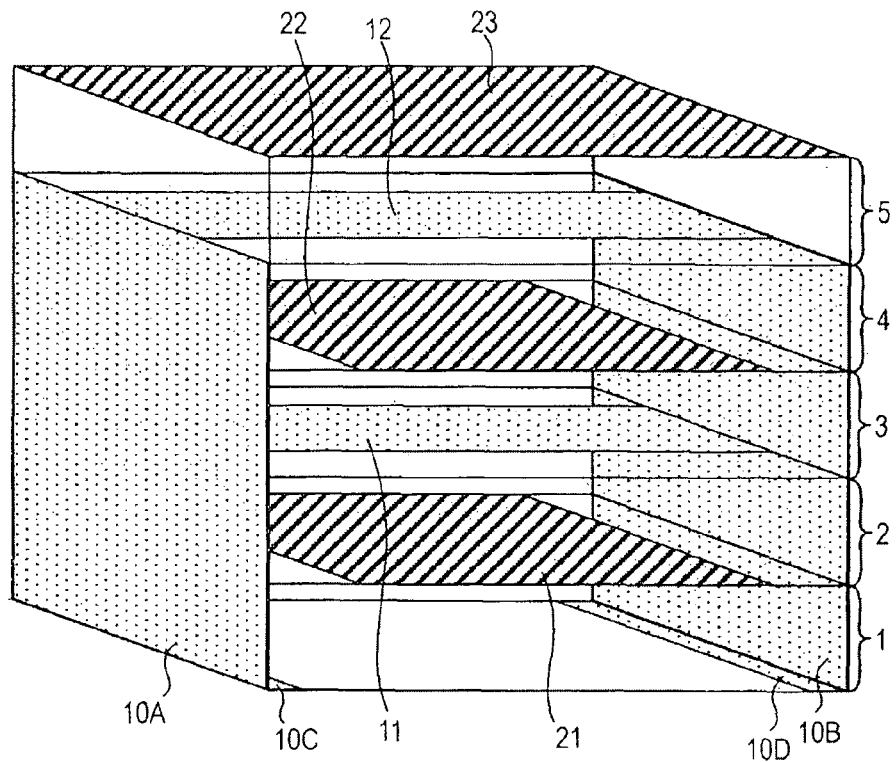
FIGS. 6A and 6B are the second process drawings for describing a fabricating method of the electric element shown in FIG. 1
Figure 6B:
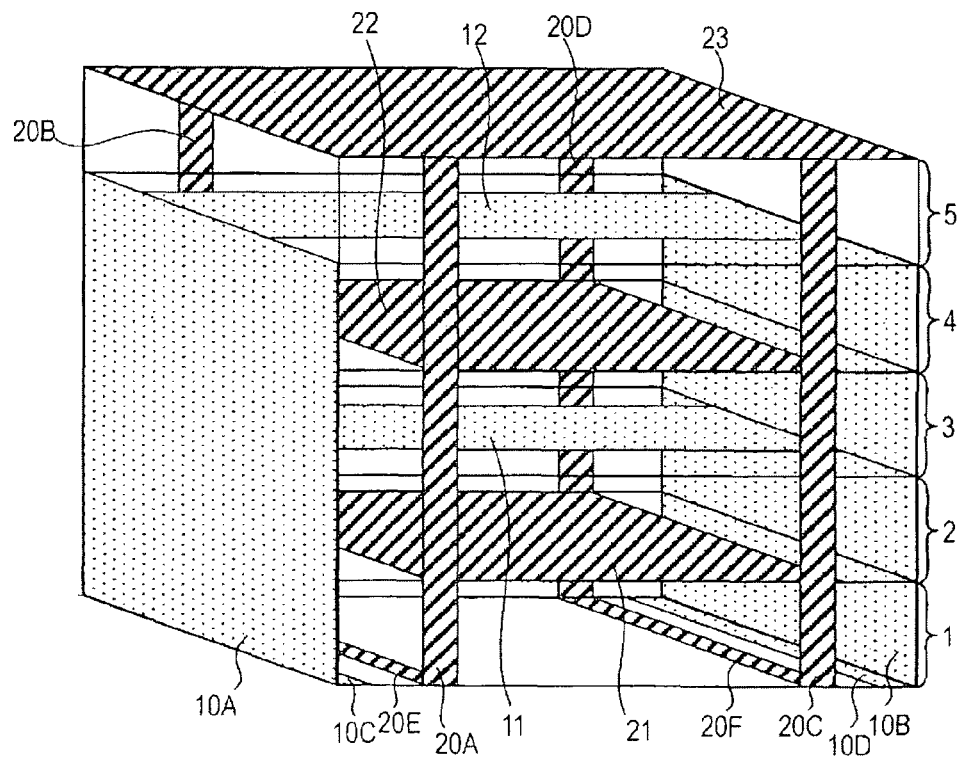

Then, the Ni paste is applied by the screen printing to form the side anode electrodes 10A, 10B, anode electrodes 10C, 10D, side cathode electrodes 20A, 20B, 20C, 20D and cathode electrodes 20E, 20F (see FIGS. 6A and 6B). The element fabricated as shown in FIG. 6B is fired at a temperature of 1350 degrees C. to complete the electric element 100. Alternatively, the side electrodes (external electrodes) can be made of materials having a lower melting point and higher conductivity than that of the internal electrodes (conductive plates 11, 12, 21 to 23) by use of post-fire. Further, the fired side electrodes (external electrodes) may require plating with Ni, Au, Su or other materials, if necessary, under consideration of solder wettability.

There is another method of fabricating the electric element 100 without the green sheets. In the method, a process of printing and drying dielectric paste and a process of printing a conductor on the dried dielectric paste are repeatedly performed to stack the dielectric layers and conductive plates.

Figure 7:
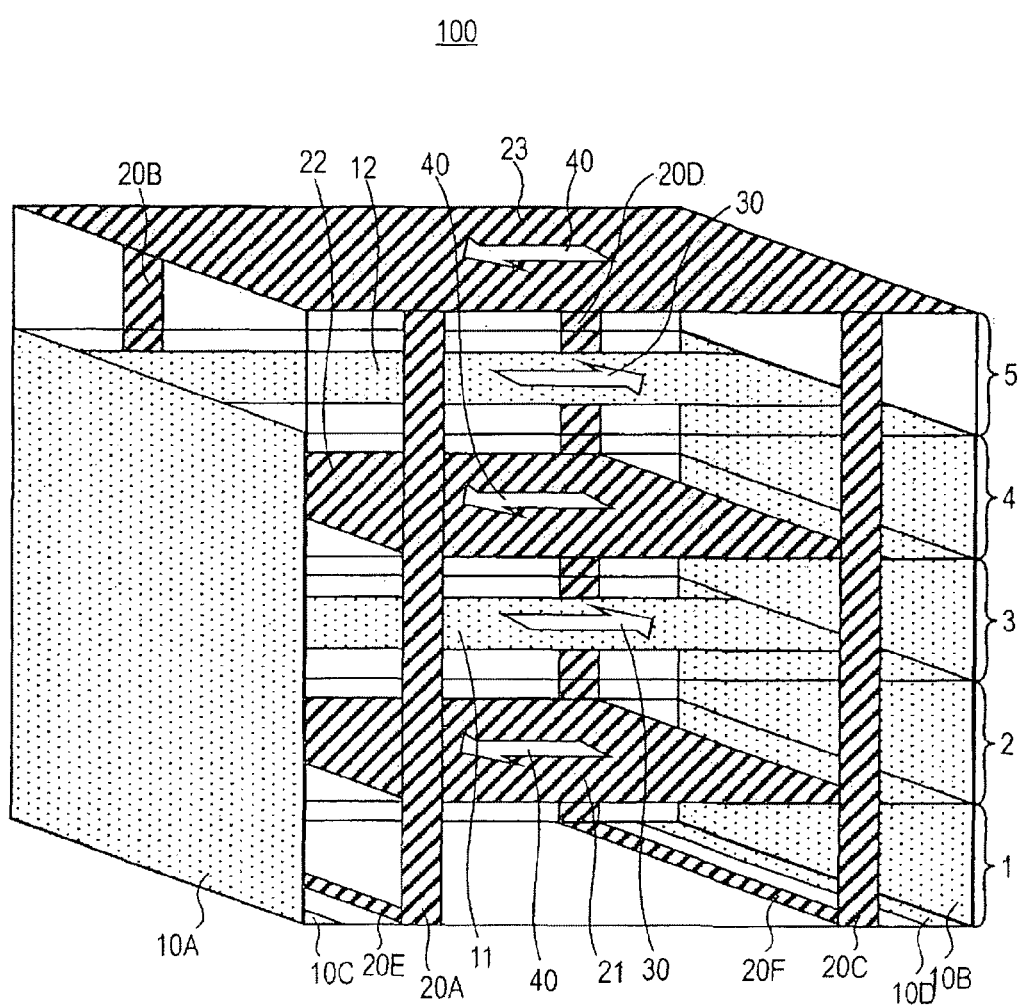
FIG. 7 is a perspective view for describing the functions of the electric element shown in FIG. 1.

FIG. 7 is a perspective view for describing the functions of the electric element 100 shown in FIG. 1. Referring to FIG. 7, with the cathode electrodes 20E, 20F connected to ground potential, the electric element 100 passes the DC current so that the DC current flows in the conductive plates 11, 12 in the opposite direction to the DC current flowing in the conductive plates 21 to 23.

If a DC current is fed to the electric element 100 so as to flow from the anode electrode 10C to the anode electrode 10D, for example, the DC current flows from the anode electrode 10C through the side anode electrode 10A to the conductive plates 11, 12, passes through the conductive plates 11, 12 in the direction of arrow 30, and further passes through the side anode electrode 10B to the anode electrode 10D.

A return current of the current having flowed in the conductive plates 11, 12 passes from the cathode electrode 20F through the side cathode electrodes 20C, 20D to the conductive plates 21 to 23. The return current then passes through the conductive plates 21 to 23 in the direction of arrow 40, which is opposite to the arrow 30, and further flows in the side cathode electrodes 20A, 20B to the cathode electrode 20E.

In this configuration, the DC current I1 flowing through the conductive plates 11, 12 and the DC current I2 flowing through the conductive plates 21 to 23 are equal in magnitude and opposite in direction.

Figure 8:
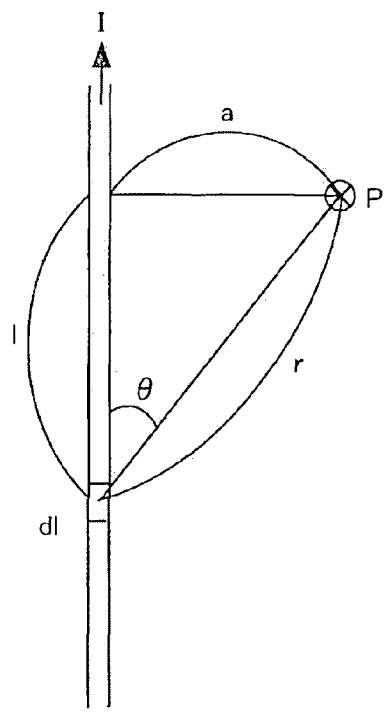
FIG. 8 is a view for describing magnetic flux density produced by an electric current passing through a conductive wire.
Figure 9:
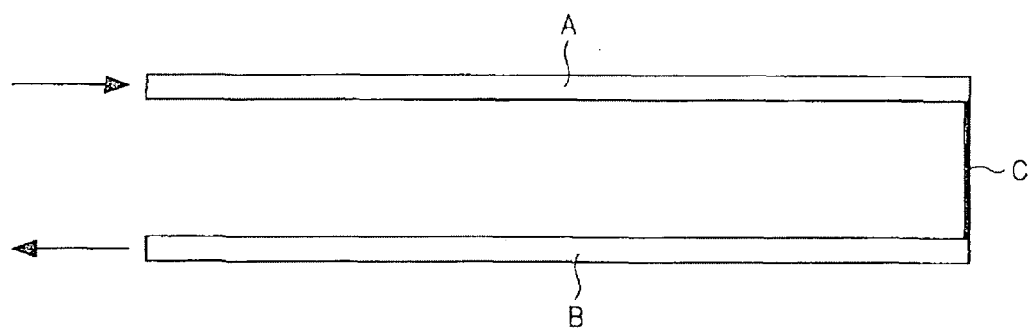
FIG. 9 is a view for describing effective inductance upon the occurrence of magnetic interference between two conductive wires.

FIG. 8 is a view for describing magnetic flux density produced by an electric current passing through a conductive wire. FIG. 9 is a view for describing effective inductance upon the occurrence of magnetic interference between two conductive wires.

Referring to FIG. 8, when an electric current I is flowing in an infinitely long straight wire, a magnetic flux density B at a point P at distance a from the wire is expressed by:

$$B = \frac{\mu_0 I}{2\pi r} \quad (1)$$

In this expression, $\mu_0$ indicates magnetic permeability in a vacuum.

Alternatively, when the conductive wire shown in FIG. 8 is replaced with two conductive wires that mutually cause magnetic interference, mutual inductance $L_{12}$ is expressed as below, where self-inductances of the two wires are $L_{11}$ and $L_{22}$, respectively, and coupling coefficient is k(0<k<1), and the mutual inductance of the two conductive wires is $L_{12}$.

$$L_{12} = k \sqrt{L_{11} L_{22}} \quad (2)$$

If $L_{11} = L_{22}$, the mutual inductance $L_{12}$ is expressed by:

$$L_{12} = k \cdot L_{11} \quad (3)$$

Referring to FIG. 9, given that a conductive wire A and conductive wire B are connected by a lead wire C and both have an electric current flowing therethrough that are equal in magnitude but opposite in direction, effective inductance $L_{11 effective}$ of the conductive wire A is expressed by:

$$L_{11 effective} = L_{11} - L_{12} \quad (4)$$

As discussed above, the magnetic interference occurred between the conductive wire A and conductive wire B creates the mutual inductance $L_{12}$, which causes the effective inductance $L_{11 effective}$ of the conductive wire A to be smaller than the self-inductance $L_{11}$ of the conductive wire A. This is because the direction of magnetic flux $\phi_A$ produced by the electric current I flowing in the conductive wire A is opposite to the direction of magnetic flux $\phi_B$ produced by the electric current −I flowing in the conductive wire B, therefore effective magnetic flux density produced by the electric current I in the conductive wire A is reduced.

In the above-discussed electric element 100, the conductive plate 11 is located 25 µm away from the conductive plates 21, 22 and the conductive plate 12 is located 25 µm away from the conductive plates 22, 23. Because of this, magnetic interference occurs between the conductive plate 11 and each conductive plate 21 and 22 and between the conductive plate 12 and each conductive plate 22 and 23. Since the DC current I1 flowing in the conductive plates 11, 12 and the DC current I2 flowing in the conductive plates 21 to 23 are equal in magnitude but opposite in direction, the effective inductance of the conductive plates 11, 12 becomes smaller than the self-inductance of the conductive plates 11, 12 due to the mutual inductance between the conductive plates 11, 12 and the conductive plates 21 to 23.

As a result, the effective inductance L of the entire electric element 100 is reduced.

The above-discussed electric element 100 with four capacitors connected in parallel results in having more effective capacitance C as compared with an electric element with one capacitor.

In conclusion, the electric element 100 can reduce its impedance with an increase in the effective capacitance C in a low-frequency range dominated by capacitance, while the electric element 100 can reduce its impedance with a decrease in the effective inductance L in a high-frequency range dominated by inductance.

As a result, the electric element 100 has relatively low impedance for broadband frequencies.

Figure 10:
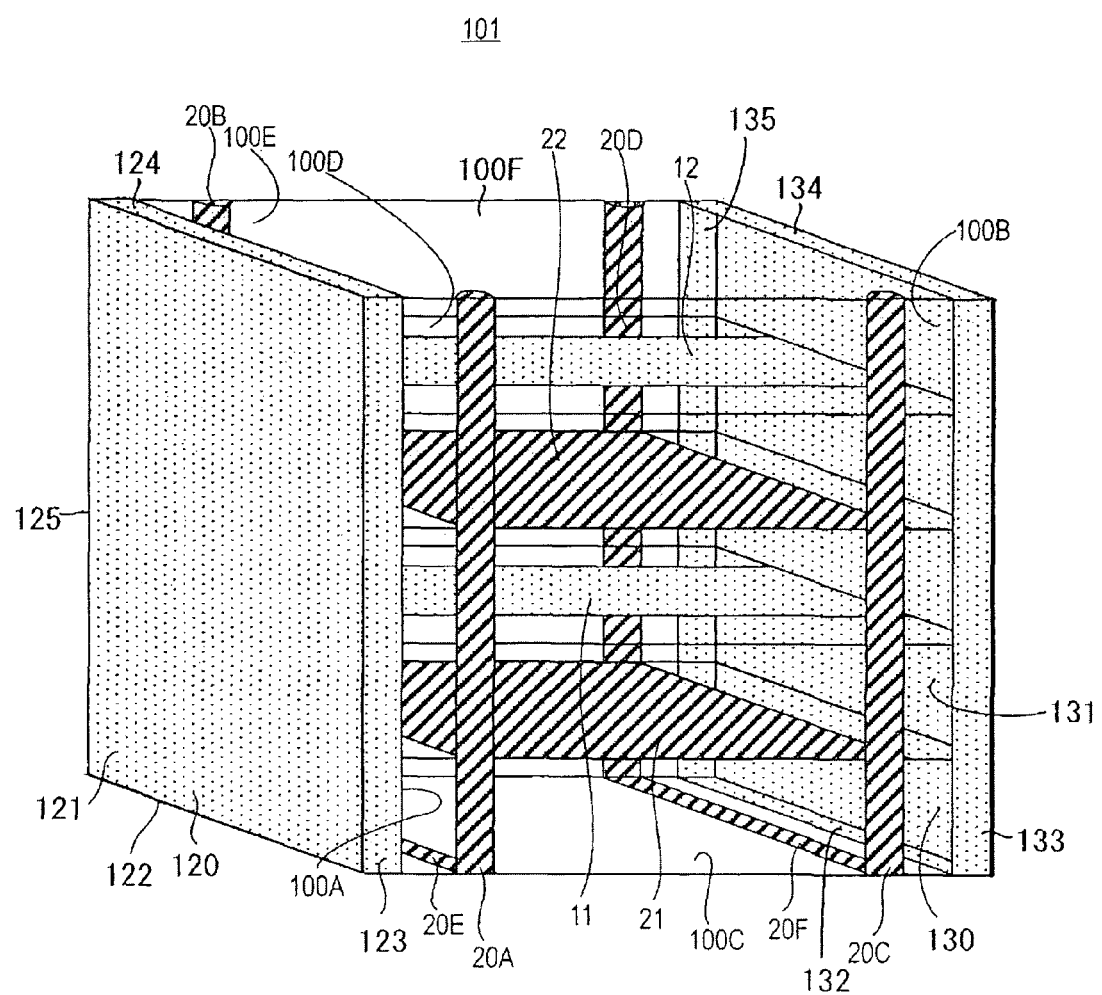
FIG. 10 is a schematic view illustrating the structure of another electric element according to the first embodiment of the present invention.

FIG. 10 is a schematic view illustrating the structure of another electric element according to the first embodiment. The electric element of the first embodiment may be replaced with an electric element 101 shown in FIG. 10. Referring to FIG. 10, the conductive plate 23 provided in the electric element 100 shown in FIG. 1 is removed from the electric element 101. The electric element 101 includes an anode electrode 120 instead of the side anode electrode 10A and anode electrode 10C, an anode electrode 130 instead of the side anode electrode 10B and anode electrode 10D and all other components included in the electric element 100.

The anode electrode 120 is composed of nickel (Ni) and arranged on the side face 100A, and a part of the bottom face 100C, front face 100D, rear face 100E and top face 100F of the electric element 101. More specifically, the anode electrode 120 includes a side anode electrode 121 and strip electrodes 122 to 125. The side anode electrode 121 is disposed all over the side face 100A of the electric element 101. The strip electrode 122 is disposed on the bottom face 100C of the electric element 101 and in the proximity of one end of the conductive plates 11, 12, 21, 22. The strip electrode 123 is disposed on the front face 100D of the electric element 101 and in the proximity of one end of the conductive plates 11, 12, 21, 22. The strip electrode 124 is disposed on the top face 100F of the electric element 101 and in the proximity of one end of the conductive plates 11, 12, 21, 22. The strip electrode 125 is disposed on the rear face 100E of the electric element 101 and in the proximity of one end of the conductive plates 11, 12, 21, 22. The side anode electrode 121 is connected to one end of the conductive plates 11, 12.

The anode electrode 130 is composed of nickel (Ni) and arranged on the side face 100B, and a part of the bottom face 100C, front face 100D, rear face 100E and top face 100F of the electric element 101. More specifically, the anode electrode 130 includes a side anode electrode 131 and strip electrodes 132 to 135. The side anode electrode 131 is disposed all over the side face 100B of the electric element 101. The strip electrode 132 is disposed on the bottom face 100C of the electric element 101 and in the proximity of the other end of the conductive plates 11, 12, 21, 22. The strip electrode 133 is disposed on the front face 100D of the electric element 101 and in the proximity of the other end of the conductive plates 11, 12, 21, 22. The strip electrode 134 is disposed on the top face 100F of the electric element 101 and in the proximity of the other end of the conductive plates 11, 12, 21, 22. The strip electrode 135 is disposed on the rear face 100E of the electric element 101 and in the proximity of the other end of the conductive plates 11, 12, 21, 22. The side anode electrode 131 is connected to the other end of the conductive plates 11, 12.

Figure 11:
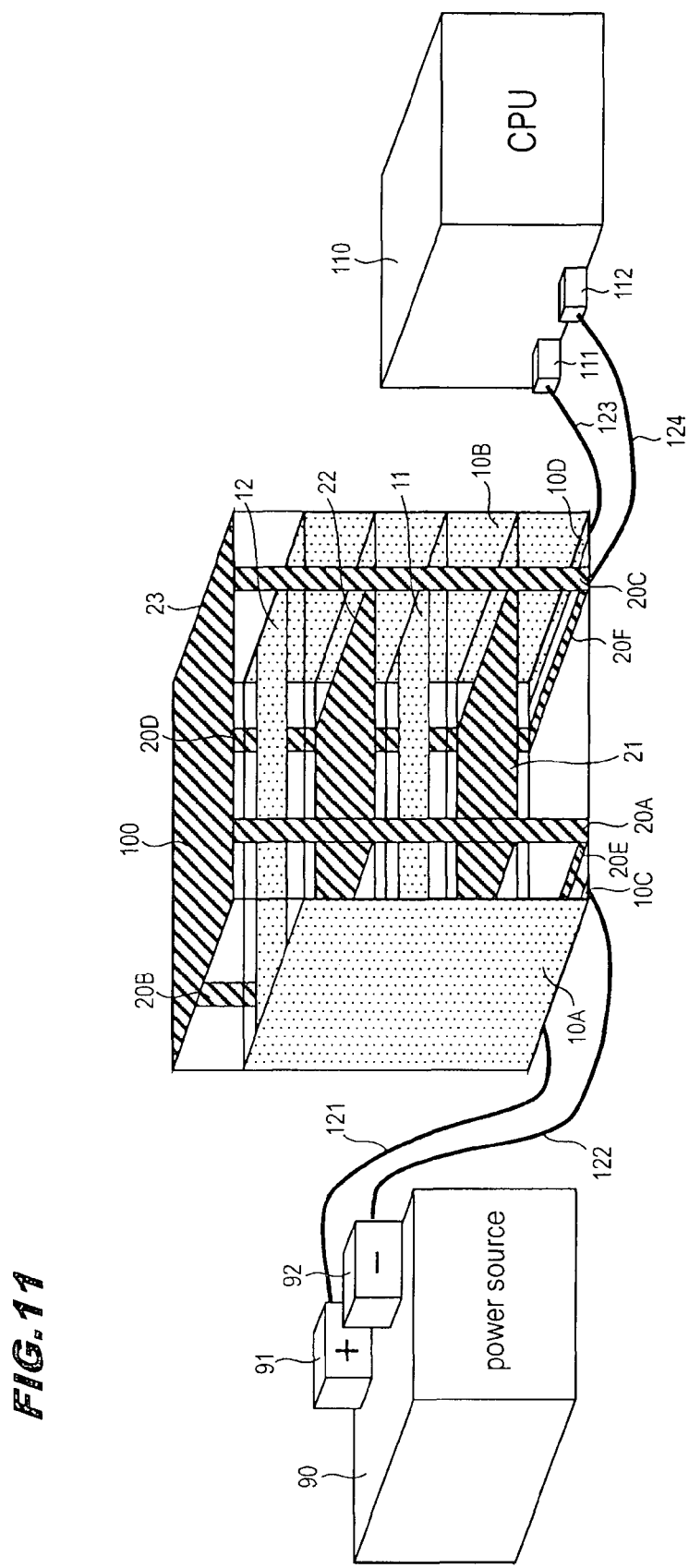
FIG. 11 is a conceptual illustration showing the electric element shown in FIG. 1 in an operating state.

FIG. 11 is a conceptual illustration showing the electric element 100 shown in FIG. 1 in an operating state. Referring to FIG. 11, the electric element 100 is connected between a power source 90 and a CPU (Central Processing Unit) 110. The electric element 100 has cathode electrodes 20E, 20F connected to ground potential. The power source 90 has a positive terminal 91 and negative terminal 92. The CPU 110 has a positive terminal 111 and negative terminal 112.

A lead wire 121 has one end connected with the positive terminal 91 of the power source 90 and the other end connected with the anode electrode 10C of the electric element 100. A lead wire 122 has one end connected with the negative terminal 92 of the power source 90 and the other end connected with the cathode electrode 20E of the electric element 100.

A lead wire 123 has one end connected with the anode electrode 10D of the electric element 100 and the other end connected with the positive terminal 111 of the CPU 110. A lead wire 124 has one end connected with the cathode electrode 20F of the electric element 100 and the other end connected with the negative terminal 112 of the CPU 110.

With this configuration, the DC current I output from the positive terminal 91 of a power source 90 passes through the lead wire 121 to the anode electrode 10C of the electric element 100, and then passes the side anode electrode 10A, conductive plates 11, 12, side anode electrode 10B and anode electrode 10D in this order inside the electric element 100. The DC current I flows from the anode electrode 10D to the CPU 110 through the lead wire 123 and positive terminal 111.

This passage allows the DC current I to be supplied as a power source current to the CPU 110. The CPU 110 is driven with the DC current I and outputs a return current Ir, which has the same magnitude as the DC current I, from the negative terminal 112.

The return current Ir flows through the lead wire 124 to the cathode electrode 20F of the electric element 100, and passes the side cathode electrodes 20C, 20D, conductive plates 21 to 23, side cathode electrodes 20A, 20B, and cathode electrode 20E in this order inside the electric element 100. The return current Ir then flows from the cathode electrode 20E, through the lead wire 122 and negative terminal 92, to the power source 90.

Since the DC current I thus flows through the conductive plates 11, 12 from the power source 90 side to the CPU 110 side, while the return current Ir flows through the conductive plates 21 to 23 from the CPU 110 side to the power source 90 side, the effective inductance L of the electric element 100 decreases as discussed above. On the other hand, the effective capacitance C of the electric element 100 increases due to the four parallel-connected capacitors of the electric element 100.

As a result, the impedance of the electric element 100 is reduced.

The CPU 110 is driven with the DC current I supplied from the power source 90 through the electric element 100, and produces an unwanted high-frequency current. This unwanted high-frequency current leaks through the lead wire 123, 124 out to the electric element 100. However, the low impedance of the electric element 100 as discussed above causes the unwanted high-frequency current to flow within circuitry made up of the electric element 100 and CPU 110, thereby preventing the leakage from the electric element 100 toward the power source 90.

Under circumstances where the operating frequency of the CPU 110 tends to shift toward high frequencies, it could be assumed that the CPU 110 is operated at approximately 1 GHz. In such a high operating frequency range, the electric element 100 functions as a noise filter for confining the unwanted high-frequency current, which is produced by the CPU 110 operating at the high operating frequency, within the vicinity of the CPU 110 under the condition that impedance of the electric element 100 is determined mainly by the effective inductance L that is reduced as discussed above.

Figure 12:
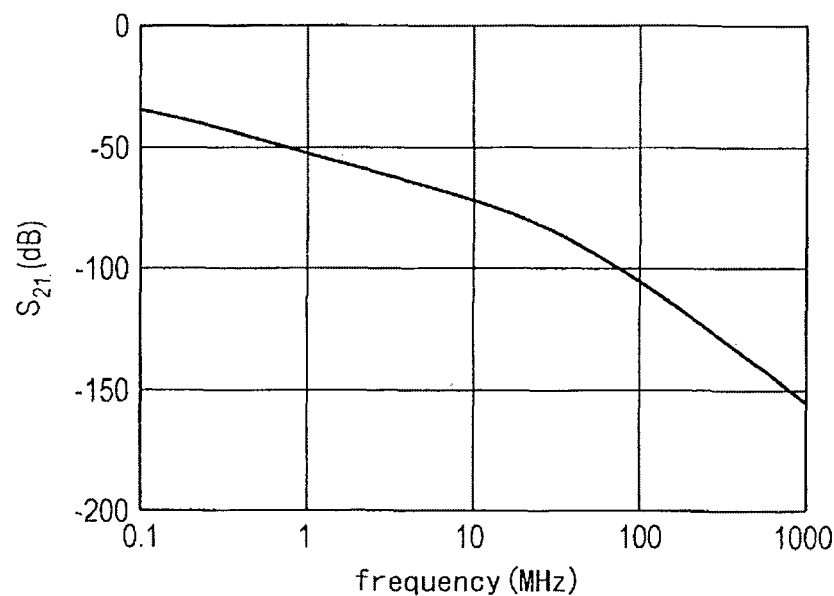
FIG. 12 illustrates the frequency-dependent attenuation characteristics in the electric element shown in FIG. 1.

FIG. 12 illustrates frequency-dependent attenuation characteristics $S_{21}$ in the electric element 100 shown in FIG. 1. In FIG. 12, the horizontal axis indicates frequencies, while the vertical axis indicates the attenuation characteristics $S_{21}$. The attenuation characteristics $S_{21}$ shown in FIG. 12 were obtained from a simulation with an electric element having five conductive plates connected to the side anode electrodes 10A, 10B and six conductive plates connected to the side cathode electrodes 20A, 20B, 20C, 20D. For information, the attenuation characteristics $S_{21}$ indicate how much the high-frequency currents, which were input from the CPU 110 to the electric element 100, attenuate in the electric element 100, on condition that the CPU 110 is set as an input side and the power source 90 is set as an output side.

Referring to FIG. 12, the attenuation characteristics $S_{21}$ decline with the frequency rise. At the frequency of 1000 MHz (1 GHz), the high-frequency current is attenuated to −150 dB or less. In short, the attenuation increases with an increase in frequency in the electric element 100. Even if the frequency reaches 100 MHz or higher, the attenuation does not shrink, but becomes further greater as the frequency rises.

Thus, as the operating frequency of the CPU 110 shown in FIG. 11 becomes higher, the impedance of the electric element 100 is reduced in conjunction with the decrease of the effective inductance L, and therefore the electric element 100 can improve its function as a noise filter for confining the unwanted high-frequency current produced by the CPU 110 within the vicinity of the CPU 110.

Figure 13:
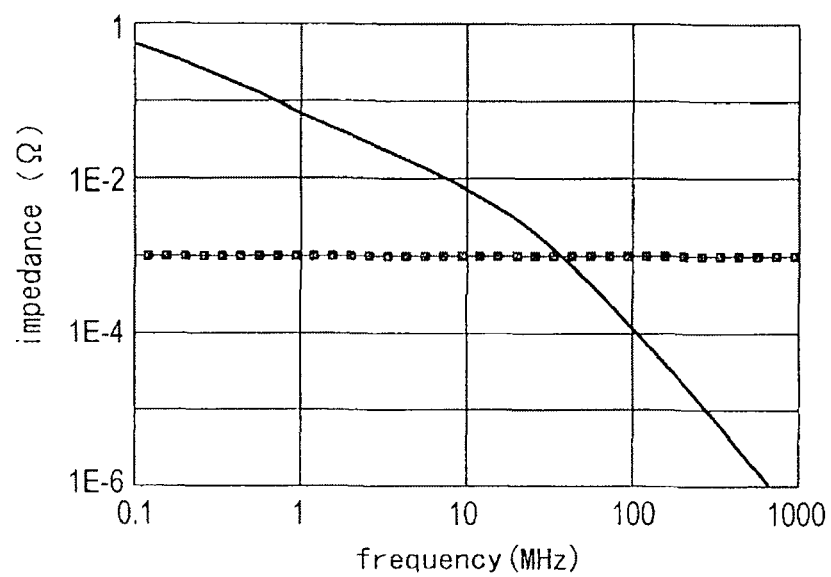
FIG. 13 is a view illustrating the frequency dependence of impedance in the electric element shown in FIG. 1.

FIG. 13 is a view illustrating the frequency dependence of impedance in the electric element 100 shown in FIG. 1. In FIG. 13, the horizontal axis indicates frequency, while the vertical axis indicates impedance. For information, the impedance in FIG. 13 was obtained, using an electric element 100 with four terminals (two anodes and two cathodes), by converting from the attenuation characteristics $S_{21}$ with the following expression:

$$[S] = \frac{1}{2\hat{Z}+1}\begin{bmatrix} -1 & 2\hat{Z} \\ 2\hat{Z} & -1 \end{bmatrix}$$
$$\hat{Z} = \frac{Z_s}{Z_o}$$
(5)

In this expression, $Z_o$ represents characteristic impedance.

Referring to FIG. 13, the impedance declines with an increase in frequency. At the frequency of several hundreds of megahertz or higher, the impedance is reduced to $10^{-3}(\Omega)$ or lower. The impedance reaches $10^{-6}$ (Ω) or lower at the frequency of 1000 MHz (1 GHz).

Conventional noise filters do not permit the impedance to reach $10^{-3}(\Omega)$ or lower at the frequency of hundreds of megahertz or higher, however, the electric element 100 of this invention enables the impedance to be significantly lower than $10^{-3}$ (Ω) in a frequency range of several hundreds megahertz or higher.

Figure 14:
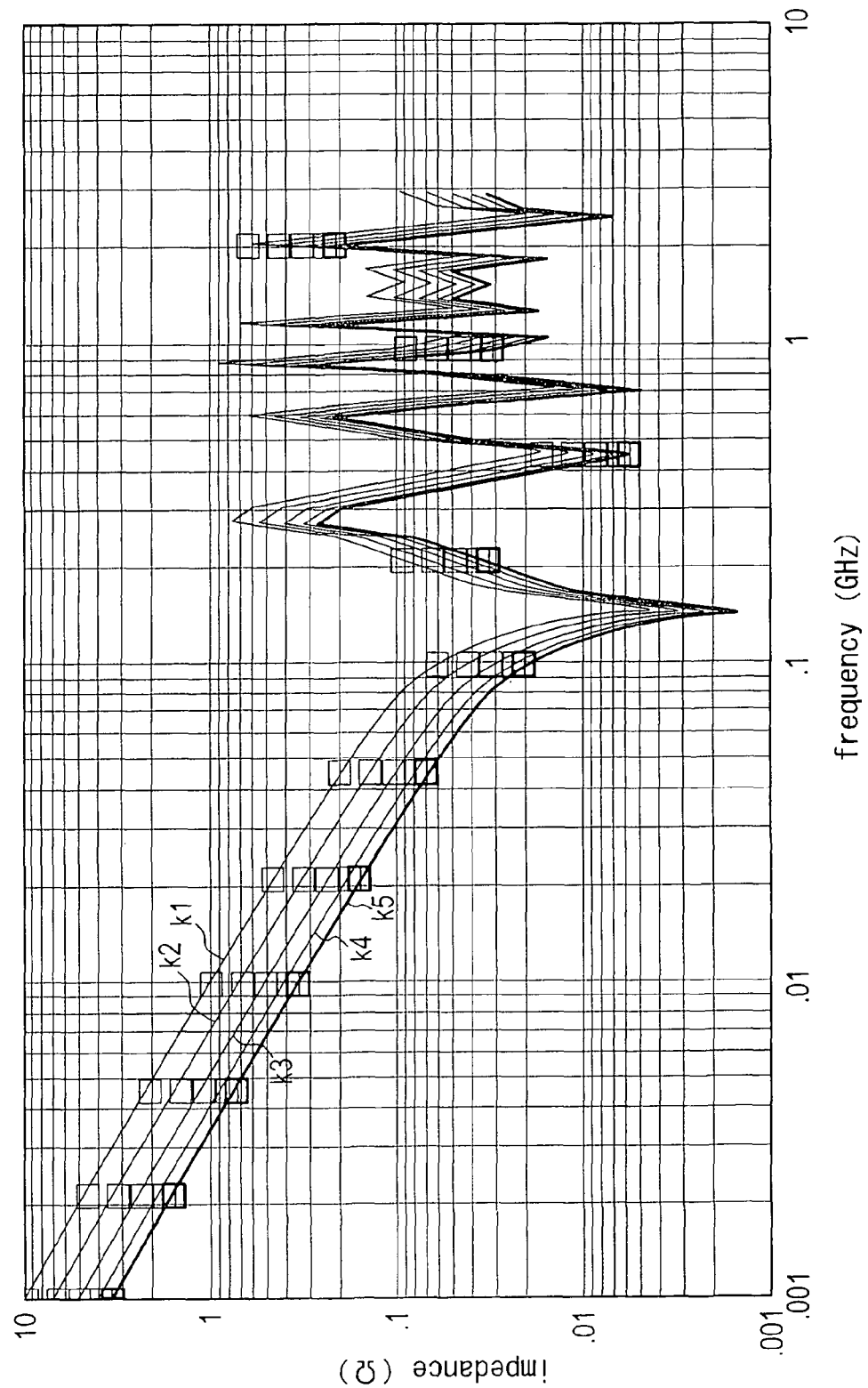
FIG. 14 is another view illustrating the frequency dependence of impedance in the electric element shown in FIG. 1.

FIG. 14 is another view illustrating the frequency dependence of impedance in the electric element 100 shown in FIG. 1. In FIG. 14, the horizontal axis indicates frequency, while the vertical axis indicates impedance. The impedance shown in FIG. 14 was obtained from simulations with electric elements with one conductive plate for an anode and one conductive plate for a cathode and indicates how the variation of the ratio between a length and width of the anode conductive plate influences the characteristics of the element. The inductance component is great, and a self-resonant frequency appears on the order of 100 MHz.

The impedance shown in FIG. 13 was obtained from the simulation with the electric element having five conductive plates for an anode and six conductive plates for a cathode, and length L1 and width W1 of conductive plates measure 15 mm by 13 mm. Because of this configuration, the effective inductance of the electric element is reduced with an increase of the mutual inductance, and therefore the impedance shown in FIG. 13 declines.

In FIG. 14, the simulations for the impedances were performed using electric elements each having various sized anode conductive plates. The conductive plates are formed so as to have length L2, shown in FIG. 3, fixed to 10 mm and width W2 changed variously. The curves k1 to k5 indicate the impedances of the electric elements with width W2 of 4 mm, 6 mm, 8 mm, 10 mm and 12 mm, respectively.

As apparent from the results shown in FIG. 14, the impedances decline in all frequency ranges for the electric elements with the fixed length L2 and differently widened widths W2. The impedances indicated by the curves k4 and k5 both having W2≧L2 are reduced to 0.3Ω or lower in a high-frequency range of 0.2 GHz or higher.

In the present invention, length L2 and width W2 of the overlap part 20 are set so as to be W2≧L2. The value of W2/L2 is set relatively large as the operating frequency of the CPU 110 relatively rises. This reduces the impedance of the electric element 100 in the high-frequency range.

Figure 15:
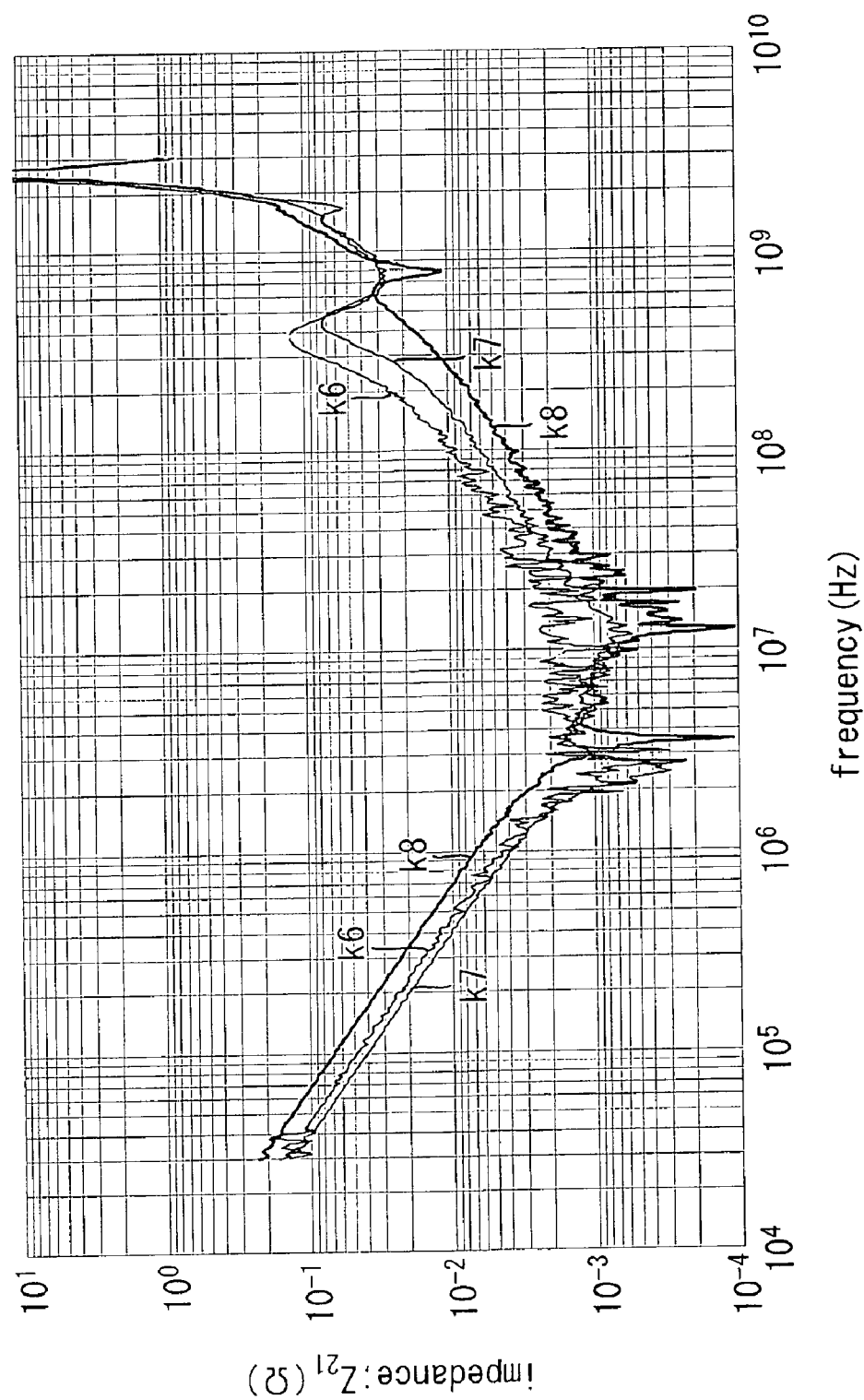
FIG. 15 is yet another view illustrating the frequency dependence of impedance in the electric element shown in FIG. 1.

FIG. 15 is yet another view illustrating the frequency dependence of the impedance in the electric element 100 shown in FIG. 1. In FIG. 15, the horizontal axis indicates frequency, while the vertical axis indicates impedance. For information, the impedances in FIG. 15 were obtained, using an electric element 100 with four terminals (two anodes and two cathodes), by converting from the attenuation characteristics $S_{21}$ with expression (5). The curves k6 to k8 are experimental results indicating the frequency dependence of impedance ($Z_{21}$) in the electric element 100 when L2>W2. Specifically, curves k6, k7 and k8 show the frequency dependence of impedance ($Z_{21}$) in electric elements 100 with L2=12 mm and W2=10 mm, L2=12 mm and W2=8 mm, and L2=12 mm and W2=5 mm, respectively.

As apparent from the results shown in FIG. 15, the impedance ($Z_{21}$) of the electric element 100 declines in a frequency range of $10^7$ (Hz) or higher as length L2 becomes longer than width W2. In other words, the longer length L2 is than width W2, the more the electric element 100, used in the operating state shown in FIG. 11, improves its noise filter function.

When the electric element 100 is used as a noise filter, the relation of length L2 and width W2 are thus set so as to hold L2>W2.

Figure 16:
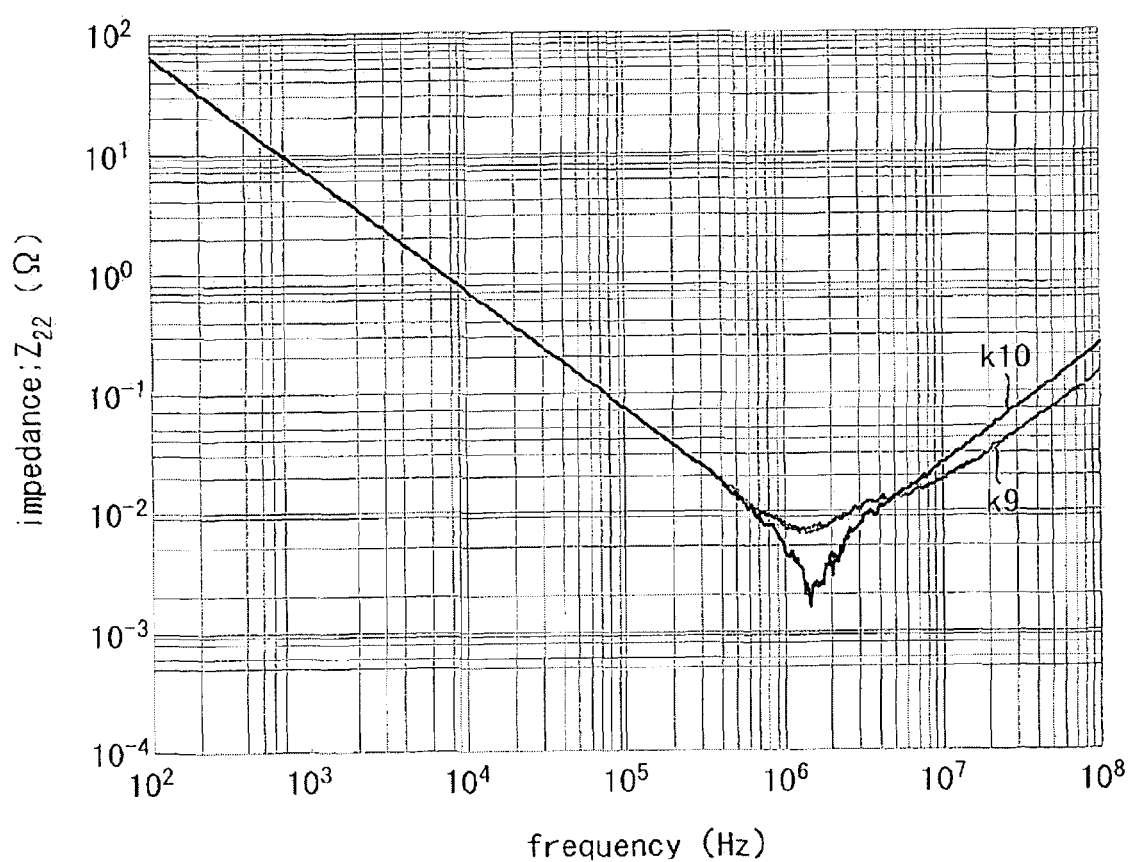
FIG. 16 is yet another view illustrating the frequency dependence of impedance in the electric element shown in FIG. 1.

FIG. 16 is yet another view illustrating the frequency dependence of impedance in the electric element 100 shown in FIG. 1. In FIG. 16, the horizontal axis indicates frequency, while the vertical axis indicates impedance. For information, the impedances in FIG. 16 were obtained, using electric elements 100 with four terminals (two anodes and two cathodes), by converting from reflection characteristics $S_{22}$ with expression (5).

Curve k9 shows the frequency dependence of impedance ($Z_{22}$) of an electric element 100 with W2≧L2. Curve k10 shows the frequency dependence of impedance ($Z_{22}$) of an electric element 100 with L2>W2.

Referring to FIG. 16, the impedances ($Z_{22}$) of the electric elements 100 show almost the same result in the frequency range of $4 \times 10^6$ (Hz) or lower even if the relation between length L2 and width W2 is set either W2≧L2 or L2≧W2. On the other hand, the impedances ($Z_{22}$) of the electric elements 100 are reduced in the frequency range of $4 \times 10^6$ (Hz) or higher by setting the relation between length L2 and width W2 to be W2≧L2. By setting length L2 and width W2 so as to be W2≧L2, the electric element 100 used in the operating state shown in FIG. 11 reflects less electric currents fed from the CPU 110. Accordingly, when the electric element 100 is used as a capacitor, the relation of length L2 and width W2 is thus set to hold W2≧L2.

The electric element 101 shown in FIG. 10 is also used in the operating state shown in FIG. 11 and has the same frequency dependence of the impedance shown in FIGS. 15 and 16.

As discussed above, the electric element 100 (101) is connected between the power source 90 and CPU 110, and functions as a noise filter for confining the unwanted high-frequency current produced by the CPU 110 within the vicinity of the CPU 110 or as a capacitor for supplying the power source current to the CPU 110. When the electric element 100 is connected between the power source 90 and CPU 110, the conductive plates 11, 12, 21 to 23 are connected as transmission lines. In other words, the capacitor made up of the conductive plates 11, 12 connected to the anode electrodes 10C, 10D and the conductive plates 21 to 23 connected to the cathode electrodes 20E, 20F does not require terminals to be connected to the transmission line but using the conductive plates 11, 12, 21 to 23 as a part of the transmission lines. The conductive plates 11, 12, therefore, are conductors used for allowing the DC current I output from the power source 90 to flow from the power source 90 side to the CPU 110 side, while the conductive plates 21 to 23 are conductors used for allowing the return current Ir to flow from the CPU 110 side to the power source 90 side.

Consequently, the equivalent series inductance can be reduced to a minimum.

In addition, the electric element 100 (101) is so configured that a current flowing in the conductive plates 11, 12 connected to the anode electrodes 10C, 10D, (120, 130) is directed opposite to a current flowing in the conductive plates 21 to 23 connected to the cathode electrodes 20E, 20F, thereby creating magnetic interference between the conductive plates 11, 12 and conductive plates 21 to 23. Because of the magnetic interference, the mutual inductance between the conductive plates 11, 12 and conductive plates 21 to 23 reduces the self-inductance of the conductive plates 11, 12. The reduction of the self-inductance of the conductive plates 11, 12 reduces the effective inductance of the electric element 100 (101), thus lowering the impedance of the electric element 100 (101).

The first characteristic feature of this invention discussed above is that the conductive plates 11, 12, 21 to 23, which constitute electrodes of the capacitor, are connected as a part of the transmission lines. The second characteristic feature is that the current flowing through the conductive plates 11, 12 connected to the anode electrodes 10C, 10D and the current flowing in the opposite direction through the conductive plates 21 to 23 connected to the cathode electrodes 20E, 20F create magnetic interference between the conductive plates 11, 12 and conductive plates 21 to 23, thereby making the effective inductance of the conductive plates 11, 12 smaller than the self-inductance of the conductive plates 11, 12, therefore lowering the impedance of the electric element 100 (101). The third characteristic feature is that each of the conductive plates 11, 12 passing the DC current constituting an electric current from the power source is sandwiched by two conductive plates (conductive plates 21 and 22 or conductive plates 22 and 23) connected to ground potential.

The second characteristic feature is realized by adopting the structure in which the return current Ir from the CPU 110 flows to the conductive plates 21 to 23 placed in the electric element 100 (101).

The equivalent series inductance can be reduced to a minimum according to the first characteristic feature, and the unwanted high-frequency current can be confined in the vicinity of the CPU 110 according to the second characteristic feature. The third characteristic feature prevents noise generated by the electric element 100 (101) from leaking outside as well as preventing noise generated outside the electric element 100 (101) from affecting the electric element 100 (101).

Although all the dielectric layers 1 to 5 are composed of the same dielectric material ($BaTiO_3$) in the above embodiment, the present invention is not limited to this. The dielectric layers 1 to 5 can be composed of different dielectric materials on an individual basis. Alternatively, the dielectric layers 1 to 5 can be put into two groups each composed of the same material, but the materials are different to each other. Typically the dielectric layers 1 to 5 may be composed of one or more kinds of dielectric materials. Any dielectric material for forming the dielectric layers 1 to 5 preferably has the relative permittivities of 3000 or more.

In addition to $BaTiO_3$, the dielectric layers may be composed of $Ba(Ti, Sn)O_3$, $Bi_4Ti_3O_{12}$, $(Ba, Sr, Ca)TiO_3$, $(Ba, Ca)(Zr, Ti)O_3$, $(Ba, Sr, Ca)(Zr, Ti)O_3$, $SrTiO_3$, $CaTiO_3$, $PbTiO_3$, $Pb(Zn, Nb)O_3$, $Pb(Fe, W)O_3$, $Pb(Fe, Nb)O_3$, $Pb(Mg, Nb)O_3$, $Pb(Ni, W)O_3$, $Pb(Mg, W)O_3$, $Pb(Zr, Ti)O_3$, $Pb(Li, Fe, W)O_3$, $Pb_5Ge_3O_{11}$ and $CaZrO_3$, and so forth.

Although the anode electrodes 10C, 10D (120, 130), side anode electrodes 10A, 10B, conductive plates 11, 12, 21 to 23, side cathode electrodes 20A, 20B, 20C, 20D and cathode electrodes 20E, 20F are composed of nickel (Ni) in the above embodiment, the present invention is not limited to this. The anode electrodes 10C, 10D, (120, 130), side anode electrodes 10A, 10B, conductive plates 11, 12, 21 to 23, side cathode electrodes 20A, 20B, 20C, 20D and cathode electrodes 20E, 20F can be composed of any of silver (Ag), palladium (Pd), silver-palladium alloy (Ag—Pd), platinum (Pt), gold (Au), copper (Cu), rubidium (Ru) and tungsten (W).

Although the electric element 100 (101) comprises the dielectric layers 1 to 5 in the above embodiment, the present invention is not limited to this. The electric element 100 (101) does not need to comprise the dielectric layers 1 to 5. Since magnetic interference could occur between the conductive plates 11, 12 and conductive plates 21 to 23 even without the dielectric layers 1 to 5, the aforementioned mechanism can reduce the impedance of the electric element 100 (101).

Although the number of the conductive plates to be connected to the anode electrodes 10C, 10D (120, 130) is two (i.e. conductive plates 11, 12), while the number of the conductive plates to be connected to the cathode electrodes 20E, 20F is three (i.e. conductive plates 21, 22, 23) in the above embodiment, the present invention is not limited to this. The electric element 100 (101) can comprise n-number (n is a positive integer) of the conductive plates connected to the anode electrodes 10C, 10D (120, 130) and m-number (m is a positive integer) of the conductive plates connected to the cathode electrodes 20E, 20F. In this case, the electric element 100 (101) comprises j-number (j=m+n) of the dielectric layers. The magnetic interference to make the effective inductance small can be generated as long as there are at least one conductive plate connected to the anode electrodes 10C, 10D, (120, 130) and at least one conductive plate connected to the cathode electrodes 20E, 20F.

In the present invention, the number of the conductive plates connected to the anode electrodes 10C, 10D (120, 130) and the number of the conductive plates connected to the cathode electrodes 20E, 20F are increased with an increase of the electric current flowing in the electric element 100 (101). Since the conductive plates connected to the anode electrodes 10C, 10D (120, 130) and the conductive plates connected to the cathode electrodes 20E, 20F are connected between two anode electrodes (i.e. 10C and 10D or 120 and 130), or between two cathode electrodes (i.e. 20E and 20F) in parallel, the addition of the conductive plates connected to the anode electrodes 10C, 10D (120, 130) and the conductive plates connected to the cathode electrodes 20E, 20F can increase the amount of electric current flowing in the electric element 100 (101).

In order to relatively reduce impedance of the electric element 100 (101), the number of the conductive plates connected to the anode electrodes 10C, 10D (120, 130) and the number of the conductive plates connected to the cathode electrodes 20E, 20F are increased in the present invention. Because the addition of the conductive plates connected to the anode electrodes 10C, 10D (120, 130) and the conductive plates connected to the cathode electrodes 20E, 20F provides additional capacitors to be connected in parallel, thereby increasing the effective capacitance of the electric element 100 (101), therefore lowering the impedance.

Although the conductive plates 11, 12 are disposed parallel with the conductive plates 21 to 23 in the above embodiment, the present invention is not limited to this. The conductive plates 11, 12, 21 to 23 can be disposed so that the distance between the conductive plates 11, 12 and the conductive plates 21 to 23 varies along the longitudinal direction DR1.

Although the electric element 100 (101) is connected to the CPU 110 in the above embodiment, the present invention is not limited to this. The electric element 100 (101) can be connected to any electrical load circuit as long as the electrical load circuit operates at a predetermined frequency.

Although the electric element 100 (101) is used as a noise filter for confining the unwanted high-frequency current produced by the CPU 110 within the vicinity of the CPU 110 in the above embodiment, the present invention is not limited to this. Since the electric element 100 (101) includes four capacitors connected in parallel as discussed above, the electric element 100 (101) also can be used as a capacitor.

More concretely, the electric element 100 (101) can be used in notebook computers, CD-RW/DVD recorders and players, game machines, information appliances, digital cameras, in-vehicle electric equipment, in-vehicle digital equipment, MPU peripheral circuitry and DC/DC converters and so forth.

Electric elements that are adopted in notebook computers and CD-RW/DVD recorders and players as a capacitor, but function as a noise filter, arranged between the power source 90 and CPU 110, for confining the unwanted high-frequency current produced by the CPU 110 within the vicinity of the CPU 110 are grouped with the electric element 100 (101) of the present invention.

According to the above-described first embodiment, the electric element 100 comprises conductive plates 11, 12, conductive plates 21 to 23 alternately disposed with the conductive plates 11, 12, a side anode electrode 10A and an anode electrode 10C connected to one end of the conductive plates 11, 12, a side anode electrode 10B and an anode electrode 10D connected to the other end of the conductive plates 11, 12, side cathode electrodes 20A, 20B and a cathode electrode 20E connected to the conductive plates 21 to 23 in the proximity of one end of the conductive plates 21 to 23, and side cathode electrodes 20C, 20D and a cathode electrode 20F connected to the conductive plates 21 to 23 in the proximity of the other end of the conductive plates 21 to 23. The electric current flows in order from the anode electrode 10C, side anode electrode 10A, conductive plates 11, 12, side anode electrode 10B to anode electrode 10D, while the return current flows in order from the cathode electrode 20F, side cathode electrodes 20C, 20D, conductive plates 21 to 23, side cathode electrodes 20A, 20B to cathode electrode 20E. With this configuration, the return current flowing in the conductive plates 21 to 23 causes mutual inductance between the conductive plates 11, 12 and conductive plates 21 to 23, thereby making the effective inductance of the conductive plates 11, 12 smaller than the self-inductance of the conductive plates 11, 12.

The electric element 101 comprises conductive plates 11, 12, conductive plates 21, 22 alternately disposed with the conductive plates 11, 12, an anode electrode 120 connected to one end of the conductive plates 11, 12, an anode electrode 130 connected to the other end of the conductive plates 11, 12, a side cathode electrodes 20A, 20B and a cathode electrode 20E connected to the conductive plates 21, 22 in the proximity of one end of the conductive plates 21, 22, and side cathode electrodes 20C, 20D and a cathode electrode 20F connected to the conductive plates 21, 22 in the proximity of the other end of the conductive plates 21, 22. The electric current flows in order from the anode electrode 120, through the conductive plates 11, 12, to the anode electrode 130, while the return current flows in order from the cathode electrode 20F, through the side cathode electrodes 20C, 20D, conductive plates 21, 22, side cathode electrodes 20A, 20B to the cathode electrode 20E. With this configuration, the return current flowing in the conductive plates 21, 22 causes mutual inductance between the conductive plates 11, 12 and conductive plates 21, 22, thereby making the effective inductance of the conductive plates 11, 12 smaller than the self-inductance of the conductive plates 11, 12.

According to the present invention, the impedance can be reduced with the decrease of the inductance.

The Second Embodiment

Figure 17:
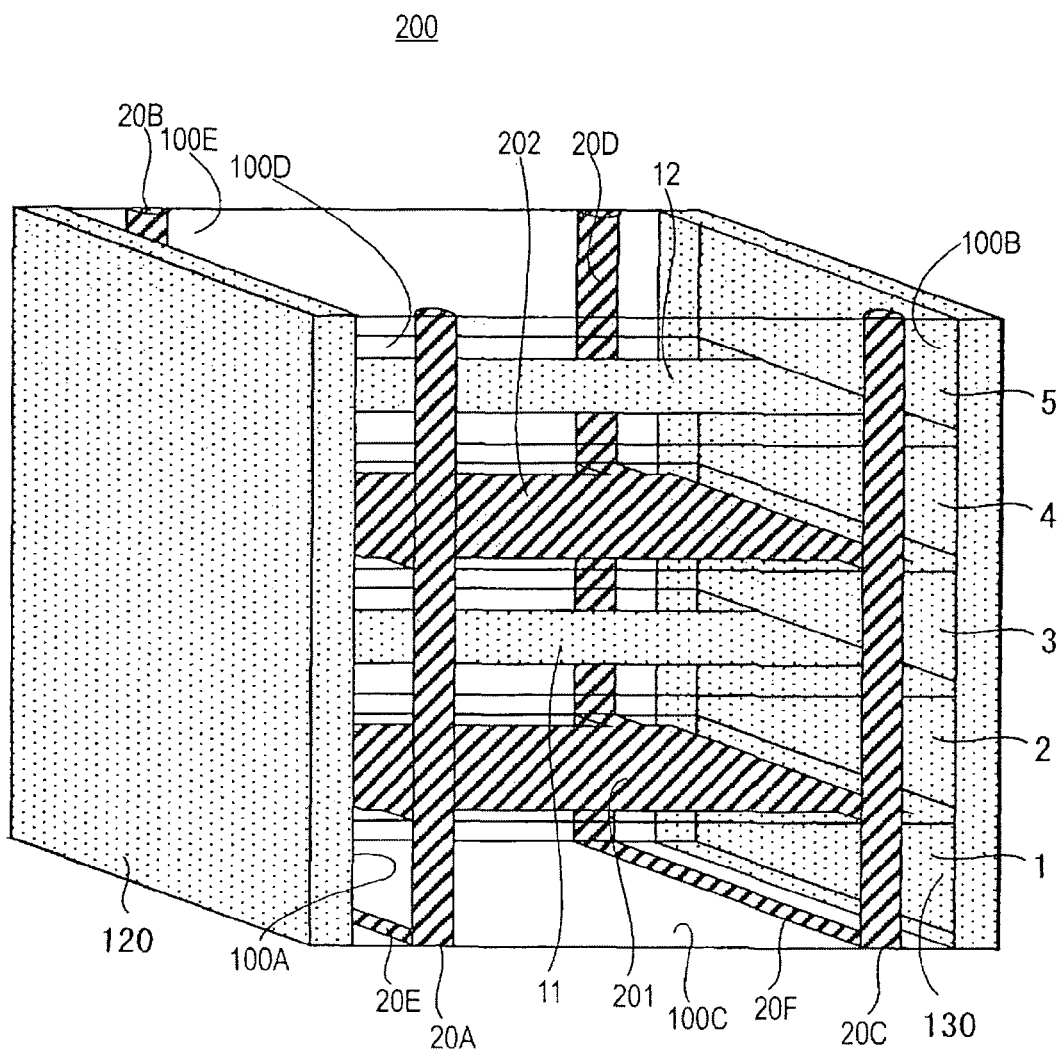
FIG. 17 is a schematic view illustrating the structure of an electric element according to the second embodiment.

FIG. 17 is a schematic view illustrating the structure of an electric element according to the second embodiment. Referring to FIG. 17, the electric element 200 of the second embodiment includes conductive plates 201, 202 instead of the conductive plates 21, 22 of the electric element 101 shown in FIG. 10 and the same components as those of the electric element 101.

The conductive plates 201, 202 are composed of nickel (Ni). The conductive plate 201 is placed on a principal surface of a dielectric layer 1, while the conductive plate 202 is placed on a principal surface of a dielectric layer 3. The conductive plates 201, 202 are connected to side cathode electrodes 20A, 20C on the front face 100D of the electric element 200 and side cathode electrodes 20B, 20D on the rear face 100E.

Figure 18A:
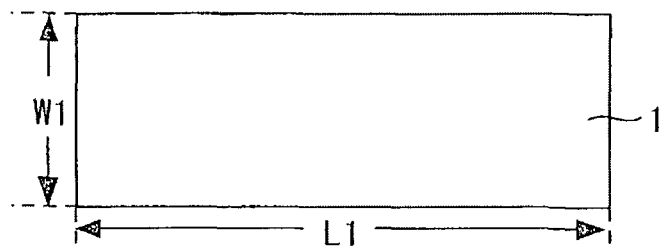
FIGS. 18A to 18E are plan views of dielectric layers and conductive plates shown in FIG. 17 and a bottom view of the electric element shown in FIG. 17.
Figure 18B:
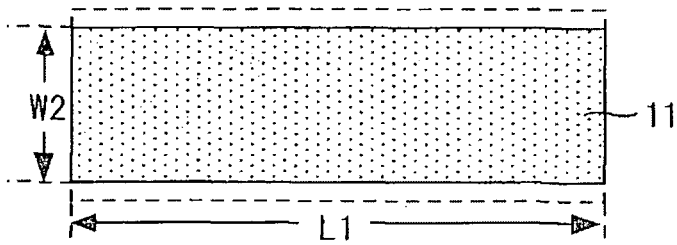
Figure 18C:
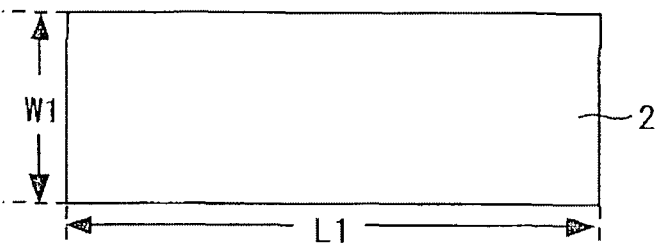
Figure 18D:
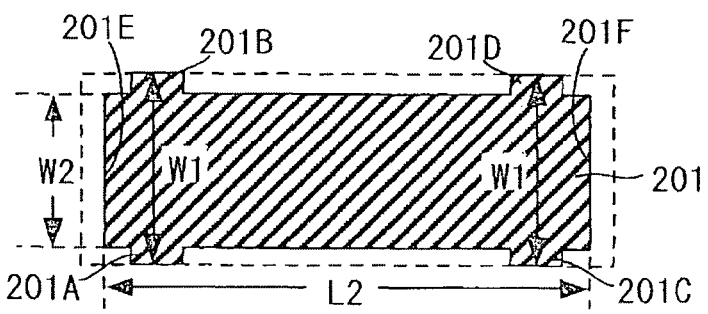
Figure 18E:
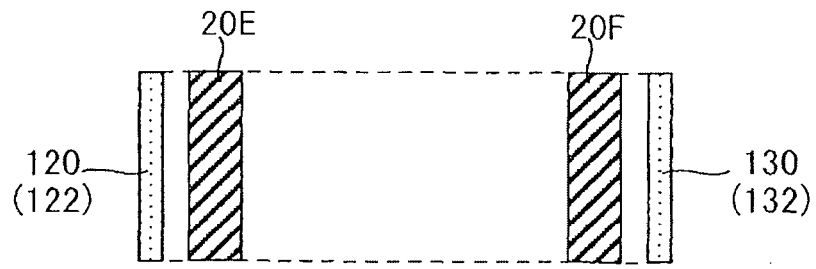

FIGS. 18A to 18E are plan views of the dielectric layers 1, 2 and conductive plates 11, 201 shown in FIG. 17 and a bottom view of the electric element 200. FIG. 18A is a plan view of the dielectric layer 1, FIG. 18B is a plan view of the conductive plate 11, FIG. 18C is a plan view of the dielectric layer 2, FIG. 18D is a plan view of the conductive plate 201, and FIG. 18E is a bottom view of the electric element 200.

The dielectric layers 1, 2 have length L1 and width W1 (see FIGS. 18A and 18C) as discussed above. The conductive plate 11 has length L1 and width W2 (see FIG. 18B) as discussed above. The dielectric layers 3 to 5 are in the same form of a flat plate as the dielectric layers 1, 2, while the conductive plate 12 is in the same form of a flat plate as the conductive plate 11.

The conductive plate 201 has length L2 and width W2. Length L2 is shorter than length L1, and width W2 is narrower than width W1. The conductive plate 201 has extending portions 201A, 201B, 201C, 201D. The extending portions 201A, 201B are located closer to one side 201E than the midpoint of the conductive plate 201 in the longitudinal direction, while the extending portions 201C, 201D are located closer to the other side 201F than the midpoint of the conductive plate 201 in the longitudinal direction. The provision of the extending portions 201A, 201B, 201C, 201D widens the width from the extending portion 201A to 201B and from the extending portion 201C to 201D of the conductive plate 201 to width W1. This configuration allows the extending portions 201A, 201B, 201C, 201D to be connected to the side cathode electrodes 20A, 20B, 20C, 20D, respectively. The conductive plate 202 shown in FIG. 17 is in the same form of a flat plate as the conductive plate 201 shown in FIG. 18D.

On the bottom face of the electric element 200, an anode electrode 120 (strip electrode 122) is disposed on one side of the electric element 200, while an anode electrode 130 (strip electrode 132) is disposed on the other side of the electric element 200. A cathode electrode 20E is disposed between the anode electrode 120 and 130 but closer to the anode electrode 120 than the midpoint between the anode electrodes 120 and 130, while a cathode electrode 20F is disposed between the anode electrodes 120 and 130 but closer to the anode electrode 130 than the midpoint between the anode electrode 120 and anode electrode 130 (see FIG. 18E).

Due to such plane shapes of the conductive plates 11, 12, 201, 202 and the dielectric layers 1 to 5 as shown in FIGS. 18A to 18E, in the electric element 200, the anode electrode 120 is connected to the conductive plates 11, 12 on the side face 100A of the electric element 200, the anode electrode 130 is connected to the conductive plates 11, 12 on the side face 100B, opposite to the side face 100A, of the electric element 200, the side cathode electrodes 20A, 20C are connected to the conductive plates 201, 202 on the front face 100D, approximately perpendicular to the side faces 100A, 100B, of the electric element 200, and the side cathode electrodes 20B, 20D are connected to the conductive plates 201, 202 on the rear face 100E, approximately perpendicular to the side faces 100A, 100B, of the electric element 200.

The electric element 200 shown in FIG. 17 has the frequency dependence of the impedance shown in the aforementioned FIGS. 15 and 16. Therefore, when the electric element 200 is used as a noise filter, the relation of length L2 and width W2 is set to be L2>W2. When the electric element 200 is used as a capacitor, the relation of length L2 and width W2 is set to be W2≧L2.

As to the other structure, the electric element 200 is the same as the electric element of the first embodiment.

The Third Embodiment

Figure 19:
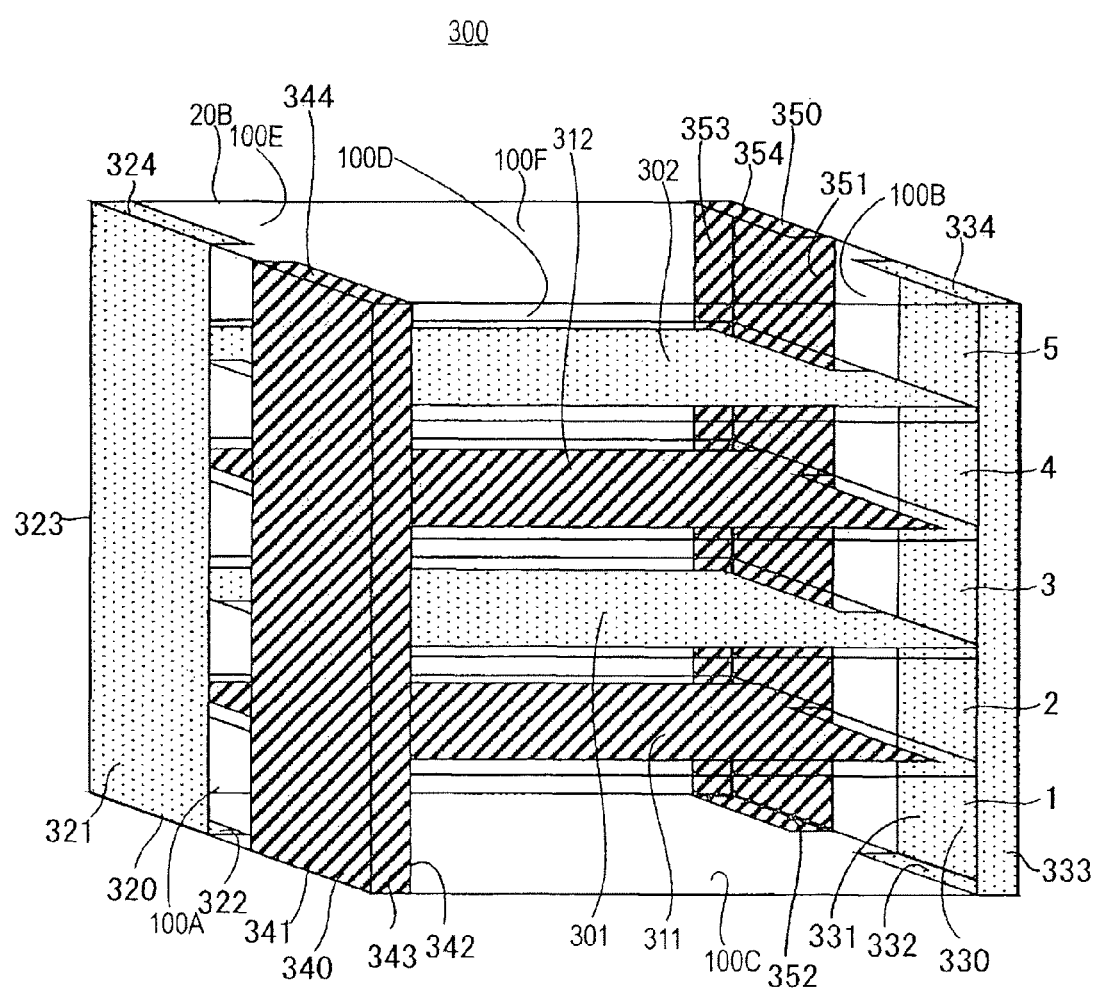
FIG. 19 is a schematic view illustrating the structure of an electric element according to the third embodiment.

FIG. 19 is a schematic view illustrating the structure of an electric element according to the third embodiment. Referring to FIG. 19, the electric element 300 of the third embodiment includes conductive plates 301, 302 instead of the conductive plates 11, 12 of the electric element 101 shown in FIG. 10, conductive plates 311, 312 instead of the conductive plates 21, 22, an anode electrode 320 instead of the side anode electrode 10A and anode electrode 10C, an anode electrode 330 instead of the side anode electrode 10B and anode electrode 10D, a cathode electrode 340 instead of the side cathode electrodes 20A, 20B and cathode electrode 20E, a cathode electrode 350 instead of the side cathode electrodes 20C, 20D and cathode electrode 20F. The other components are the same as those of the electric element 101.

The conductive plate 301 is placed on a principal surface of the dielectric layer 2, while the conductive plate 302 is placed on a principal surface of the dielectric layer 4. The conductive plate 311 is placed on a principal surface of the dielectric layer 1, while the conductive plate 312 is placed on a principal surface of the dielectric layer 3. These conductive plates 301, 302, 311, 312 are composed of nickel (Ni).

The anode electrode 320 is disposed on a part of the side face 100A, bottom face 100C, rear face 100E and top face 100F of the electric element 300, and connected to one end of the conductive plates 301, 302. More specifically, the anode electrode 320 includes a side anode electrode 321 and strip electrodes 322 to 324. The side anode electrode 321 is arranged on the side face 100A of the electric element 300 and connected to one end of the conductive plates 301, 302. The strip electrodes 322, 323, 324 are arranged on the bottom face 100C, rear face 100E, top face 100F, respectively, of the electric element 300.

The anode electrode 330 is disposed on a part of the side face 100B, bottom face 100C, front face 100D and top face 100F of the electric element 300, and connected to the other end of the conductive plates 301, 302. More specifically, the anode electrode 330 includes a side anode electrode 331 and strip electrodes 332 to 334. The side anode electrode 331 is arranged on the side face 100B of the electric element 300 and connected to the other end of the conductive plates 301, 302. The strip electrodes 332, 333, 334 are arranged on the bottom face 100C, front face 100D, top face 100F, respectively, of the electric element 300.

The cathode electrode 340 is disposed on a part of the side face 100A, bottom face 100C, front face 100D and top face 100F of the electric element 300, and connected to one end of the conductive plates 311, 312. More specifically, the cathode electrode 340 includes a side cathode electrode 341 and strip electrodes 342 to 344. The side cathode electrode 341 is arranged on the side face 100A of the electric element 300 and connected to one end of the conductive plates 311, 312. The strip electrodes 342, 343, 344 are arranged on the bottom face 100C, front face 100D, top face 100F, respectively, of the electric element 300.

The cathode electrode 350 is disposed on a part of the side face 100B, bottom face 100C, rear face 100E and top face 100F of the electric element 300, and connected to the other end of the conductive plates 311, 312. More specifically, the cathode electrode 350 includes a side cathode electrode 351 and strip electrodes 352 to 354. The side cathode electrode 351 is arranged on the side face 100B of the electric element 300 and connected to the other end of the conductive plates 311, 312. The strip electrodes 352, 353, 354 are disposed on the bottom face 100C, rear face 100E, top face 100F, respectively, of the electric element 300.

Figure 20A:
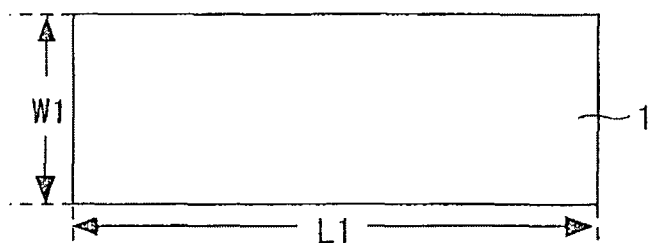
FIGS. 20A to 20E are plan views of the dielectric layers and conductive plates shown in FIG. 19 and a bottom view of the electric element shown in FIG. 19.
Figure 20B:
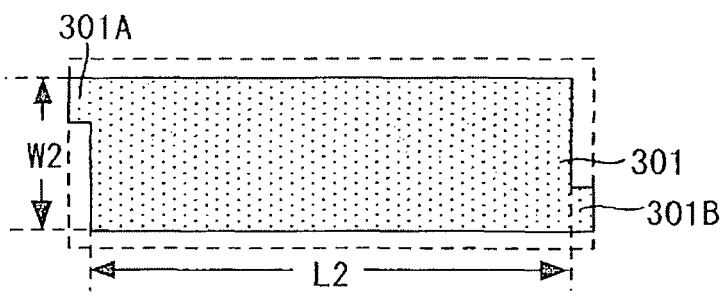
Figure 20C:
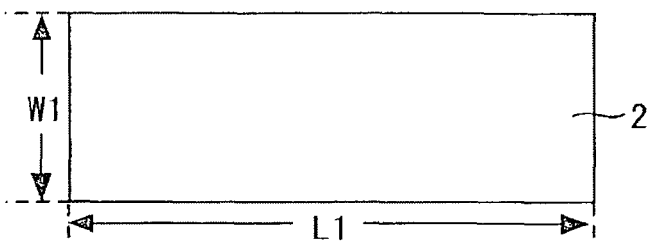
Figure 20D:
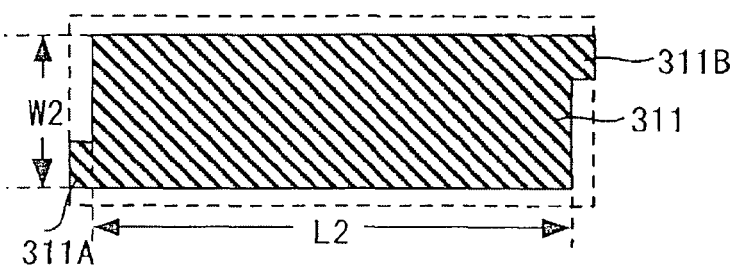
Figure 20E:
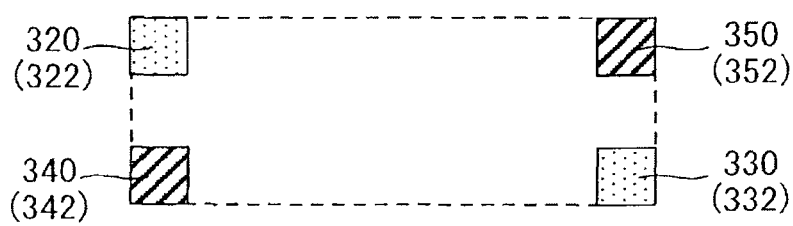

FIGS. 20A to 20E are plan views of the dielectric layers 1, 2 and conductive plates 301, 311 shown in FIG. 19 and a bottom view of the electric element 300 shown in FIG. 19. FIG. 20A is a plan view of the dielectric layer 1, FIG. 20B is a plan view of the conductive plate 301, FIG. 20C is a plan view of the dielectric layer 2, FIG. 20D is a plan view of the conductive plate 311, and FIG. 20E is a bottom view of the electric element 300.

The dielectric layers 1, 2 have the aforementioned length L1 and width W1 (see FIGS. 20A, 20C). The dielectric layers 3 to 5 have the same shape and dimensions as the dielectric layers 1, 2.

The conductive plate 301 has an approximately rectangular plane. The conductive plate 301 has length L2 along in a lateral direction of the rectangle and width W2 in a vertical direction of the rectangle. Length L2 is shorter than length L1, while width W2 is narrower than width W1. In addition, the conductive plate 301 has two extending portions 301A, 301B. The two extending portions 301A, 301B are provided at opposite ends on one of two diagonal lines of the rectangle (see FIG. 20B). This configuration allows the extending portions 301A and 301B to be connected to the side anode electrode 321 of the anode electrode 320 and the side anode electrode 331 of the anode electrode 330, respectively. The conductive plate 302 has the same shape and dimensions as the conductive plate 301.

The conductive plate 311 has an approximately rectangular plane. The conductive plate 311 has length L2 in a lateral direction of the rectangle and width W2 in a vertical direction of the rectangle. In addition, the conductive plate 311 has two extending portions 311A, 311B. The two extending portions 311A, 311B are provided at opposite ends on the other diagonal line of the two diagonal lines of the rectangle (see FIG. 20D). This configuration allows the extending portions 311A and 311B to be connected to the side cathode electrode 341 of the cathode electrode 340 and the side cathode electrode 351 of the cathode electrode 350, respectively. The conductive plate 312 has the same shape and dimensions as the conductive plate 311.

The anode electrode 320 (strip electrode 322), anode electrode 330 (strip electrode 322), cathode electrode 340 (strip electrode 342) and cathode electrode 350 (strip electrode 352) are located in four corners, respectively, of the bottom face 100C of the electric element 300. The two anode electrodes 320, 330 are disposed at the opposite ends on one of the two diagonal lines of the rectangle, while the two cathode electrodes 340, 350 are disposed at the opposite ends on the other diagonal line of the two diagonal lines of the rectangle (see FIG. 20E).

Due to such plane shapes of the conductive plates 301, 302, 311, 312 and dielectric layers 1 to 5 as shown in FIGS. 20A to 20E, in the electric element 300, the anode electrode 320 is connected to the conductive plates 301, 302 on the side face 100A of the electric element 300, while the anode electrode 330 is connected to the conductive plates 301, 302 on the side face 100B, opposite to the side face 100A, of the electric element 300. The cathode electrode 340 is connected to the conductive plates 311, 312 on the side face 100A of the electric element 300, while the cathode electrode 350 is connected to the conductive plates 311, 312 on the side face 100B of the electric element 300.

The electric element 300 shown in FIG. 19 has the frequency dependence of the impedance shown in aforementioned FIGS. 15 and 16. Therefore, when the electric element 300 is used as a noise filter, the relation of length L2 and width W2 is set so as to be L2>W2. When the electric element 300 is used as a capacitor, the relation of length L2 and width W2 is set so as to be W2≧L2.

As to the other structure, the electric element 300 is the same as the electric element of the first embodiment.

The Fourth Embodiment

Figure 21:
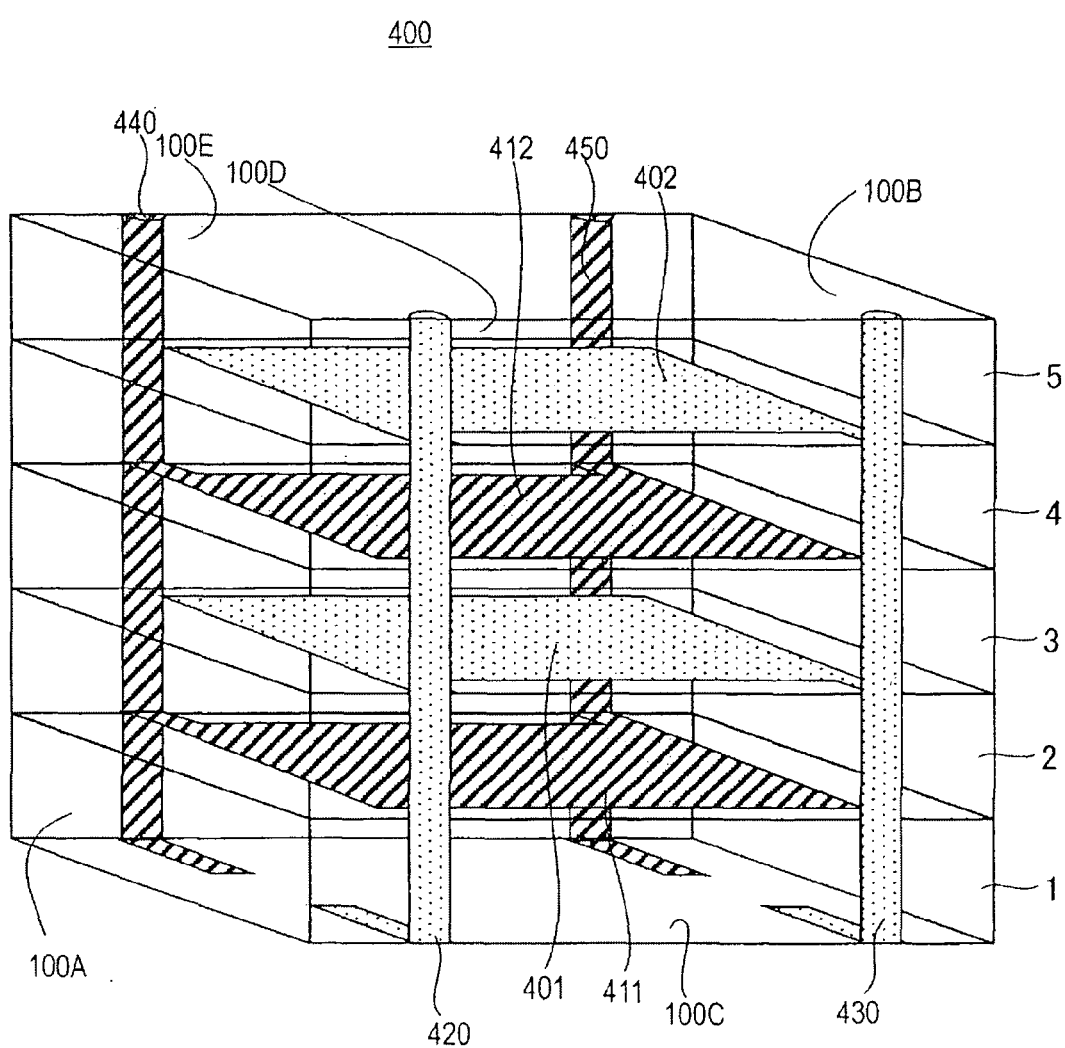
FIG. 21 is a schematic view illustrating the structure of an electric element according to the fourth embodiment.

FIG. 21 is a schematic view illustrating the structure of an electric element according to the fourth embodiment. Referring to FIG. 21, the electric element 400 of the fourth embodiment includes conductive plates 401, 402 instead of the conductive plates 11, 12 of the electric element 101 shown in FIG. 10, conductive plates 411, 412 instead of the conductive plates 21, 22, an anode electrode 420 instead of the side anode electrode 10A and anode electrode 10C, an anode electrode 430 instead of the side anode electrode 10B and anode electrode 10D, a cathode electrode 440 instead of the side cathode electrodes 20A, 20B and cathode electrode 20E, a cathode electrode 450 instead of the side cathode electrodes 20C, 20D and cathode electrode 20F. The other components are the same as those of the electric element 101.

The conductive plate 401 is placed on a principal surface of the dielectric layer 2, while the conductive plate 402 is placed on a principal surface of the dielectric layer 4. The conductive plate 411 is placed on a principal surface of the dielectric layer 1, while the conductive plate 412 is placed on a principal surface of the dielectric layer 3. These conductive plates 401, 402, 411, 412 are composed of nickel (Ni).

The anode electrode 420 is disposed on the front face 100D, bottom face 100C and top face 100F of the electric element 400 and connected to the conductive plates 401, 402 in the proximity of one end of the conductive plates 401, 402. The anode electrode 430 is disposed on the front face 100D, bottom face 100C and top face 100F of the electric element 400 and connected to the conductive plates 401, 402 in the proximity of the other end of the conductive plates 401, 402.

The cathode electrode 440 is disposed on the rear face 100E, bottom face 100C and top face 100F of the electric element 400 and connected to the conductive plates 411, 412 in the proximity of one end of the conductive plates 411, 412. The cathode electrode 450 is disposed on the rear face 100E, bottom face 100C and top face 100F of the electric element 400 and connected to the conductive plates 411, 412 in the proximity of the other end of the conductive plates 411, 412.

Figure 22A:
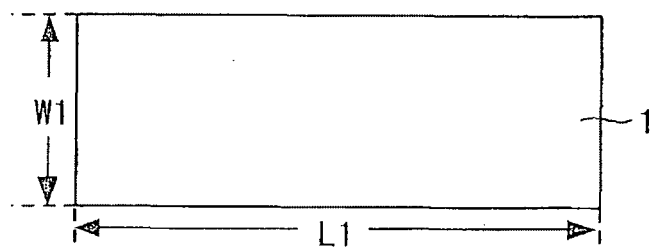
FIGS. 22A to 22E are plan views of the dielectric layers and conductive plates shown in FIG. 21 and a bottom view of the electric element shown in FIG. 21.
Figure 22B:
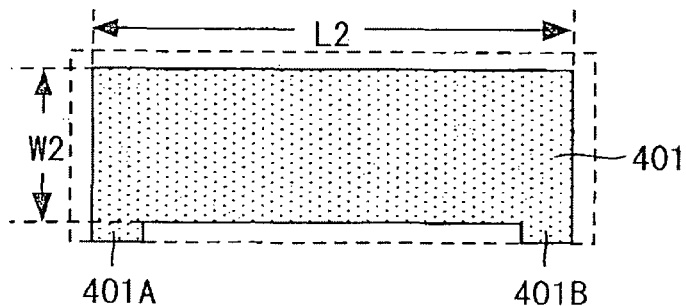
Figure 22C:
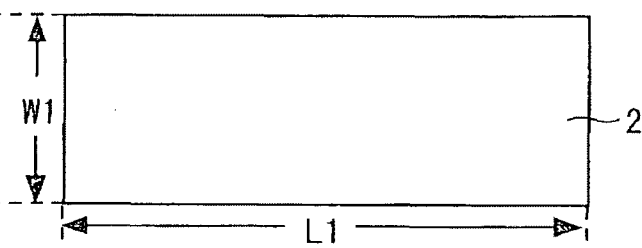
Figure 22D:
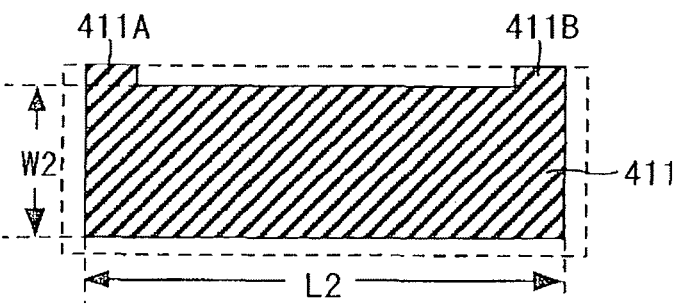
Figure 22E:

FIGS. 22A to 22E are plan views of the dielectric layers 1, 2 and conductive plates 401, 411 shown in FIG. 21 and a bottom view of the electric element 400 shown in FIG. 21. FIG. 22A is a plan view of the dielectric layer 1, FIG. 22B is a plan view of the conductive plate 401, FIG. 22C is a plan view of the dielectric layer 2, FIG. 22D is a plan view of the conductive plate 411, and FIG. 22E is a bottom view of the electric element 400.

The dielectric layers 1, 2 have the aforementioned length L1 and width W1 (see FIGS. 22A, 22C). The dielectric layers 3 to 5 have the same shape and dimensions as the dielectric layers 1, 2.

The conductive plate 401 has an approximately rectangular plane. The conductive plate 401 has length L2 in a lateral direction of the rectangle and width W2 in a vertical direction of the rectangle. Length L2 is shorter than length L1, while width W2 is narrower than width W1. In addition, the conductive plate 401 includes two extending portions 401A, 401B. The two extending portions 401A, 401B are provided on one of two sides in the lateral direction of the rectangle. In other words, the two extending portions 401A, 401B are formed on the same side (see FIG. 22B). This configuration allows the extending portions 401A, 401B to be connected to the anode electrodes 420, 430, respectively. The conductive plate 402 has the same shape and dimensions as the conductive plate 401.

The conductive plate 411 has an approximately rectangular plane. The conductive plate 411 has length L2 in a lateral direction of the rectangle and width W2 in a vertical direction of the rectangle. In addition, the conductive plate 411 has two extending portions 411A, 411B. The two extending portions 411A, 411B are provided on the other side of two sides along the lateral direction of the rectangle. In other words, the two extending portions 411A, 411B are provided on the side opposite to the side provided with two extending portions 401A, 401B of the conductive plate 401 (see FIG. 22D). This configuration allows the extending portions 411A, 411B to be connected to the cathode electrodes 440, 450, respectively. The conductive plate 412 has the same shape and dimensions as the conductive plate 411.

The anode electrode 420, anode electrode 430, cathode electrode 440 and cathode electrode 450 are arranged separately near four corners, respectively, on the bottom face 100C of the electric element 400. The two anode electrodes 420, 430 are located along one side out of two sides of the rectangle, while the two cathode electrodes 440, 450 are located along the other side out of two sides of the rectangle (see FIG. 22E).

Due to such plane shapes of the conductive plates 401, 402, 411, 412 and dielectric layers 1 to 5 as shown in FIGS. 22A to 22E, in the electric element 400, the anode electrodes 420, 430 are connected to the conductive plates 401, 402 on the front face 100D of the electric element 400, while the cathode electrodes 440, 450 are connected to the conductive plates 411, 412 on the rear face 100E of the electric element 400.

The electric element 400 shown in FIG. 21 has the frequency dependence of the impedance shown in aforementioned FIGS. 15 and 16. Therefore, when the electric element 400 is used as a noise filter, the relation of the length L2 and width W2 is set so as to be L2>W2. When the electric element 400 is used as a capacitor, the relation of the length L2 and width W2 is set so as to be W2≧L2.

As to the other structure, the electric element 400 is the same as the electric element of the first embodiment.

Exemplary Modifications

Figure 23:
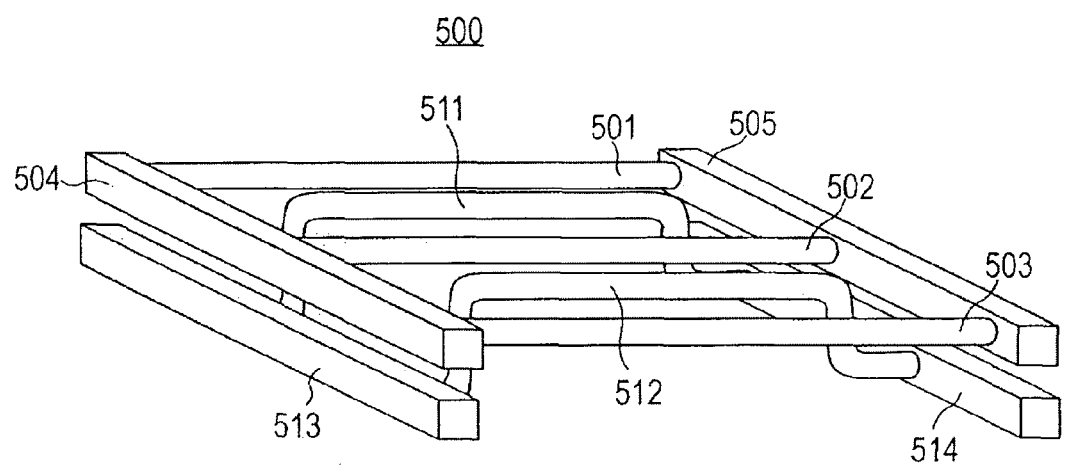
FIG. 23 is a schematic view illustrating the first modification of the electric element according to the embodiments of the present invention.

FIG. 23 is a schematic view illustrating the first modification of the electric element according to the embodiments of the present invention. Referring to FIG. 23, the electric element 500 comprises conductive wires 501 to 503, 511, 512, anode electrodes 504, 505, and cathode electrodes 513, 514.

The conductive wires 501 to 503 are connected approximately parallel between the anode electrodes 504, 505. The conductive wires 511, 512 are connected approximately parallel between the cathode electrodes 513, 514. The conductive wire 511 is located between the conductive wires 501, 502, while the conductive wire 512 is located between the conductive wires 502, 503. Consequently, the conductive wires 501 to 503, 511, 512 are disposed approximately parallel in one plane.

Figure 24:
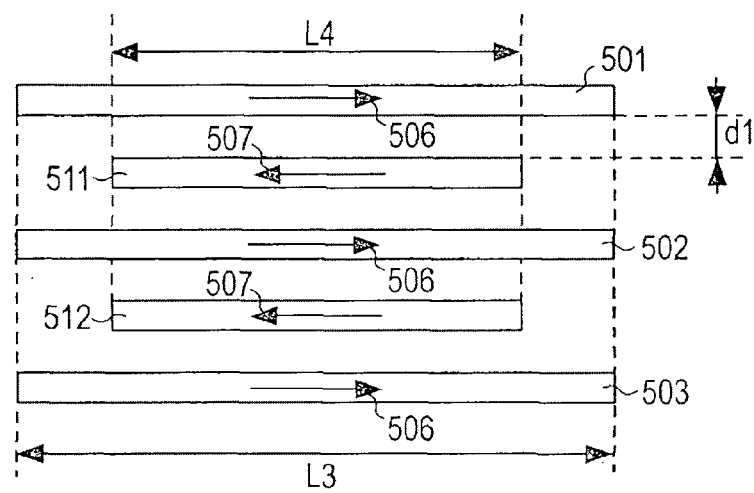
FIG. 24 is a plan view of the electric element shown in FIG. 23.

FIG. 24 is a plan view illustrating the electric element 500 shown in FIG. 23. Referring to FIG. 24, the conductive wires 501 to 503 have length L3, and the conductive wires 511, 512 have length L4. Length L3 may be 15 mm, and length L4 may be 10 mm, for example.

The space between the conductive wire 501 and conductive wire 511 is set at d1. The space d1 may be several hundreds of micrometers, for example. The spaces between the conductive wire 511 and conductive wire 502, between the conductive wire 502 and conductive wire 512, and between the conductive wire 503 and conductive wire 512 are also set at d1.

A DC current flows through the conductive wires 501 to 503 in the direction of arrow 506, while flowing through the conductive wires 511, 512 in the direction of arrow 507. The self-inductance of the conductive wires 501 to 503 is reduced by the mutual inductance occurring between the conductive wires 501 to 503 and conductive wire 511 or 512, thereby making the effective inductance smaller than the self-inductance. As a result, the impedance of the electric element 500 is lowered.

Figure 25:
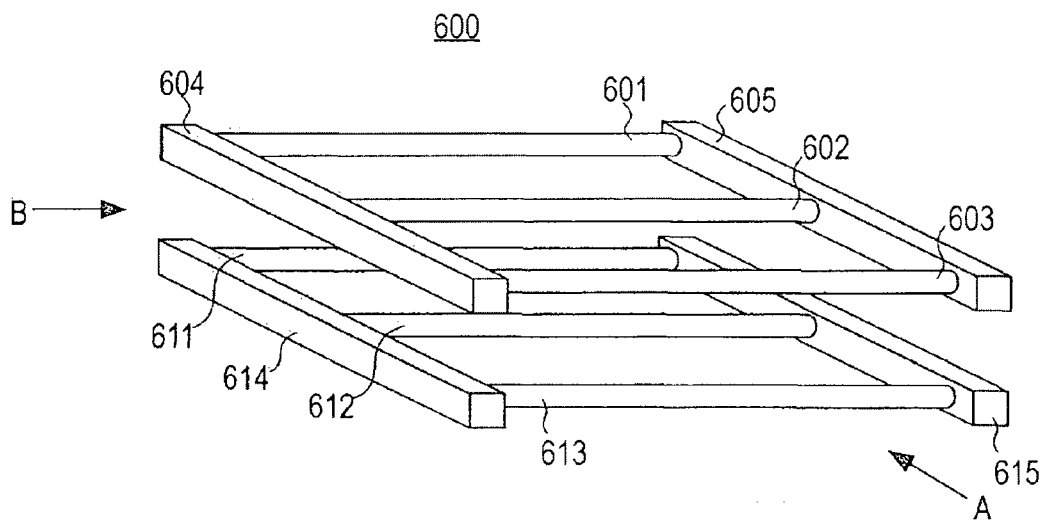
FIG. 25 is a schematic view illustrating the second modification of the electric element according to the embodiments of the present invention.

FIG. 25 is a schematic view illustrating the second modification of the electric element according to the embodiment of the present invention. Referring to FIG. 25, the electric element 600 comprises conductive wires 601 to 603, 611 to 613, anode electrodes 604, 605, and cathode electrodes 614, 615.

The conductive wires 601 to 603 are connected approximately parallel between the anode electrodes 604 and 605. The conductive wires 611 to 613 are connected approximately parallel between the cathode electrodes 614 and 615.

Figure 26A:
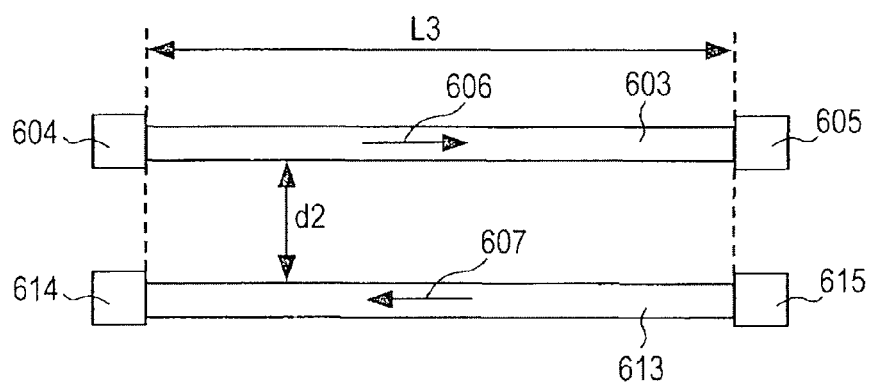
FIGS. 26A and 26B are side views of the electric element shown in FIG. 25.
Figure 26B:
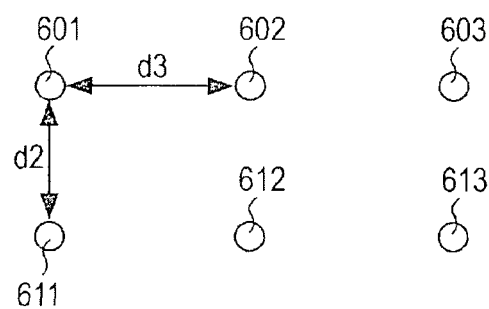

FIGS. 26A and 26B are side views illustrating the electric element 600 shown in FIG. 25. FIG. 26A is a side view of the electric element 600 viewed from direction A in FIG. 25, while FIG. 26B is a side view of the electric element 600 viewed from direction B in FIG. 25. In FIG. 26B, the anode electrodes 604, 605 and cathode electrodes 614, 615 are omitted.

Referring to FIGS. 26A and 26B, each of the conductive wires 603, 613 has length L3. The conductive wires 611 to 613 are opposed to the conductive wires 601 to 603, respectively. The space between conductive wires 601 to 603 and conductive wires 611 to 613 is set at d2. The space d2 may be several hundreds of micrometers, for example.

The space between the conductive wires 601 and 602 is set at d3. The space d3 may be several hundreds of micrometers, for example. The spaces between the conductive wires 602 and 603, between the conductive wires 611 and 612, and between the conductive wires 612 and 613 are also set at d3.

In the electric element 600, the conductive wires 601 to 603 connected to the anode electrodes 604, 605 are arranged on a different plane from the conductive wires 611 to 613 connected to the cathode electrode 614, 615.

A DC current flows through the conductive wires 601 to 603 in the direction of arrow 606, while a DC current flows through the conductive wires 611 to 613 in the direction of arrow 607. The DC currents flowing in the opposite directions cause the mutual inductance between the conductive wires 601 to 603 and conductive wires 611 to 613, which making the self-inductance of the conductive wires 601 to 603 small, and therefore the effective inductance is reduced. As a result, the impedance of the electric element 600 is lowered.

Figure 27:
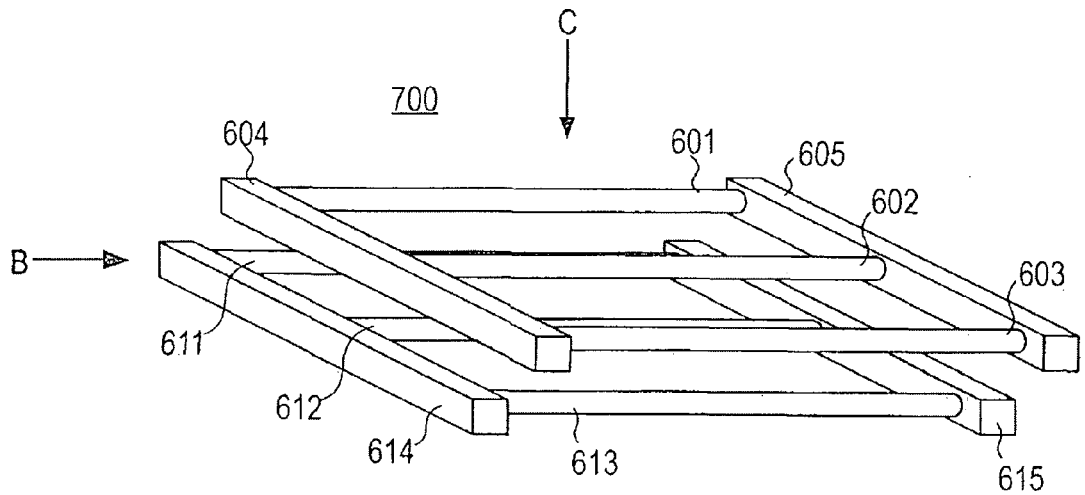
FIG. 27 is a schematic view illustrating the third modification of the electric element according to the embodiments of the present invention.
Figure 28A:
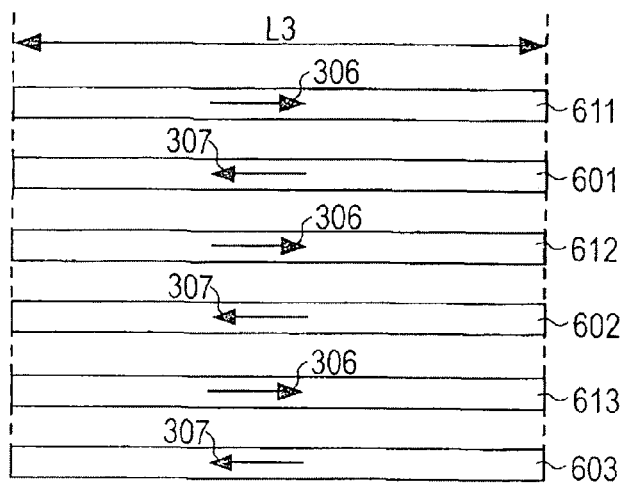
FIGS. 28A and 28B are a plan view and a side view, respectively, illustrating the electric element shown in FIG. 27.
Figure 28B:
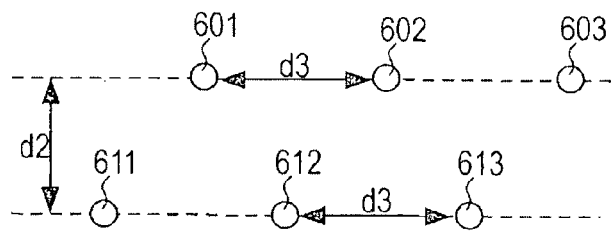

FIG. 27 is a schematic view illustrating the third modification of the electric element according to the embodiments of the present invention. FIGS. 28A and 28B are a plan view and a side view, respectively, illustrating the electric element shown in FIG. 27. FIG. 28A is a plan view viewed from direction C in FIG. 27, and FIG. 28B is a side view viewed from direction B in FIG. 27.

Referring to FIGS. 27, 28A and 28B, the electric element 700 includes the conductive wires 601 to 603 and anode electrodes 604, 605, of the electric element 600 in FIG. 25, shifted in a direction perpendicular to the direction of length L3. When the conductive wires 601 to 603 and conductive wires 611 to 613 are viewed in one plane, the conductive wires 601, 602 are arranged between the conductive wires 611 and 612 and between the conductive wires 612 and 613, respectively (see FIG. 28A).

In the electric element 700, a DC current flows in the conductive wires 601 to 603 in the opposite direction to a DC current flowing in the conductive wires 611 to 613. Because the conductive wires 601, 602 are arranged between the conductive wires 611 and 612, and between the conductive wires 612 and 613, respectively, in one plane, the self-inductance of the conductive wire 601 is reduced by the mutual inductance generated between the conductive wire 601 and conductive wires 611, 612. The effective inductance of the conductive wire 602 becomes lower than the self-inductance by the mutual inductance generated between the conductive wire 602 and conductive wires 612, 613.

As a result, the effective inductance in the electric element 700 can be reduced, and therefore the impedance is lowered.

Figure 29:
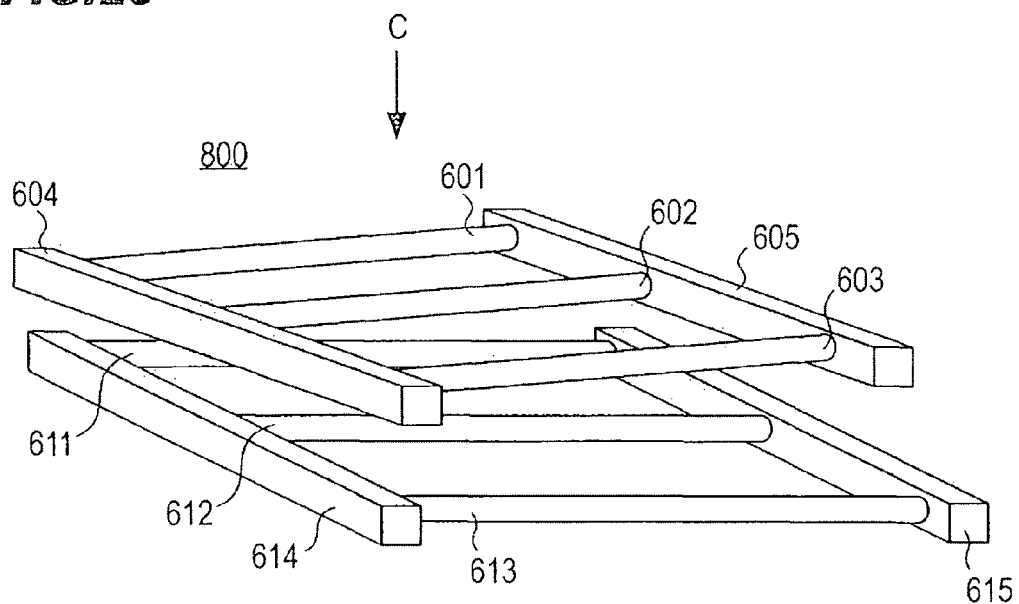
FIG. 29 is a schematic view illustrating the fourth modification of the electric element according to the embodiments of the present invention.
Figure 30:
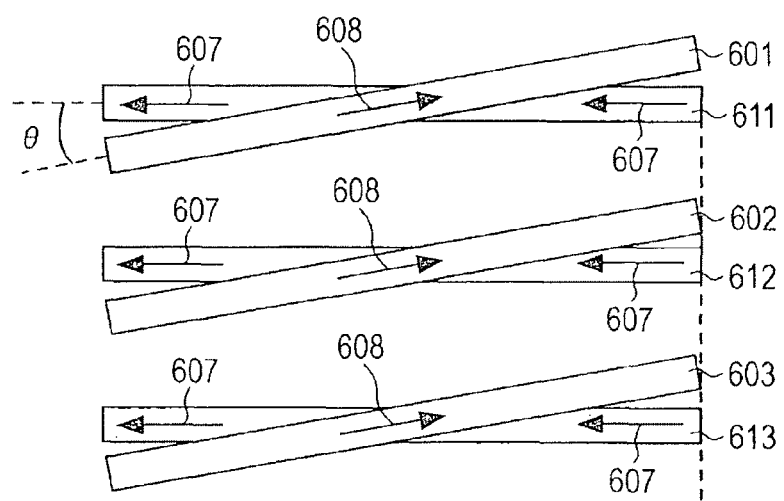
FIG. 30 is a plan view of the electric element viewed from direction C in FIG. 29.

FIG. 29 is a schematic view illustrating the fourth modification of the electric element according to the embodiments of the present invention. FIG. 30 is a plan view of the electric element 800 viewed from direction C in FIG. 29. Referring to FIGS. 29 and 30, the electric element 800 includes the conductive wires 601 to 603 and anode electrodes 604, 605 of the electric element 600 in FIG. 25, rotated by a predetermined angle θ (−90 degrees≦θ≦90 degrees) within a plane parallel to a plane including the conductive wires 611 to 613 and cathode electrodes 614, 615. The θ is a degree with respect to a direction, from the left end to right end of the conductive wires 611 to 613 in FIG. 30, which is defined as zero degree.

In the electric element 800, a DC current flows through the conductive wires 601 to 603 in the direction of arrow 608, while a DC current flows through the conductive wires 611 to 613 in the direction of arrow 607. The DC current flowing through the conductive wires 601 to 603 forms an angle 180-θ with the DC current flowing through the conductive wires 611 to 613. Because the angle 180-θ is set in a range from 90 degrees to 270 degrees, magnetic interference between the conductive wires 601 to 603 and conductive wires 611 to 613 occurs, and therefore the magnetic flux produced by the DC current flowing in the conductive wires 601 to 603 is reduced by the magnetic flux produced by the DC current flowing in the conductive wires 611 to 613.

Thus, the effective inductance of the conductive wires 601 to 603 is reduced to be smaller than the self-inductance by the mutual inductance generated between the conductive wires 601 to 603 and conductive wires 611 to 613. As a result, the smaller effective inductance of the electric element 800 causes the impedance to be lowered.

In the present invention, the DC current flowing in the conductive wires 601 to 603 and the DC current flowing in the conductive wires 611 to 613 are directed so as to intersect with each other, if viewed in one plane, and therefore the magnetic flux produced by the DC current flowing in the conductive wires 601 to 603 is reduced by the magnetic flux produced by the DC current flowing in the conductive wires 611 to 613.

The electric element 500 (600, 700, 800) connected between the power source 90 and CPU 110, is used as a substitute for the electric element 100. The anode electrode 504 (604) is connected to the lead wire 121, the anode electrode 505 (605) is connected to the lead wire 123, the cathode electrode 513 (614) is connected to the lead wire 122, and the cathode electrode 514 (615) is connected to the lead wire 124. The cathode electrodes 513, 514 (614, 615) are connected to ground potential.

In such the electric element 500 (600, 700, 800), a DC current from the power source 90 flows from the anode electrode 504 (604) to the anode electrode 505 (605), while a return current from the CPU 110 flows from the cathode electrode 514 (615) to the cathode electrode 513 (614).

As a result, the effective inductance of the electric element 500 (600, 700, 800) is reduced, therefore lowering the impedance. In addition, the electric element 500 (600, 700, 800) causes an unwanted high-frequency current produced by the CPU 110 to flow within circuitry made up of the electric element and the CPU 110 to confine the unwanted high-frequency current within the vicinity of the CPU 110.

The electric element 500 (600, 700, 800) may further comprise dielectrics for covering the conductive wires 501 to 503, 511 and 512 (601 to 603, 611 to 613).

The electric element 500 (600, 700, 800) may comprise flat plate-like conductors instead of the conductive wires 501 to 503, 511, 512 (601 to 603, 611 to 613).

The Fifth Embodiment

Figure 31:
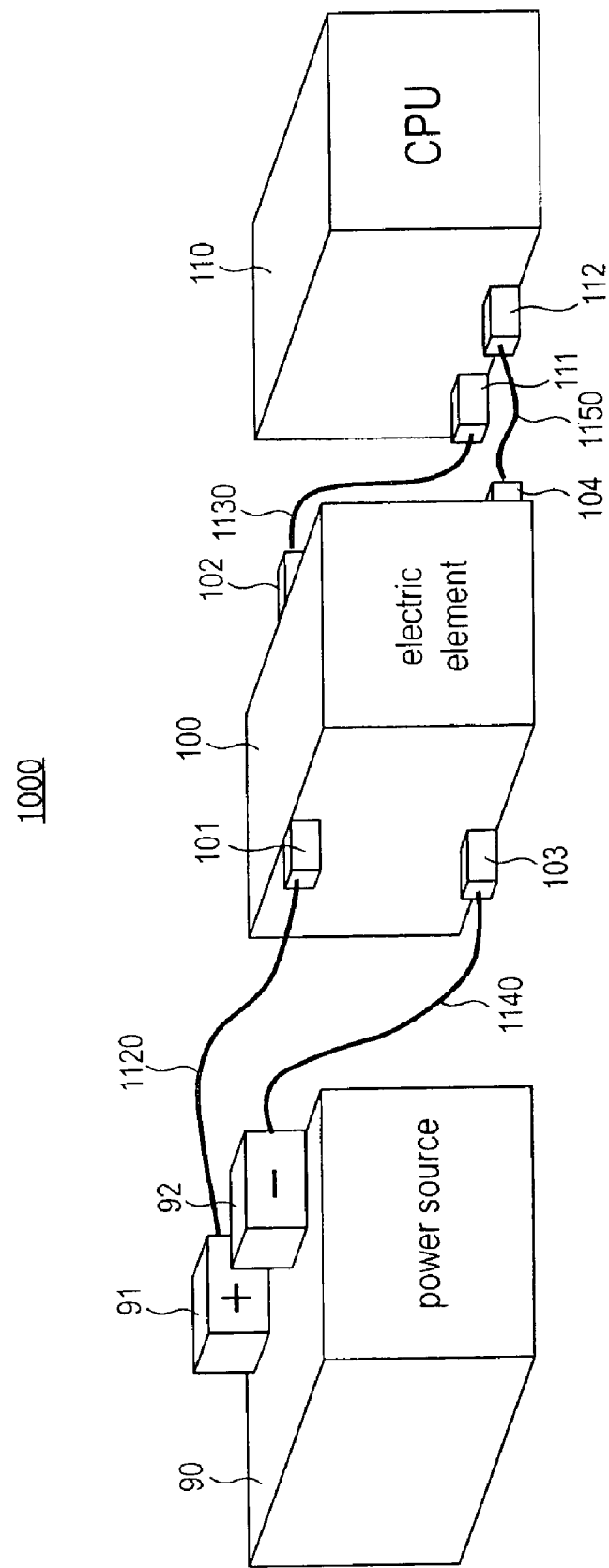
FIG. 31 is a schematic view illustrating the structure of an electric circuit according to the fifth embodiment.

FIG. 31 is a schematic view illustrating the structure of an electric circuit according to the fifth embodiment. Referring to FIG. 31, the electric circuit 1000 of the fifth embodiment comprises a power source 90, an electric element 100, a CPU 110, and transmission lines 1120, 1130, 1140, 1150.

The power source 90 includes a positive terminal 91 and a negative terminal 92. The electric element 100 includes anode electrodes 101, 102 and cathode electrodes 103, 104. The CPU 110 includes a positive terminal 111 and a negative terminal 112.

The transmission line 1120 has one end connected to the positive terminal 91 of the power source 90 and the other end connected to the anode electrode 101 of the electric element 100. The transmission line 1130 has one end connected to the anode electrode 102 and the other end connected to the positive terminal 111 of the CPU 110.

The transmission line 1140 has one end connected to the negative terminal 92 of the power source 90 and the other end connected to the cathode electrode 103 of the electric element 100. The transmission line 1150 has one end connected to the cathode electrode 104 of the electric element 100 and the other end connected to the negative terminal 112 of the CPU 110.

In the electric circuit 1000, overlap parts 20 of conductive plates 11, 12 and conductive plates 21 to 23 of the electric element 100 have length L2 and width W2 which are set so as to hold L2>W2. The electric element 100 functions as a noise filter.

The power source 90 supplies a DC current I from the positive terminal 91 through the transmission line 1120 to the electric element 100, and receives a return current Ir, which is fed from the electric element 100 through the transmission line 1140, at the negative terminal 92.

The electric element 100 receives the DC current I, which is supplied from the power source 90 via the transmission line 1120, at the anode electrode 101, and supplies the received DC current I from the anode electrode 102 through the transmission line 1130 to the CPU 110. The electric element 100 further receives the return current Ir, which is supplied from the CPU 110 through the transmission line 1150, at the cathode electrode 104, and supplies the received return current Ir from the cathode electrode 103 through the transmission line 1140 to the power source 90. In addition, the electric element 100 confines an unwanted high-frequency current transmitted through the transmission lines 1130, 1150 from the CPU 110 within circuitry made up of the electric element 100, transmission lines 1130, 1150 and CPU 110 in the aforementioned manner, thereby preventing the unwanted high-frequency current from leaking toward the power source 90.

The CPU 110 is driven with the DC current I supplied from the electric element 100 and operates at a predetermined frequency. The CPU 110 supplies the return current Ir through the transmission line 1150 to the electric element 100.

In the above-described electric circuit 1000, the electric element 100 supplies the DC current from the power source 90 to the CPU 110, and confines the unwanted high-frequency current produced by the CPU 110 within the circuitry made up of the electric element 100, the transmission lines 1130, 1150 and the CPU 110, thereby preventing leakage of the unwanted high-frequency current toward the power source 90.

Thus, the present invention can prevent the unwanted high-frequency current from leaking toward the power source.

In the fifth embodiment, any one of the electric elements 101, 200, 300, 400, 500, 600, 700 and 800 can be used instead of the electric element 100.

The Sixth Embodiment

Figure 32:
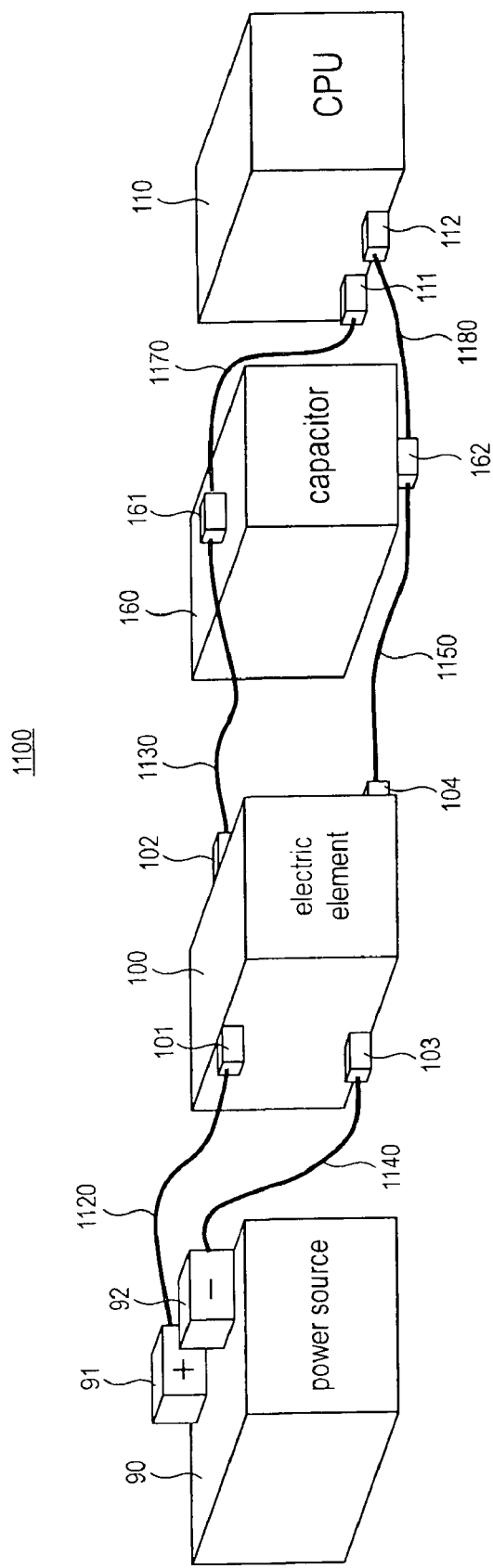
FIG. 32 is a schematic view illustrating the structure of an electric circuit according to the sixth embodiment.

FIG. 32 is a schematic view illustrating the structure of an electric circuit according to the sixth embodiment. Referring to FIG. 32, the electric circuit 1100 of the sixth embodiment comprises a capacitor 160 and transmission lines 1170, 1180 in addition to the components of the electric circuit 1000 shown in FIG. 31. The other components are the same as these of the electric circuit 1000.

The capacitor 160 includes an anode electrode 161 and a cathode electrode 162. In the electric circuit 1100, the transmission line 1130 has the other end connected to the anode electrode 161 of the capacitor 160. The transmission line 1150 has the other end connected to the cathode electrode 162 of the capacitor 160.

The transmission line 1170 has one end connected to the anode electrode 161 of the capacitor 160 and the other end connected to the positive terminal 111 of the CPU 110. The transmission line 1180 has one end connected to the cathode electrode 162 of the capacitor 160 and the other end connected to the negative terminal 112 of the CPU 110.

In the electric circuit 1100, overlap parts 20 of the conductive plates 11, 12 and conductive plates 21 to 23 of the electric element 100 have length L2 and width W2 which are set so as to hold L2>W2. The electric element 100 functions as a noise filter.

The power source 90 supplies a DC current I from the positive terminal 91 via the transmission line 1120 to the electric element 100, and receives a return current Ir, which is supplied from the electric element 100 via the transmission line 1140, at the negative terminal 92.

The electric element 100 receives the DC current I, which is supplied from the power source 90 via the transmission line 1120, at the anode electrode 101, and supplies the received DC current I from the anode electrode 102 via the transmission line 1130 to the capacitor 160. The electric element 100 also receives the return current Ir, which is supplied from the capacitor 160 via the transmission line 1150, at the cathode electrode 104, and supplies the received return current Ir from the cathode electrode 103 via the transmission line 1140 to the power source 90. In addition, the electric element 100 confines an unwanted high-frequency current transmitted from the capacitor 160 via the transmission lines 1130, 1150 within circuitry made up of the electric element 100, transmission lines 1130, 1150, capacitor 160 and CPU 110 in the aforementioned manner, thereby preventing the unwanted high-frequency current from leaking toward the power source 90.

The capacitor 160 stores the DC current supplied from the electric element 100 via the transmission line 1130, and supplies the stored DC current through the transmission line 1170 to the CPU 110. The capacitor 160 also supplies the return current Ir, which is supplied from the CPU 110 via the transmission line 1180, through the transmission line 1150 to the electric element 100.

The CPU 110 is driven with the DC current I supplied from the capacitor 160 and operates at a predetermined frequency. The CPU 110 then supplies the return current Ir to the capacitor 160 via the transmission line 1180.

Figure 33:
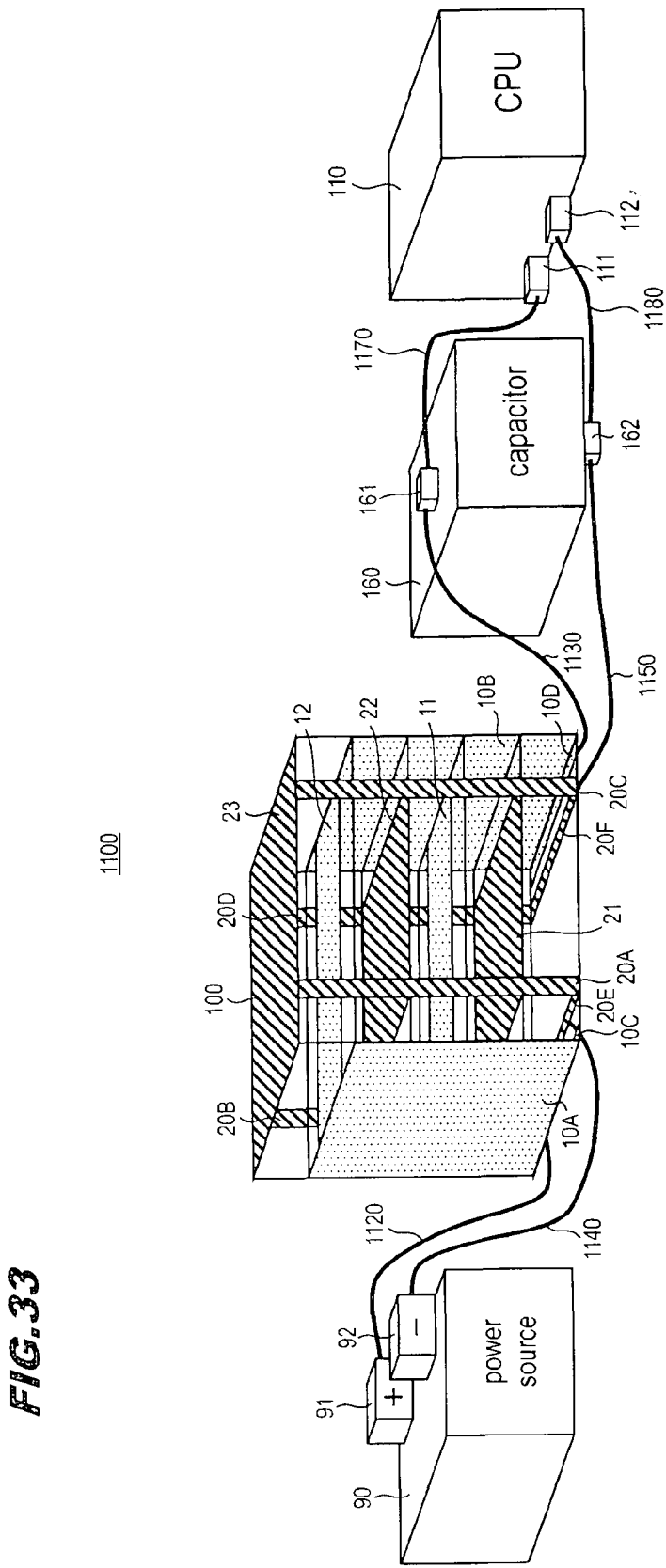
FIG. 33 is a conceptual illustration showing the electric element shown in FIG. 32 in an operating state.

FIG. 33 is a conceptual illustration showing the electric element 100 shown in FIG. 32 in an operating state. Referring to FIG. 33, the electric element 100 includes an anode electrode 10C connected to the transmission line 1120 and an anode electrode 10D connected to the transmission line 1130. The electric element 100 further includes a cathode electrode 20E connected to the transmission line 1140 and a cathode electrode 20F connected to the transmission line 1150.

With this configuration, a DC current I output from the positive terminal 91 of the power source 90 flows through the transmission line 1120 to the anode electrode 10C of the electric element 100 and flows in the electric element 100 in order from the side anode electrode 10A through the conductive plates 11, 12 and side anode electrode 10B to the anode electrode 10D. The DC current I then flows from the anode electrode 10D via the transmission line 1130 and anode electrode 161 to the capacitor 160.

The DC current I is stored in the capacitor 160 in such a way. The capacitor 160 supplies the stored DC current I to the CPU 110. The CPU 110 is driven with the DC current I from the capacitor 160 and outputs a return current Ir equivalent in magnitude to the DC current I. The capacitor 160 supplies the return current Ir, which is supplied from the CPU 110, to the electric element 100 through the transmission line 1150.

The return current Ir then flows through the transmission line 1150 to the cathode electrode 20F of the electric element 100, and flows in the electric element 100 in order from the side cathode electrodes 20C, 20D through the conductive plates 21 to 23 and side cathode electrodes 20A, 20B to the cathode electrode 20E. The return current Ir then flows from the cathode electrode 20E through the transmission line 1140 and negative terminal 92 to the power source 90.

Since the DC current I flows in the conductive plates 11, 12 from the power source 90 side to the CPU 110 side, while the return current Ir flows in the conductive plates 21 to 23 from the CPU 110 side to the power source 90 side in the electric element 100, effective inductance L of the electric element 100 becomes small as discussed above. On the other hand, effective capacitance C of the electric element 100 becomes large due to the four capacitors being connected in parallel in the electric element 100. Thus, the impedance of the electric element 100 is lowered.

The CPU 110 is driven with the DC current I supplied from the power source 90 through the electric element 100 and produces an unwanted high-frequency current. The unwanted high-frequency current is leaked through the transmission lines 1170, 1180 to the capacitor 160 and electric element 100, however, the unwanted high-frequency current flows in circuitry made up of the electric element 100, transmission lines 1130, 1150, capacitor 160, transmission lines 1170, 1180 and CPU 110 because of the low impedance of the electric element 100, thereby preventing the unwanted high-frequency current from leaking from the electric element 100 toward the power source 90.

Under circumstances where the operating frequency of the CPU 110 tends to shift toward high frequencies, it could be assumed that the CPU 110 operates at approximately 1 GHz. Even for such a high operating frequency range, because the impedance of the electric element 100 is determined mainly by the effective inductance L that is decreased as discussed above, the electric element 100 can confine the unwanted high-frequency current produced by the CPU 110 operating at a high operating frequency within the vicinity of the CPU 110. In short, the electric element 100 prevents the leakage of the unwanted high-frequency current toward the power source.

Figure 34:
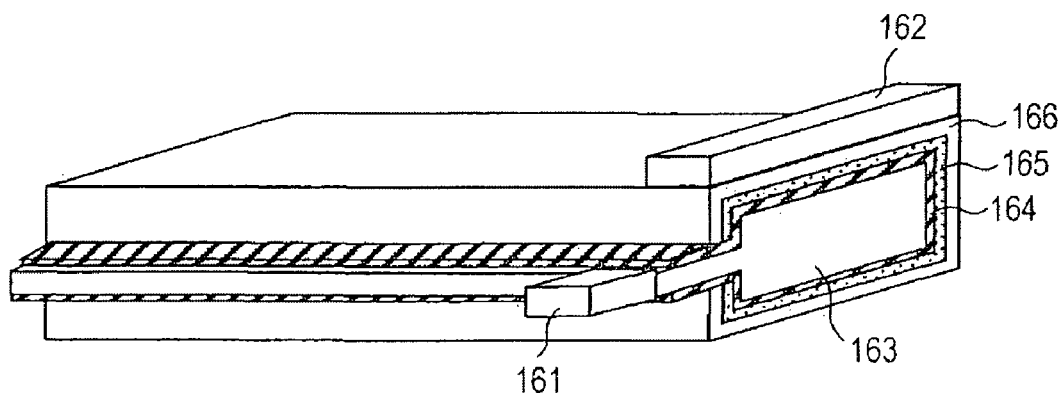
FIG. 34 is a perspective view illustrating the structure of the capacitor shown in FIG. 32.

FIG. 34 is a perspective view illustrating the structure of the capacitor 160 shown in FIG. 32. Referring to FIG. 34, the capacitor 160 includes a tantalum sintered body 163, a dielectric oxide film 164, conductive polymeric layer 165, and a lead layer 166 in addition to the anode electrode 161 and cathode electrode 162. The capacitor 160 in this embodiment has two terminals (i.e. one anode electrode and one cathode electrode), but may have three terminals (i.e. one anode electrode and two cathode electrodes) or four terminals (i.e. two anode electrodes and two cathode electrodes).

The dielectric oxide film 164 covers surfaces of the tantalum sintered body 163. The conductive polymeric layer 165 composed of polypyrrole covers the dielectric oxide film 164. The lead layer 166 including a carbon layer and a silver paint layer covers the conductive polymeric layer 165. The carbon layer is formed so as to make contact with the conductive polymeric layer 165, while the silver paint layer is formed so as to make contact with the carbon layer.

The anode electrode 161 is connected to the tantalum sintered body 163, while the cathode electrode 113 is connected to the lead layer 166. The tantalum sintered body 163 functions as an anode of the capacitor, and the conductive polymeric layer 165 functions as a cathode of the capacitor.

The capacitor having the structure shown in FIG. 34 is referred to as POSCAP (Polymerized Organic Semiconductor Capacitors) and is a chip capacitor using the tantalum sintered body for an anode and the high-conductive polymeric (polypyrrole) layer for a cathode. This capacitor 160 (POSCAP) has a large capacity because the tantalum sintered body is porous.

This capacitor 160 (POSCAP) is fabricated in the following manner. At first, the dielectric oxide film 164 of several hundreds of angstroms is formed on surfaces of the tantalum sintered body 163. Then, polypyrrole is polymerized to coat the dielectric oxide film 164. This provides the conductive polymeric layer 165.

Secondly, the carbon layer and silver paint layer are provided on the conductive polymeric layer 165 (polypyrrole layer). At last, the anode electrode 161 is connected to the tantalum sintered body 163 by resistance welding, and the cathode electrode 162 is connected to the lead layer 166 by silver adhesive. The capacitor 160 is thus completed.

Referring back to FIG. 32, the power source 90 supplies a DC current I through the transmission line 1120 to the electric element 100. The electric element 100 allows the DC current I, which is supplied from the power source 90, to flow from the anode electrode 101 (10C), through the side anode electrode 10A, conductive plates 11, 12, side anode electrode 10B and anode electrode 102 (10D) to the transmission line 1130. Through the transmission line 1130, the DC current I is supplied to the capacitor 160.

The capacitor 160 stores the DC current I supplied from the power source 90 via the electric element 100 and supplies the stored DC current I to the CPU 110 via the transmission line 1170.

The CPU 110 is driven with the DC current I supplied from the capacitor 160 and operates at a predetermined frequency. The CPU 110 feeds a return current Ir of the DC current I through the transmission line 1180 to the capacitor 160. With the operation of the CPU 110, an unwanted high-frequency is generated and leaks through the transmission lines 1170, 1180 toward the capacitor 160.

The capacitor 160 passes the return current Ir, which is supplied from the CPU 110, through the cathode electrode 162, lead layer 166 and conductive polymeric layer 165 to the transmission line 1150 that supplies the return current Ir to the electric element 100.

The electric element 100 passes the return current Ir, which is supplied from the capacitor 160 through the transmission line 1150, via the cathode electrode 104 (20F), side cathode electrodes 20C, 20D, conductive plates 21 to 23, side cathode electrodes 20A, 20B and cathode electrode 103 (20E) to the transmission line 1140 that supplies the return current Ir to the power source 90.

Since the DC current I flows in the conductive plates 11, 12 of the electric element 100 from the power source 90 side to the CPU 110 side, while the return current Ir flows in the conductive plates 21 to 23 of the electric element 100 from the CPU 110 side to the power source 90 side, the effective inductance of the conductive plates 11, 12 becomes smaller than the self-inductance due to the mutual inductance between the conductive plates 11, 12 and the conductive plates 21 to 23 as discussed above. As a result, the impedance of the electric element 100 decreases.

The unwanted high-frequency current leaks from the CPU 110 to the electric element 100 through the path made up of the transmission lines 1170, 1180, capacitor 160 and transmission lines 1130, 1150 and passes within the electric element 100, but does not leak toward the power source 90 through the transmission lines 1120, 1140. In other words, the unwanted high-frequency current leaked from the CPU 110 flows within circuitry made up of the electric element 100, transmission lines 1130, 1150, capacitor 160, transmission lines 1170, 1180 and the CPU 110, without flowing through the transmission lines 1120, 1140 toward the power source 90.

In this manner, the electric element 100 confines the unwanted high-frequency current produced by the CPU 110 within the vicinity of the CPU 110. The capacitor 160 has a high capacity owing to the porous anode. This allows the capacitor 160 to quickly supply the DC current I to the CPU 110 in response to rapid start-up of the CPU 110.

The present invention, as discussed above, realizes the rapid start-up of the CPU 110 by disposing the high-capacity capacitor 160 adjacent to the CPU 110.

Figure 35:
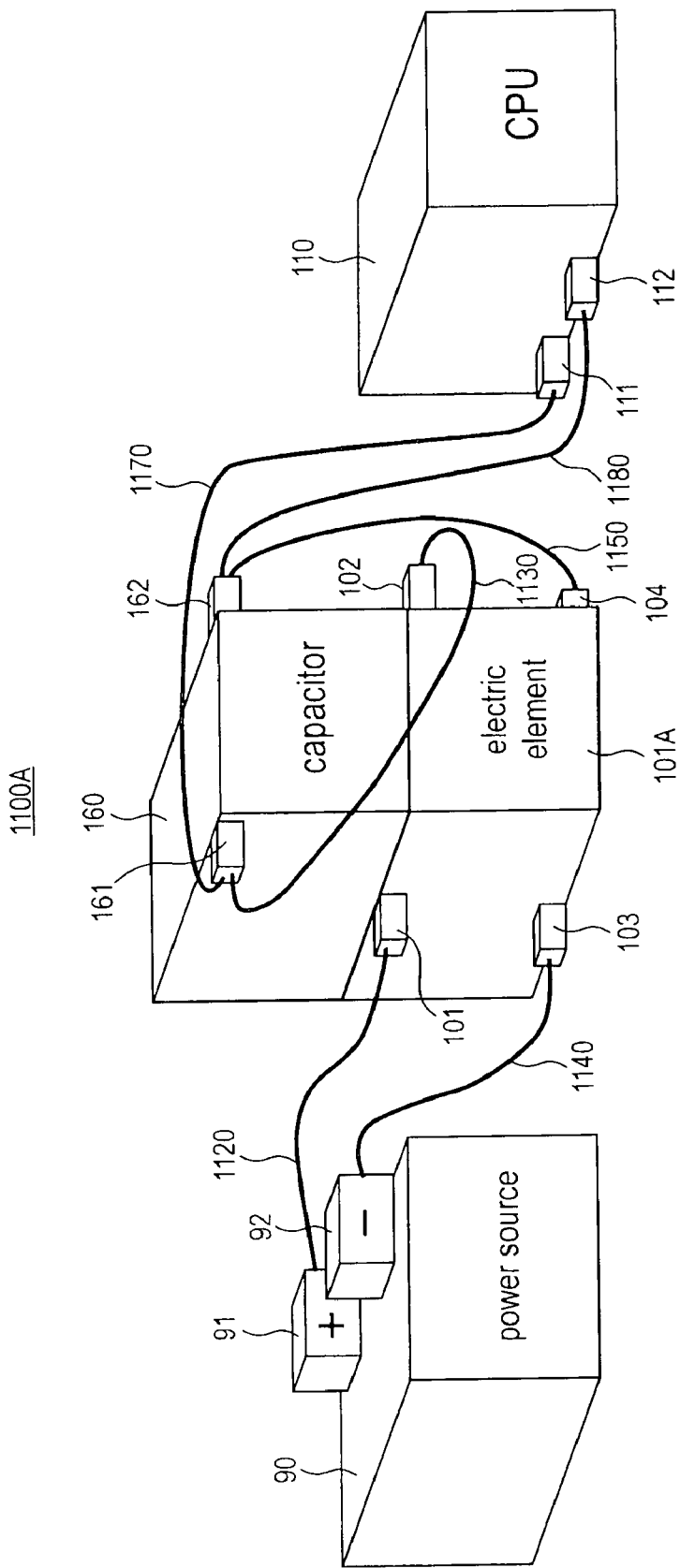
FIG. 35 is an another schematic view illustrating the structure of an electric circuit according to the sixth embodiment.

FIG. 35 is an another schematic view illustrating the structure of an electric circuit according to the sixth embodiment. Referring to FIG. 35, the electric circuit 1100A includes an electric element 101A having a capacitor 160 thereon, instead of the electric element 100 of the electric circuit 1100 shown in FIG. 32. The other components are the same as those of the electric circuit 1100.

Figure 36:
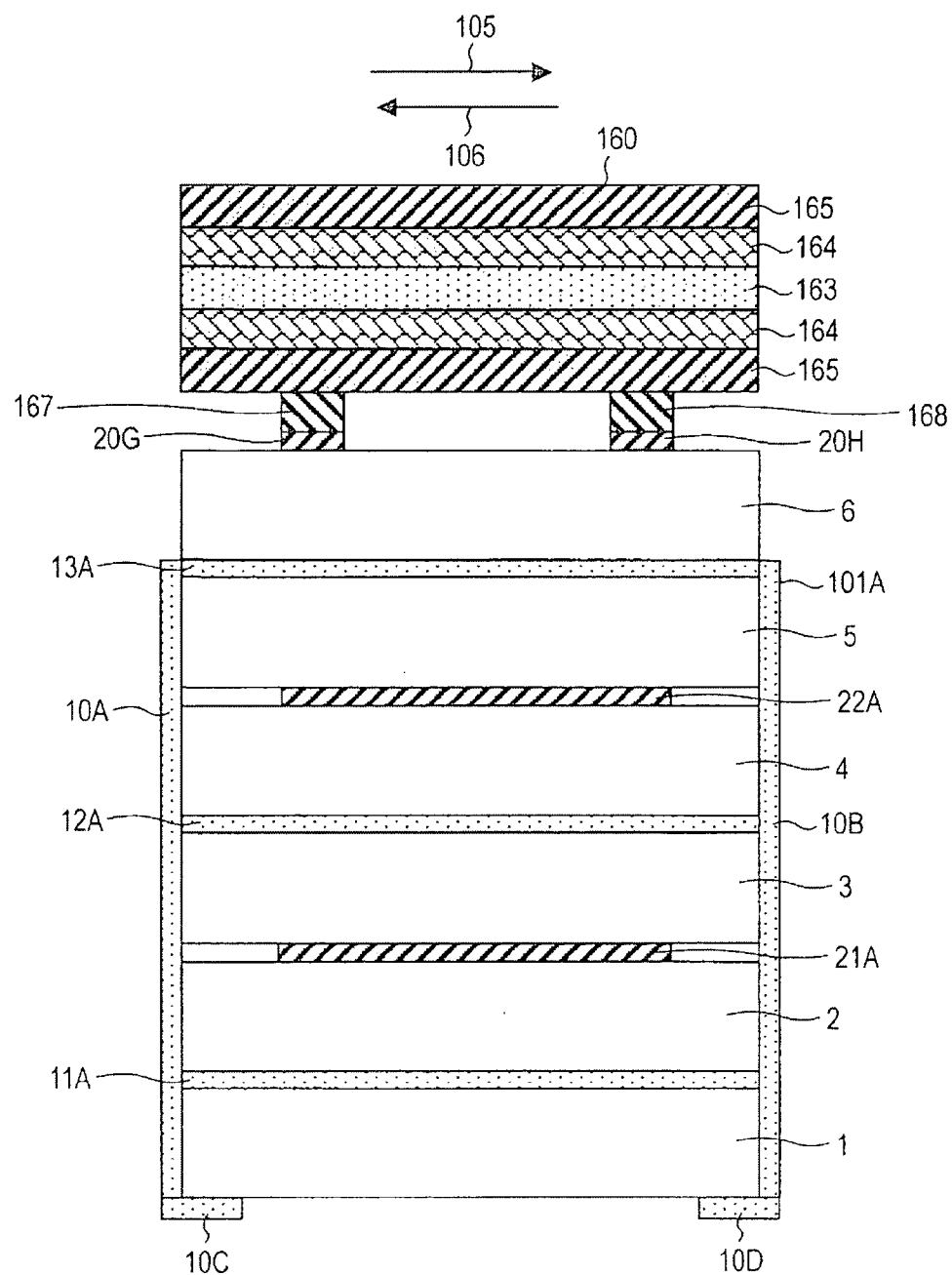
FIG. 36 is a cross-sectional view illustrating the electric element and capacitor shown in FIG. 35.

FIG. 36 is a cross-sectional view of the electric element 101A and capacitor 160 shown in FIG. 35. Referring to FIG.

36, the electric element 101A includes conductive plates 11A, 12A, 13A, 21A, 22A instead of the conductive plates 11, 12, 21 to 23 of the electric element 100 (see FIG. 4), and is added with a dielectric layer 6 and cathode electrodes 20G, 20H. The other components are the same as those of the electric element 100.

Each of the conductive plates 11A, 12A, 13A, 21A, 22A is composed of Ni and has a thickness in a range between 10 μm to 20 μm. Each of the conductive plates 11A, 12A, 13A has the same dimensions as the conductive plates 11, 12, while each of the conductive plates 21A, 22A has the same dimensions as the conductive plates 21 to 23. The dielectric layer 6 is composed of $BaTiO_3$ and has the same dimensions as the dielectric layers 1 to 5.

The conductive plate 11A is placed so as to abut on the dielectric layers 1 and 2, while the conductive plate 21A is placed so as to abut on the dielectric layers 2 and 3. The conductive plate 12A is placed so as to abut on the dielectric layers 3 and 4, while the conductive plate 22A is placed so as to abut on the dielectric layers 4 and 5. The conductive plate 13A is placed so as to abut on the dielectric layers 5 and 6, while the dielectric layer 6 is placed so as to abut on the conductive plate 13A.

The side anode electrode 10A is connected to one end of the conductive plates 11A, 12A, 13A, while the side anode electrode 10B is connected to the other end of the conductive plates 11A, 12A, 13A.

Although it is not shown in FIG. 36, the side cathode electrodes 20A, 20B, 20C, 20D are connected to the conductive plates 21A, 22A. The cathode electrodes 20G, 20H are connected to the side cathode electrodes 20A, 20C, respectively.

In the capacitor 160, a conductive polymeric layer 165, dielectric oxide film 164, tantalum sintered body 163, dielectric oxide film 164 and conductive polymeric layer 165 are sequentially disposed in this order from the closer side to the conductive plate 13A of the electric element 101A. It is noted that the lead layer 166 of the capacitor 160 is omitted. Conductors 167, 168 are connected, through the lead layer 166, with the conductive polymeric layer 165 which is a cathode. In the structure in which the capacitor 160 is mounted on the electric element 101A, the conductors 167, 168 are disposed on cathode electrodes 20G, 20H, respectively, of the electric element 101A. The cathode (i.e. conductive polymeric layer 165) of the capacitor 160 is thus connected to the cathode electrodes 20E, 20F of the electric element 101A. Therefore, the conductors 167, 168 constitute the transmission line 1150 shown in FIG. 35.

In the electric element 101A, a DC current I supplied from the power source 90 flows in the anode electrode 10C, side anode electrode 10A, conductive plates 11A, 12A, 13A, side anode electrode 10B and anode electrode 10D in this order. In short, the DC current I flows through the conductive plates 11A, 12A, 13A in the direction of arrow 105.

Alternatively, a return current Ir supplied from the capacitor 160 flows in the cathode electrode 20F, side cathode electrodes 20C, 20D, conductive plates 21A, 22A, side cathode electrodes 20A, 20B and cathode electrode 20E in this order. In short, the return current Ir flows in the conductive plates 21A, 22A in the direction of arrow 106.

In the capacitor 160, the DC current I supplied from the electric element 101A flows in the tantalum sintered body 163 (anode) in the direction of arrow 105, while the return current Ir supplied from the CPU 110 flows in the conductive polymeric layer 165 (cathode) in the direction of arrow 106.

For this configuration, the effective inductance of the conductive plates 11A, 12A becomes smaller than their self-inductance under the influence of the mutual inductance generated by the return current Ir passing within the electric element 101A. The effective inductance of the conductive plate 13A also becomes smaller than its self-inductance under the influence of the mutual inductance generated by the return current Ir flowing in the conductive plate 22A of the electric element 101A and the return current Ir flowing in the conductive polymeric layer 165 (cathode) of the capacitor 160. As a result, the impedance of the electric element 101A is lowered.

As discussed above, the effective inductance of the electric element 101A decreases with the mutual inductance derived from the return current Ir flowing in the electric element 101A and the mutual inductance derived from the return current Ir flowing in the capacitor 160, and consequently the impedance is lowered.

Thus, the electric element 101A can obtain the lower impedance than the electric element 100. The electric element 101A, therefore, can confine further the unwanted high-frequency current produced by the CPU 110 within the vicinity of the CPU 110. In other words, the electric element 101A can prevent still more leakage of the unwanted high-frequency current toward the power source 90.

As discussed above, the electric circuit 1100A is characterized in that the capacitor 160 is mounted on the electric element 101A and the conductive plate 13A (conductive plate where the DC current I flows) is placed at the closest position to the capacitor 160. This characteristic feature enables the electric element 101A, as discussed above, to make its impedance lower than that of the electric element 100; consequently, the unwanted high-frequency current produced by the CPU 110 can be further confined within the vicinity of the CPU. The placement of the capacitor 160 on the electric element 101A can also reduce the area for mounting both on a board.

In the above embodiment, the conductive plate 13A, in which the DC current I passes, of the electric element 101A is arranged at the closest position to the capacitor 160, because the capacitor 160 has the conductive polymeric layer 165, in which the return current Ir flows, arranged at the closest position to the electric element 101A. However, if the capacitor 160 has an electrode, in which the DC current I passes, placed at the closest position to the electric element 101A, the conductive plate 22A, in which the return current Ir flows, of the electric element 101A should be disposed at the closest position to the capacitor 160.

Of two direct currents flowing at the closest position in the electric element 101A with respect to the capacitor 160 and flowing at the closest position in the capacitor 160 with respect to the electric element 101A in the electric circuit 1100A, either one should be the DC current I and the other should be the return current Ir. The conductive plate, to be placed closest to the capacitor 160, in the electric element 101A is thus determined to satisfy the above condition. Specifically, the conductive plate, to be placed at the closest position to the capacitor 160, of the electric element 101A passes a current in the opposite direction to a current flowing in the conductive plate, to be placed at the closest position to the electric element 101A, of the capacitor 160.

Although all the dielectric layers 1 to 6 are composed of the same dielectric material ($BaTiO_3$) in the above embodiment, the present invention is not limited to this. The dielectric layers 1 to 6 can be composed of different dielectric materials on an individual basis. Alternatively, the dielectric layers 1 to 6 can be put into two groups each composed of the same material, but the materials are different to each other. Typically the dielectric layers 1 to 6 may be composed of one or more kinds of dielectric materials. Any dielectric material for forming the dielectric layers 1 to 6 preferably has the relative permittivities of 3000 or more.

In addition to $BaTiO_3$, the dielectric layers may be composed of $Ba(Ti,Sn)O_3$, $Bi_4Ti_3O_{12}$, $(Ba, Sr, Ca)TiO_3$, $(Ba, Ca)(Zr, Ti)O_3$, $(Ba, Sr, Ca)(Zr, Ti)O_3$, $SrTiO_3$, $CaTiO_3$, $PbTiO_3$, $Pb(Zn, Nb)O_3$, $Pb(Fe, W)O_3$, $Pb(Fe, Nb)O_3$, $Pb(Mg, Nb)O_3$, $Pb(Ni, W)O_3$, $Pb(Mg, W)O_3$, $Pb(Zr, Ti)O_3$, $Pb(Li, Fe, W)O_3$, $Pb_5Ge_3O_{11}$, $CaZrO_3$, or the like.

Figure 37:
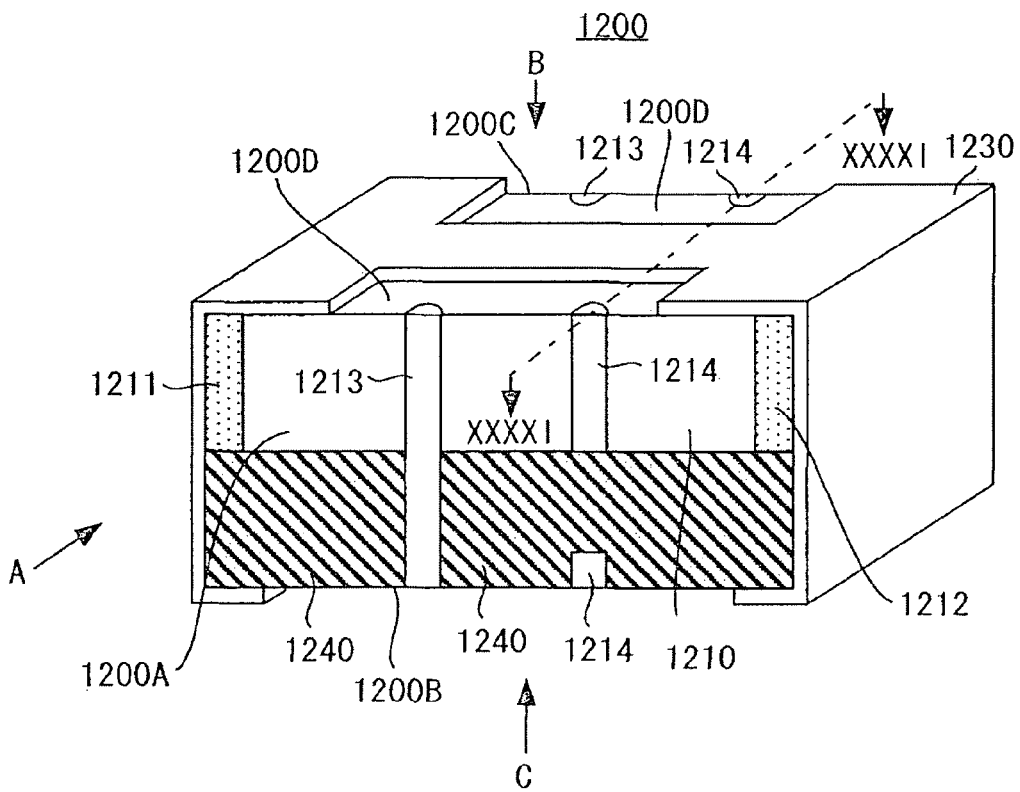
FIG. 37 is a perspective view illustrating an exemplary electric circuit according to the sixth embodiment.
Figure 38:
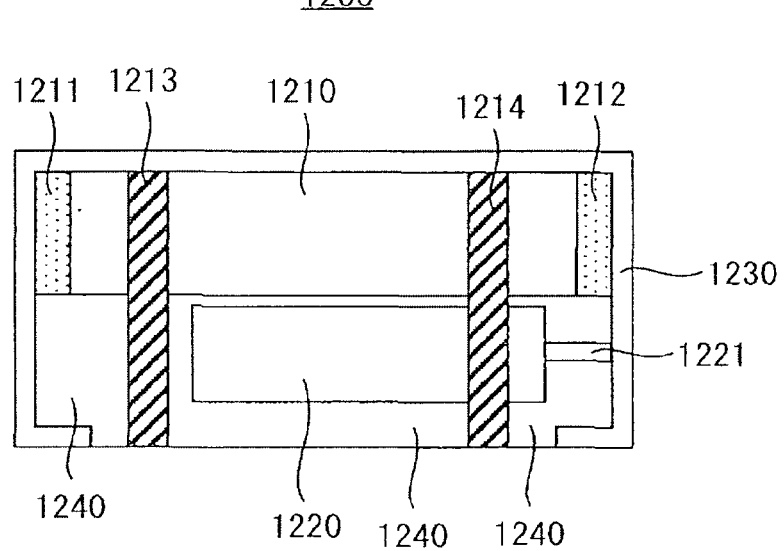
FIG. 38 is a plan view of the electric circuit viewed from direction A in FIG. 37.
Figure 39:
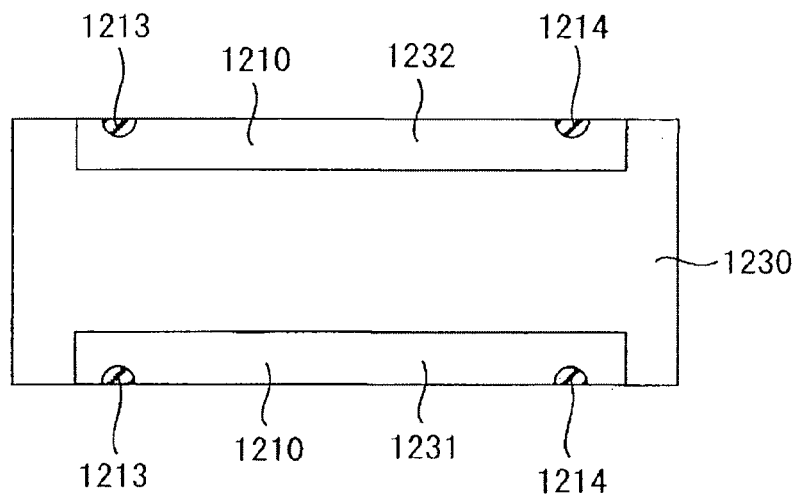
FIG. 39 is a plan view of the electric circuit viewed from direction B in FIG. 37.
Figure 40:
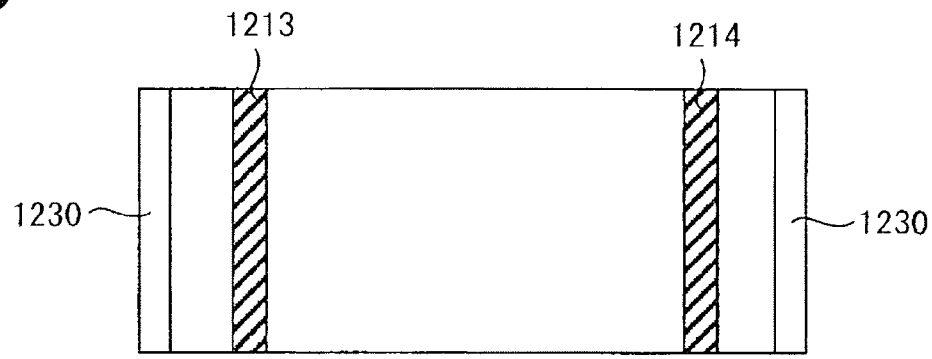
FIG. 40 is a plan view of the electric circuit viewed from direction C in FIG. 37.
Figure 41:
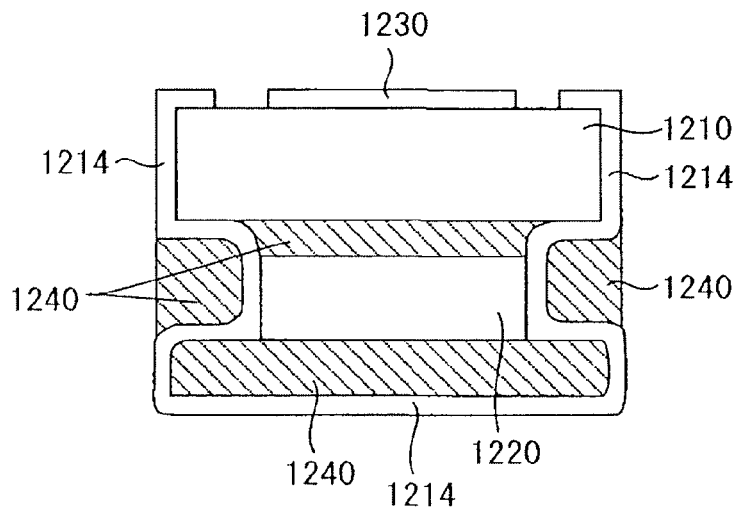
FIG. 41 is a cross-sectional view of the electric circuit taken along line XXXXI-XXXXI in FIG. 37.

FIG. 37 is a perspective view illustrating an exemplary electric circuit according to the sixth embodiment. FIG. 38 is a plan view of the electric circuit viewed from direction A of FIG. 37. FIG. 39 is a plan view of the electric circuit viewed from direction B of FIG. 37. FIG. 40 is a plan view of the electric circuit viewed from direction C of FIG. 37. FIG. 41 is a cross-sectional view of the electric circuit taken along lines XXXXI-XXXXI of FIG. 37.

Referring to FIGS. 37 and 38, the electric circuit 1200 comprises an electric element 1210, a capacitor 1220, a copper plate 1230, and resin 1240. The electric element 1210 has the same structure as the electric element 101 shown in FIG. 10, and includes anode electrodes 1211, 1212 and cathode electrodes 1213, 1214. The anode electrodes 1211, 1212 are connected to the copper plate 1230. The electric element 1210 is mounted on the capacitor 1220.

The capacitor 1220 has the same structure as the capacitor 160 shown in FIG. 34 and includes an anode electrode 1221. The anode electrode 1221 is connected to the copper plate 1230.

The cathode electrodes 1213, 1214 of the electric element 1210 are disposed on the front face 1200A, bottom face 1200B, rear face 1200C and top face 1200D of the electric circuit 1200. A cathode electrode (not shown) of the capacitor 1220 is connected to the cathode electrode 1214 of the electric element 1210.

The resin 1240 seals around the capacitor 1220 and a part of the cathode electrode 1214. The copper plate 1230 is shaped like a rectangle without one side in cross section and surrounds the electric element 1210, capacitor 1220 and resin 1240.

The copper plate 1230 has cut-away sections 1231, 1232. The cathode electrodes 1213, 1214 are partially disposed on the top face of the electric element 1210 and within the area where the cut-away sections 1231, 1232 of the copper plate 1230 are located (see FIG. 39).

The copper plate 1230 is arranged on opposite sides of the bottom face of the electric circuit 1200. The cathode electrodes 1213, 1214 are placed on the inside of the copper plates arranged on the opposite sides (see FIG. 40).

The cathode electrode 1214 is formed along the electric element 1210 but inwardly curved in an area in which the capacitor 1220 is placed. The curved parts of the cathode electrode 1214 make a connection with the cathode electrode of the capacitor 1220. The resin 1240 fills interstices between the electric element 1210 and capacitor 1220, under the capacitor 1220, and the inside of the curved parts of the cathode electrode 1214 (see FIG. 41).

The electric circuit 1200 is disposed between the power source 90 and CPU 110 and performs the same functions as the aforementioned electric circuit 1100A. Such an electric circuit 1200 has an anode electrode 1211 and a cathode electrode 1213 connected to the power source 90, and anode electrodes 1212, 1221 and a cathode electrode 1214 connected to the CPU 110.

Thus, the electric circuit 1200 allows the capacitor 1220 to store a power source current supplied from the power source 90 and to supply the stored electrical current to the CPU 110. The electric circuit 1200 concurrently prevents the unwanted high-frequency current produced by the CPU 110 from leaking toward the power source 90.

The above-discussed electric circuit according to the sixth embodiment comprises the capacitor arranged between the power source and electric element and the electric element arranged between the capacitor and CPU and having low impedance. Because of this configuration, the electric circuit can store electric currents supplied from the power source and supply it to the CPU as confining the unwanted high-frequency current produced by the CPU within circuitry made up of the electric element and CPU.

Accordingly, the present invention can prevent the leakage of the unwanted high-frequency current toward the power source, and also rapidly start up an electrical load circuit.

The electric circuit 1100 according to the sixth embodiment can use any one of the electric elements 101, 200, 300, 400, 500, 600, 700 and 800 instead of the electric element 100.

The electric circuit 1200 according to the sixth embodiment can use any one of the electric elements 100, 200, 300, 400, 500, 600, 700 and 800 instead of the electric element 101.

The Seventh Embodiment

Figure 42:
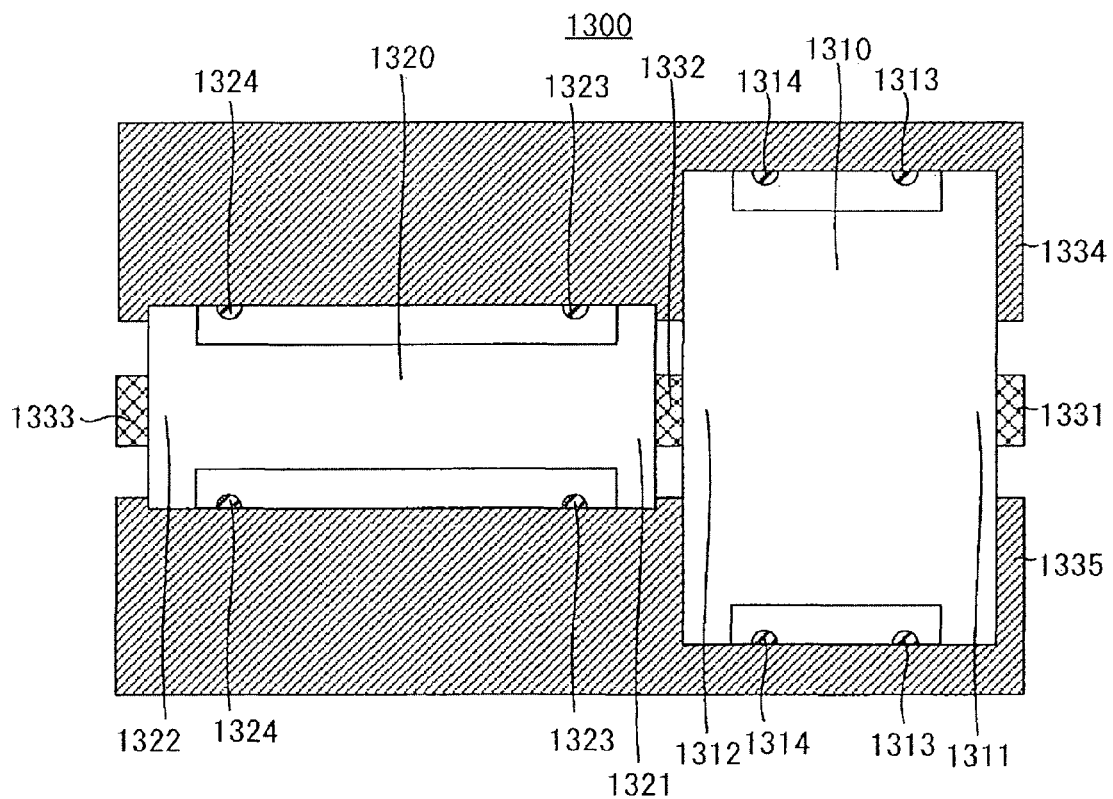
FIG. 42 is a schematic view illustrating the structure of the electric circuit according to the seventh embodiment.

FIG. 42 is a schematic view of the structure of the electric circuit according to the seventh embodiment. Referring to FIG. 42, the electric circuit 1300 of the seventh embodiment comprises electric elements 1310, 1320. Both electric elements 1310, 1320 have the same structure as the electric element 101 shown in FIG. 10. The electric element 1310 includes anode electrodes 1311, 1312 and cathode electrodes 1313, 1314. The electric element 1320 includes anode electrodes 1321, 1322 and cathode electrodes 1323, 1324.

In the electric element 1310, overlap parts 20 of the conductive plates 11, 12 and conductive plates 21, 22 have length L2 and width W2 so set as to hold W2≧L2. In the electric element 1320, overlap parts 20 of the conductive plates 11, 12 and conductive plates 21, 22 have length L2 and width W2 so set as to hold L2>W2. Thus, the electric element 1310 functions as a capacitor, on the other hand, the electric element 1320 functions as a noise filter.

Figure 43:
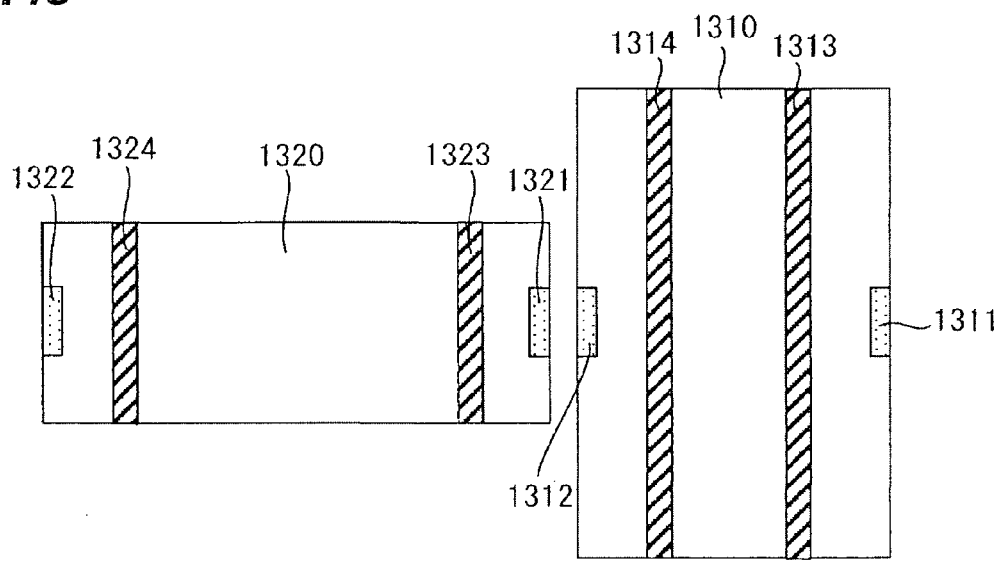
FIG. 43 is a bottom view illustrating the electric element shown in FIG. 42.

FIG. 43 is a bottom view illustrating the electric elements 1310, 1320 shown in FIG. 42. Referring to FIG. 43, the anode electrodes 1311, 1312 are disposed on one side and the other side, respectively, both opposed to each other, of the electric element 1310 in the longitudinal direction, while the cathode electrodes 1313, 1314 are disposed on the inside of the anode electrodes 1311, 1312. Specifically, the cathode electrode 1313 is disposed closer to the anode electrode 1311 than the midpoint between the anode electrodes 1311 and 1312, while the cathode electrode 1314 is disposed closer to the anode electrode 1312 than the midpoint.

The anode electrodes 1321, 1322 are disposed on one side and the other side, respectively, both opposed to each other, of the electric element 1320 in the longitudinal direction, while the cathode electrodes 1323, 1324 are disposed on the inside of the anode electrodes 1321, 1322. Specifically, the cathode electrode 1323 is disposed closer to the anode electrode 1321 than the midpoint between the two anode electrodes 1321, 1322, while the cathode electrode 1324 is disposed closer to the anode electrode 1322 than the midpoint.

Figure 44:
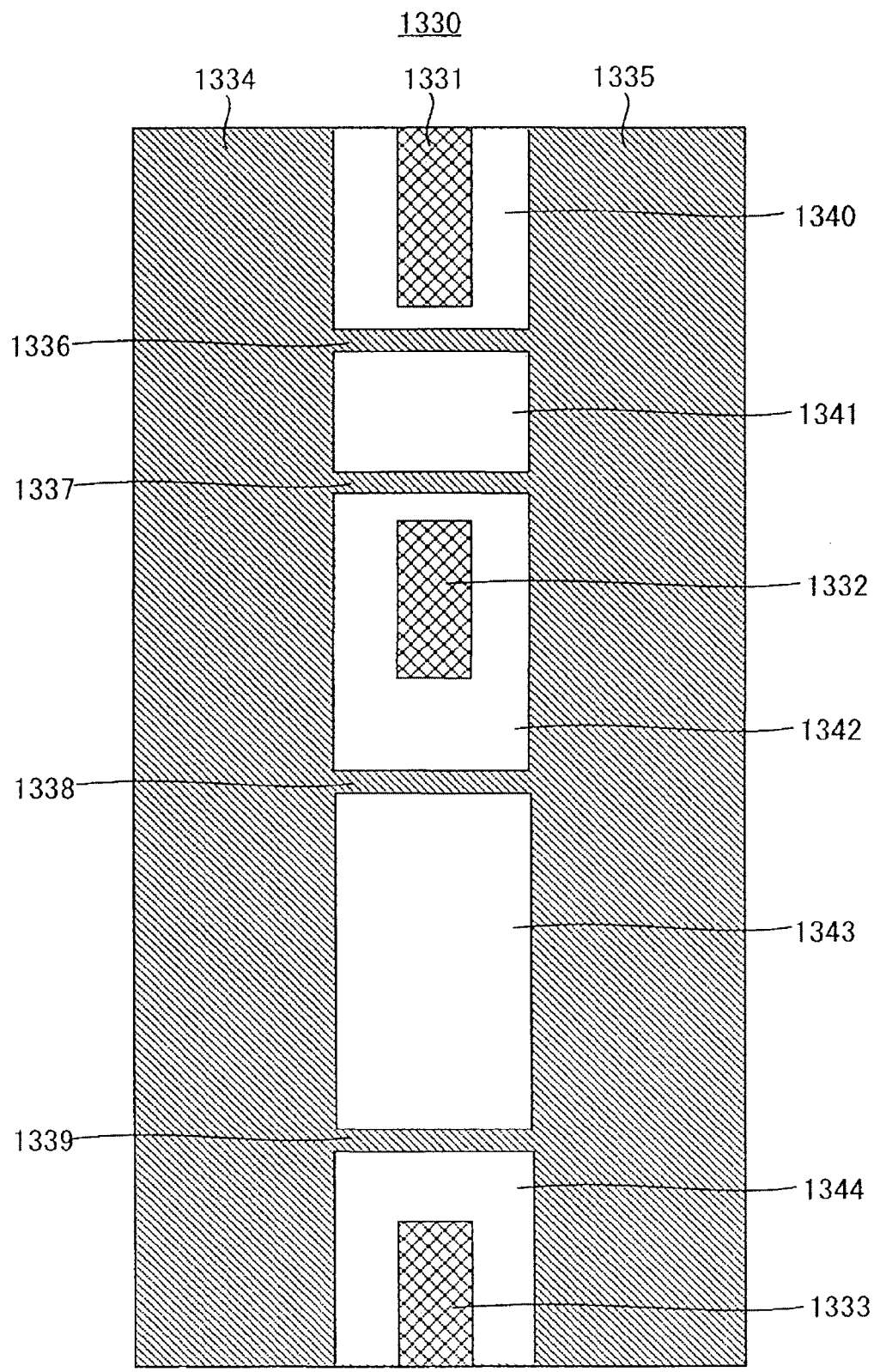
FIG. 44 is a plan view illustrating a board on which the electric circuit shown in FIG. 42 is mounted.

FIG. 44 is a plan view illustrating a board on which the electric circuit 1300 shown in FIG. 42 is mounted. Referring to FIG. 44, the board 1330 has anode sections 1331 to 1333, grounding sections 1334 to 1339, cut-away sections 1340 to 1344. The anode sections 1331 to 1333 and grounding sections 1334 to 1339 are formed by forming cut-away sections 1340 to 1344 in a conductor formed on the printed board.

The anode sections 1331, 1332, 1333 are formed in the cut-away sections 1340, 1342, 1344, respectively. The grounding section 1336 is formed between the cut-away sections 1340 and 1341 and connected to the two grounding sections 1334, 1335. The grounding section 1337 is formed between the cut-away sections 1341 and 1342 and connected to the two grounding sections 1334, 1335. The grounding section 1338 is formed between the cut-away sections 1342 and 1343 and connected to the two grounding sections 1334, 1335. The grounding section 1339 is formed between the cut-away sections 1343 and 1344 and connected to the two grounding sections 1334, 1335.

Referring to FIGS. 42 to 44, the anode electrode 1311 of the electric element 1310 is placed on the anode section 1331. The anode electrode 1312 is placed on the anode section 1332. The cathode electrode 1313 is placed on the grounding sections 1334, 1336, 1335. The cathode electrode 1314 is placed on the grounding sections 1334, 1337, 1335.

The anode electrode 1321 of the electric element 1320 is placed on the anode section 1332. The anode electrode 1322 is placed on the anode section 1333. The cathode electrode 1323 is placed on the grounding sections 1334, 1338, 1335. The cathode electrode 1324 is placed on the grounding sections 1334, 1339, 1335.

This configuration allows the anode electrode 1312 of the electric element 1310 to be electrically connected to the anode electrode 1321 of the electric element 1320 through the anode section 1332, while allowing the cathode electrodes 1313, 1314 of the electric element 1310 to be electrically connected to the cathode electrodes 1323, 1324 of the electric element 1320 through the grounding sections 1334, 1335.

The electric circuit 1300 is used between the power source 90 and CPU 110 and connected to the power source 90 on the anode section 1331 side, and to the CPU 110 on the anode section 1333 side. Consequently, the electric element 1310 functioning as a capacitor is disposed near the power source 90, while the electric element 1320 functioning as a noise filter is disposed near the CPU 110.

Once the electric circuit 1300 is supplied with a power source current from the power source 90, the power source current is stored in the electric element 1310 (i.e. capacitor) and then supplied to the CPU 110 through the electric element 1320 (i.e. noise filter). At the same time, the electric circuit 1300 confines the unwanted high-frequency current produced by the CPU 110 within circuitry made up of the CPU 110 and electric element 1320 (i.e. noise filter).

Accordingly, the present invention can prevent the leakage of the unwanted high-frequency current toward the power source and rapidly start up the electrical load circuit.

The electric circuit 1300 according to the seventh embodiment can use any one of electric elements 100, 200, 300, 400, 500, 600, 700 and 800 instead of the electric element 101.

Figure 45:
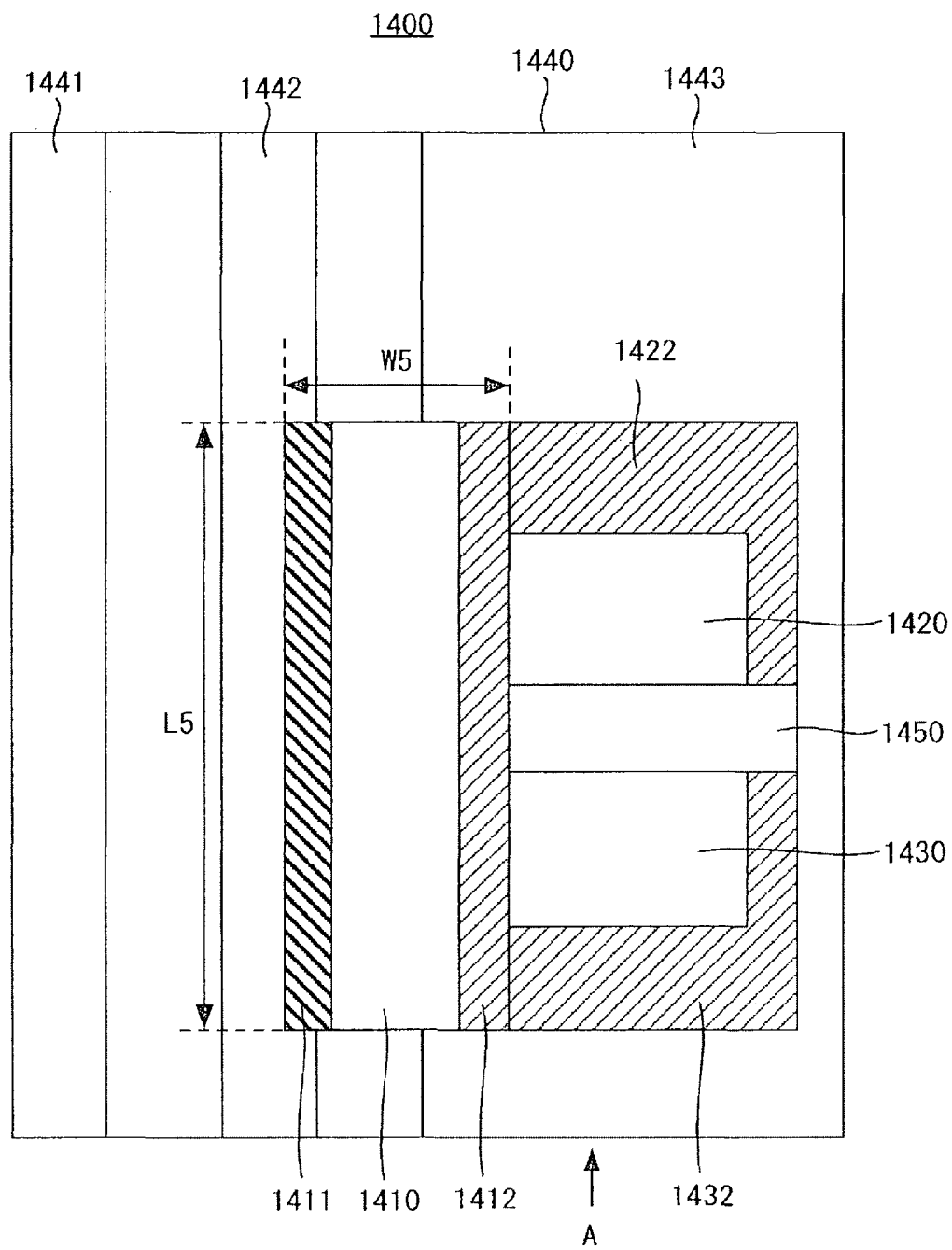
FIG. 45 is a schematic view illustrating the structure of the other electric circuits according to the seventh embodiment.

FIG. 45 is a schematic view illustrating the structure of the other electric circuit according to the seventh embodiment. The electric circuit according to the seventh embodiment can be replaced with this electric circuit 1400 shown in FIG. 45. Referring to FIG. 45, the electric circuit 1400 comprises electric elements 1410, 1420, 1430. The electric element 1410 includes an anode electrode 1411 and a cathode electrode 1412, each connected to one of conductive plates (not shown) which are opposed to each other. The two conductive plates of the electric element 1410 have length L5 and width W5 (<L5) each. The electric element 1410 has an approximately rectangular plane and functions as a noise filter. The board 1440 includes grounding sections 1441, 1443 and an anode section 1442.

Figure 46:
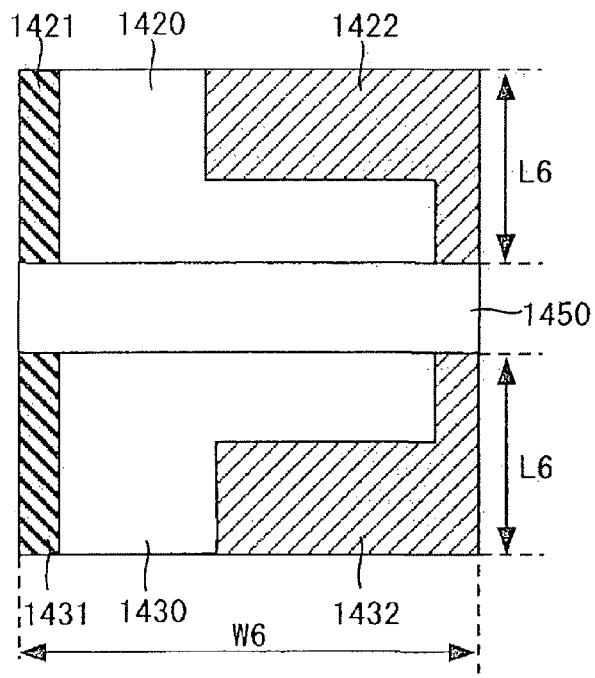
FIG. 46 is a plan view of the two electric elements shown in FIG. 45.

FIG. 46 is a plan view of the two electric elements 1420, 1430 shown in FIG. 45. Referring to FIG. 46, the electric element 1420 includes an anode electrode 1421 and a cathode electrode 1422, each connected to one of conductive plates (not shown) which are opposed to each other. The two conductive plates of the electric element 1420 have length L6 and width W6 (L6). The electric element 1430 includes an anode electrode 1431 and a cathode electrode 1432, each connected to one of the conductive plates (not shown) which are opposed to each other. The two conductive plates of the electric element 1430 have approximately the same dimensions as the two conductive plates of the electric element 1420. Accordingly, the electric elements 1420, 1430 have approximately rectangular planes and function as a capacitor.

In the case where the two electric elements 1420, 1430 are mounted on the board 1440, the anode electrode 1421 of the electric element 1420 and the anode electrode 1431 of the electric element 1430 are arranged on the anode section 1442, while the cathode electrode 1422 of the electric element 1420 and the cathode electrode 1432 of the electric element 1430 are arranged on the grounding section 1443. Between the electric elements 1420 and 1430, a space 1450 is formed.

The electric element 1410 is placed on the two electric elements 1420, 1430 which are mounted on the board 1440. In this configuration, the anode electrode 1411 of the electric element 1410 is arranged on the anode electrode 1421 of the electric element 1420 and the anode electrode 1431 of the electric element 1430, while the cathode electrode 1412 of the electric element 1410 is arranged on the cathode electrode 1422 of the electric element 1420 and the cathode electrode 1432 of the electric element 1430. This configuration allows the anode electrode 1411 of the electric element 1410 to be connected to the anode electrode 1421 of the electric element 1420 and the anode electrode 1431 of the electric element 1430, while allowing the cathode electrode 1412 of the electric element 1410 to be connected to the cathode electrode 1422 of the electric element 1420 and the cathode electrode 1432 of the electric element 1430.

Figure 47:
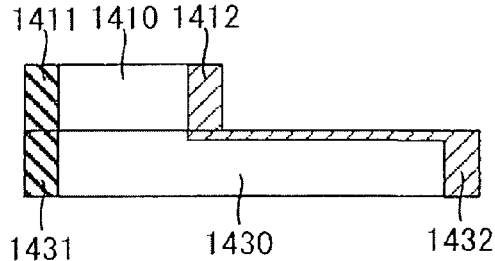
FIG. 47 is a side view of the electric circuit shown in FIG. 45 viewed from direction A.
Figure 48:
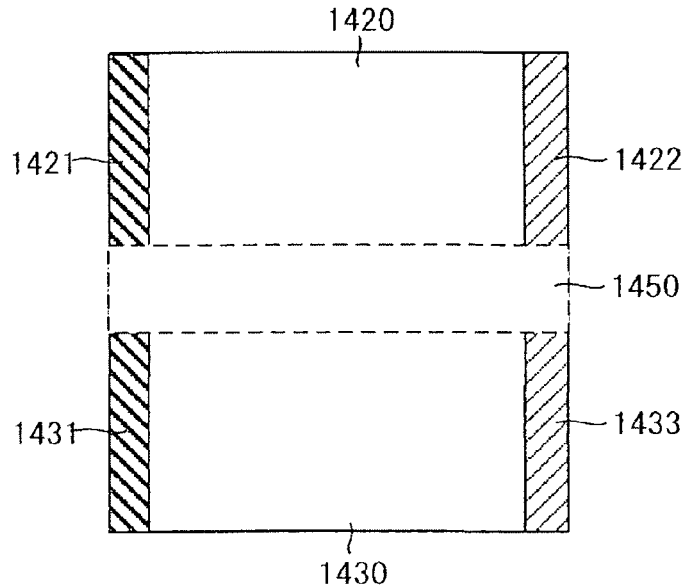
FIG. 48 is a bottom view of the electric circuit shown in FIG. 45.

FIG. 47 is a side view of the electric circuit 1400 shown in FIG. 45 viewed from direction A. FIG. 48 is a bottom view of the electric circuit 1400 shown in FIG. 45. The electric element 1410 is mounted on the electric element 1430 and has the anode electrode 1411 connected to the anode electrode 1431 of the electric element 1430 and the cathode electrode 1412 connected to the cathode electrode 1432 of the electric element 1430 (see FIG. 47). The two electric elements 1420, 1430 are disposed with space 1450 therebetween (see FIG. 48).

The electric circuit 1400 is used between the power source 90 and CPU 110. The anode electrodes 1421, 1431 and cathode electrodes 1422, 1432 of the electric elements 1420, 1430 are connected to the power source 90, while the anode electrode 1411 and cathode electrode 1412 of the electric element 1410 are connected to the CPU 110.

Once the electric circuit 1400 is supplied with a power source current from the power source 90, the power source current is stored in the electric elements 1420, 1430 (i.e. capacitor) and supplied through the electric element 1410 (i.e. noise filter) to the CPU 110. At the same time, the electric circuit 1400 confines the unwanted high-frequency current produced by the CPU 110 within circuitry made up of the CPU 110 and electric element 1410 (noise filter).

According to the present invention, the use of the electric element 1410 having two terminals and the electric elements 1420, 1430 each having two terminals can prevent the unwanted high-frequency current from leaking toward the power source and allows the electrical load circuit to rapidly start up.

The electric circuit 1400 can properly work without either of the electric element 1420 or 1403. The provision of the two electric elements 1420, 1430 functioning as capacitors is for mounting the electric element 1410 with stability. The electric circuit capable of preventing the unwanted high-frequency current from leaking toward the power source and supplying the electric current to the electrical load circuit can be fully achieved with the electric element 1410 and any one of the electric elements 1420 and 1403.

In the present invention, the conductive plates 11, 12 constitute "a first conductor", while the conductive plates 21 to 23 constitute "a second conductor".

The conductive wires 501 to 503 constitute "a first conductor", while the conductive wires 511, 512 constitute "a second conductor".

The conductive wires 601 to 603 constitute "a first conductor", the conductive wires 611 to 613 constitute "a second conductor".

The CPU 110 is "an electrical load circuit".

The side face 100A is "a first side face", side face 100B is "a second side face", the front face 100D is "a third side face", and the rear face 100E is "a fourth side face".

In the present invention, the conductive plates 11, 12, 21 to 23, 201, 202, 301, 302, 311, 312, 401, 402, 411, 412 can be typically composed of metallic materials containing nickel as a main material. The dielectric layers 1 to 6 can be typically composed of ceramics containing $BaTiO_3$ as a main material.

In the present invention, the conductive plates 11, 12, 21 to 23, 201, 202, 301, 302, 311, 312, 401, 402, 411, 412 are equivalent to conductive layers.

It should be understood that the embodiments disclosed herein are to be taken as examples and are not limited. The scope of the present invention is defined not by the above described embodiments but by the following claims. All changes that fall within meets and bounds of the claims, or equivalence of such meets and bounds are intended to be embraced by the claims.

What is claimed is:

1. An electric element disposed between a power source and an electrical load circuit operating with an electric current from said power source, comprising:
    a first conductor through which a first current flows from the power source side to the electrical load circuit side; and
    a second conductor through which a second current flows from the electrical load circuit side to the power source side; said second current being a return current of said first current, wherein
    said first conductor comprises n-number (n is a positive integer) of first conductive layers, each in the form of a flat plate,
    said second conductor comprises m-number (m is a positive integer) of second conductive layers, each in the form of a flat plate, opposed to said first conductive layer,
    said n-number of first conductive layers and said m-number of second conductive layers are alternately stacked,
    no conductive layer exists on an overlap area between the adjoining first conductive layer and the second conductive layer,
    said first current flows in the opposite direction to said second current and does not flow in the same direction as said second current,
    said second current flows from one end side of said second conductive layer to the other end side opposing to the one end side on the whole of a region, which corresponds to said overlap area, of said second conductive layer, and
    said first conductor has a smaller inductance than its self-inductance when said first and second currents pass through said first and second conductors, respectively.

2. The electric element according to claim 1, further comprising:
    dielectric layers each disposed between said first conductive layer and said second conductive layer, wherein
    each of said n-number of first conductive layers passes said first current that is a power source current, and is sandwiched between two of said second conductive layers connected to ground potential.

3. The electric element according to claim 2, wherein
    letting W be a length of said first and second conductive layers in the direction perpendicular to the flow direction of said first and second currents and letting L be a length of said first and second conductive layers in the direction in which said first and second currents flow, an overlap part between said first conductive layer and said second conductive layer holds $W \geq L$.

4. The electric element according to claim 2, further comprising:
    a first electrode electrically connected to one end of said n-number of first conductive layers in a first direction in which said first current flows through said first conductive layers;
    a second electrode electrically connected to the other end of said n-number of first conductive layers in said first direction;
    a third electrode electrically connected to one end of said m-number of second conductive layers in a second direction in which said second current flows through said second conductive layers; and
    a fourth electrode electrically connected to the other end of said m-number of second conductive layers in said second direction.

5. An electric circuit, comprising:
    an electric element according to any one of claims 1 and 2 between a power source and an electrical load, wherein
    said plurality of first conductive layers make up a path through which the first current flows from said power source side to said load side, and
    said plurality of second conductive layers make up a path through which the second current, being a return current of said first current, flows.

* * * * *